United States Patent
Liao et al.

(10) Patent No.: US 11,600,713 B2
(45) Date of Patent: Mar. 7, 2023

(54) SEMICONDUCTOR DEVICE AND METHOD

(71) Applicant: Taiwan Semiconductor Manufacturing Company, Ltd., Hsinchu (TW)

(72) Inventors: Chih-Teng Liao, Hsinchu (TW); Chia-Cheng Tai, Hsinchu (TW); Tzu-Chan Weng, Kaohsiung (TW); Yi-Wei Chiu, Kaohsiung (TW); Chih Hsuan Cheng, Houlong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 137 days.

(21) Appl. No.: 15/993,469

(22) Filed: May 30, 2018

(65) Prior Publication Data

US 2019/0371915 A1 Dec. 5, 2019

(51) Int. Cl.
*H01L 29/66* (2006.01)
*H01L 21/3213* (2006.01)
*H01L 29/78* (2006.01)
*H01L 21/8234* (2006.01)
*H01L 29/423* (2006.01)

(52) U.S. Cl.
CPC .. *H01L 29/66545* (2013.01); *H01L 21/32136* (2013.01); *H01L 21/32137* (2013.01); *H01L 21/823431* (2013.01); *H01L 29/42316* (2013.01); *H01L 29/66795* (2013.01); *H01L 29/785* (2013.01); *H01L 29/7851* (2013.01)

(58) Field of Classification Search
None
See application file for complete search history.

(56) References Cited

U.S. PATENT DOCUMENTS

| | | |
|---|---|---|
| 8,728,332 B2 | 5/2014 | Lin et al. |
| 8,796,666 B1 | 8/2014 | Huang et al. |
| 8,822,243 B2 | 9/2014 | Yan et al. |
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 2002/0086547 A1* | 7/2002 | Mui ............... H01L 21/0276 438/710 |
| 2008/0206900 A1 | 8/2008 | Kim et al. |

(Continued)

*Primary Examiner* — Shaun M Campbell
*Assistant Examiner* — Aneta B Cieslewicz
(74) *Attorney, Agent, or Firm* — Slater Matsil, LLP

(57) ABSTRACT

A method includes forming a semiconductor fin extending a first height above a substrate, forming a dummy dielectric material over the semiconductor fin and over the substrate, forming a dummy gate material over the dummy dielectric material, the dummy gate material extending a second height above the substrate, etching the dummy gate material using multiple etching processes to form a dummy gate stack, wherein each etching process of the multiple etching processes is a different etching process, wherein the dummy gate stack has a first width at the first height, and wherein the dummy gate stack has a second width at the second height that is different from the first width.

20 Claims, 40 Drawing Sheets

(56) References Cited

U.S. PATENT DOCUMENTS

| | | | |
|---|---|---|---|
| 2010/0041226 A1* | 2/2010 | Reid | C25D 3/38 |
| | | | 438/614 |
| 2013/0221448 A1* | 8/2013 | Chang | H01L 29/06 |
| | | | 257/401 |
| 2014/0001559 A1* | 1/2014 | Lin | H01L 29/6681 |
| | | | 257/368 |
| 2014/0170842 A1* | 6/2014 | Noro | H01L 29/66545 |
| | | | 438/585 |
| 2014/0183599 A1* | 7/2014 | Hong | H01L 29/785 |
| | | | 257/190 |
| 2014/0302678 A1* | 10/2014 | Paterson | H01J 37/321 |
| | | | 438/700 |
| 2014/0302682 A1* | 10/2014 | Muto | H01J 37/32146 |
| | | | 438/711 |
| 2015/0115363 A1* | 4/2015 | Chang | H01L 21/823431 |
| | | | 257/347 |
| 2018/0102418 A1* | 4/2018 | Bih | H01L 29/42376 |

\* cited by examiner

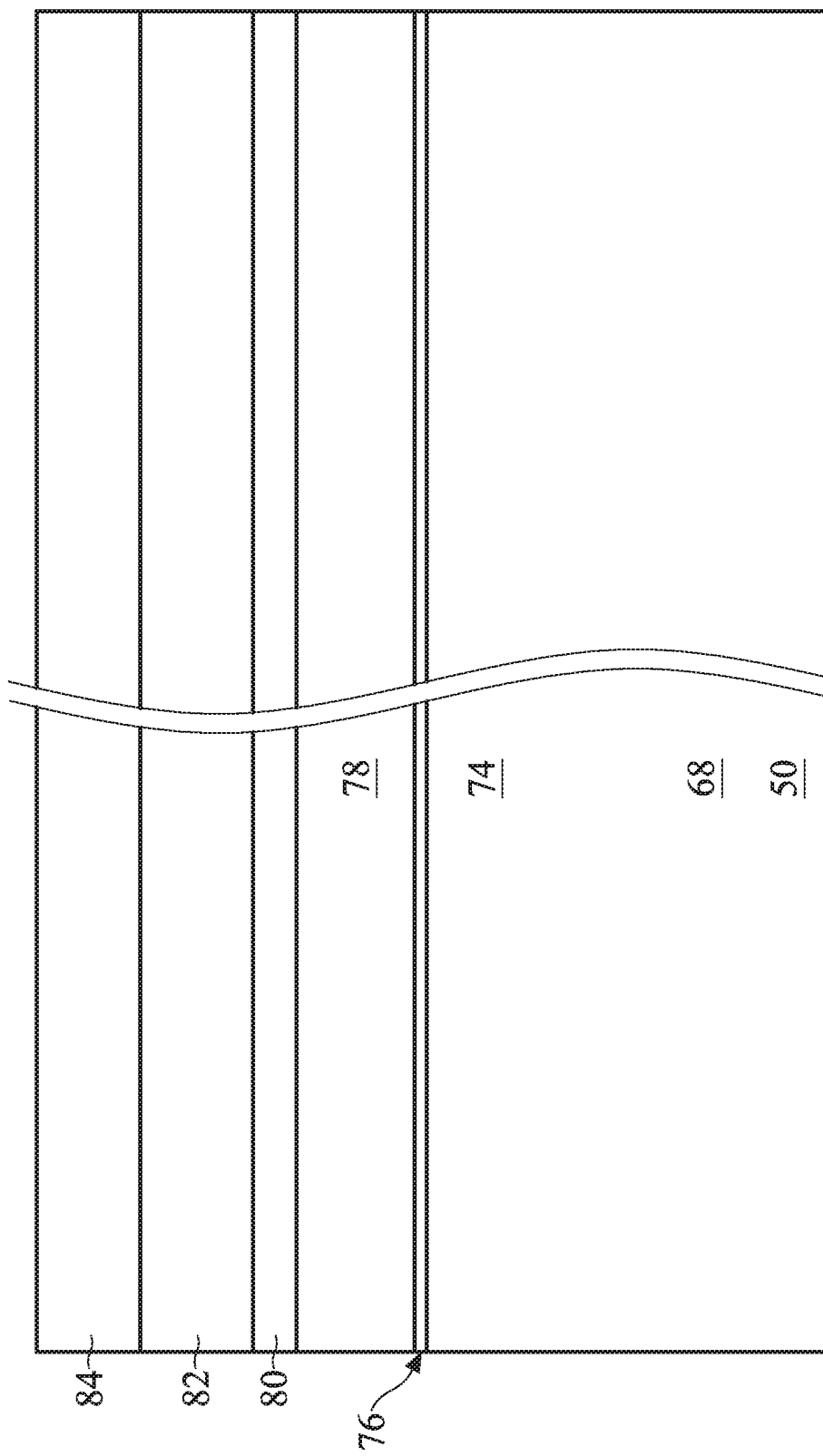

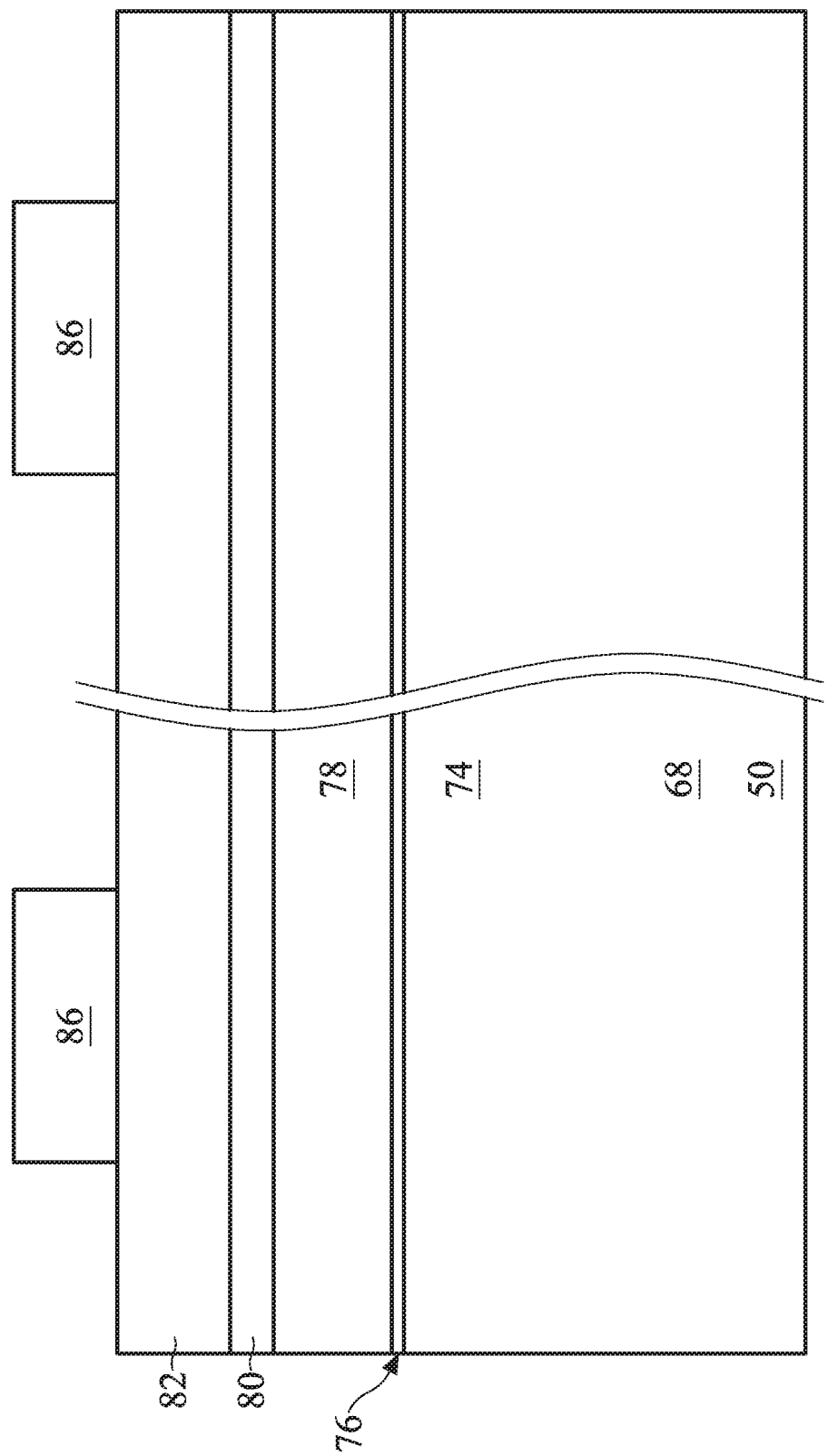

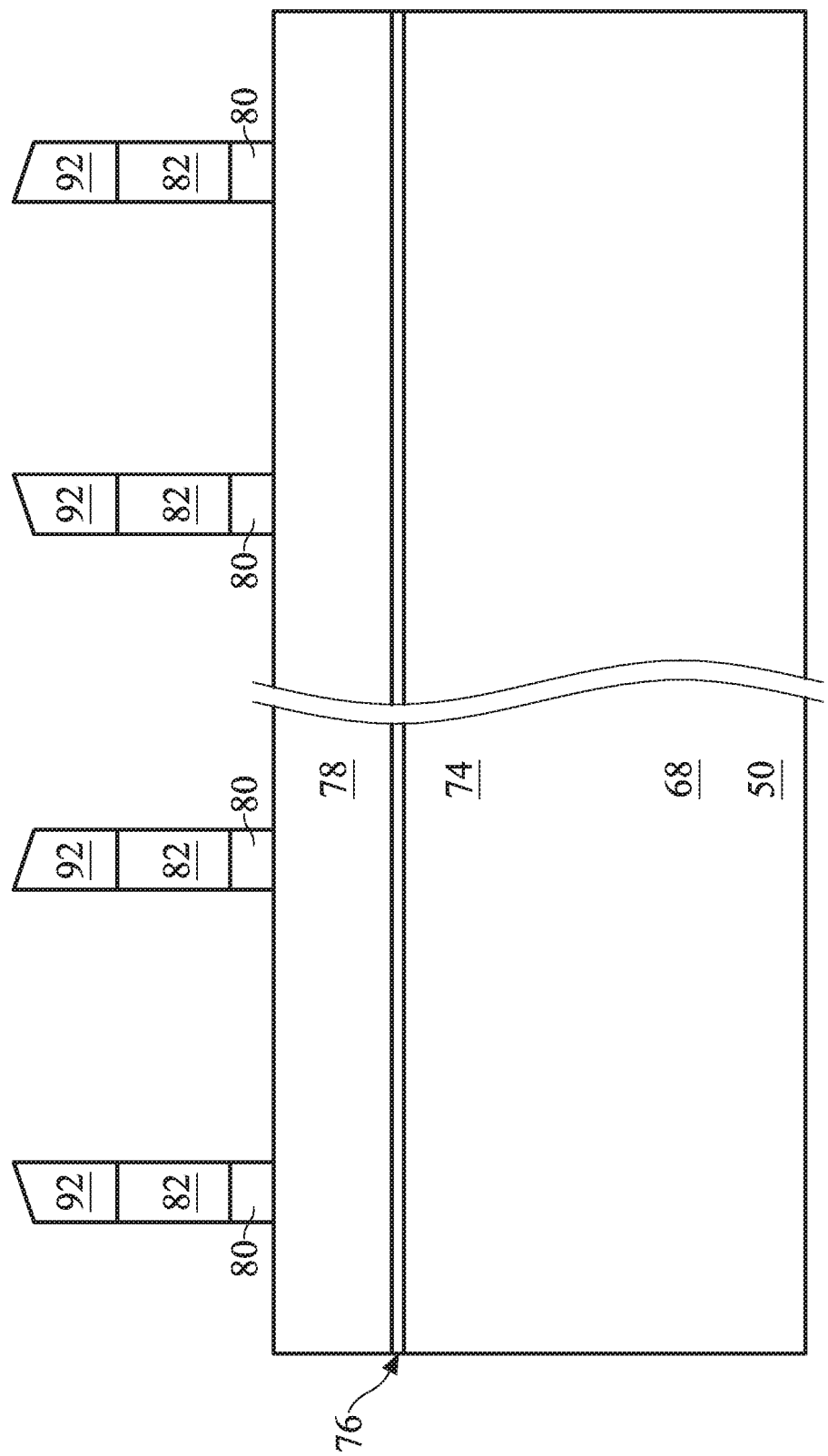

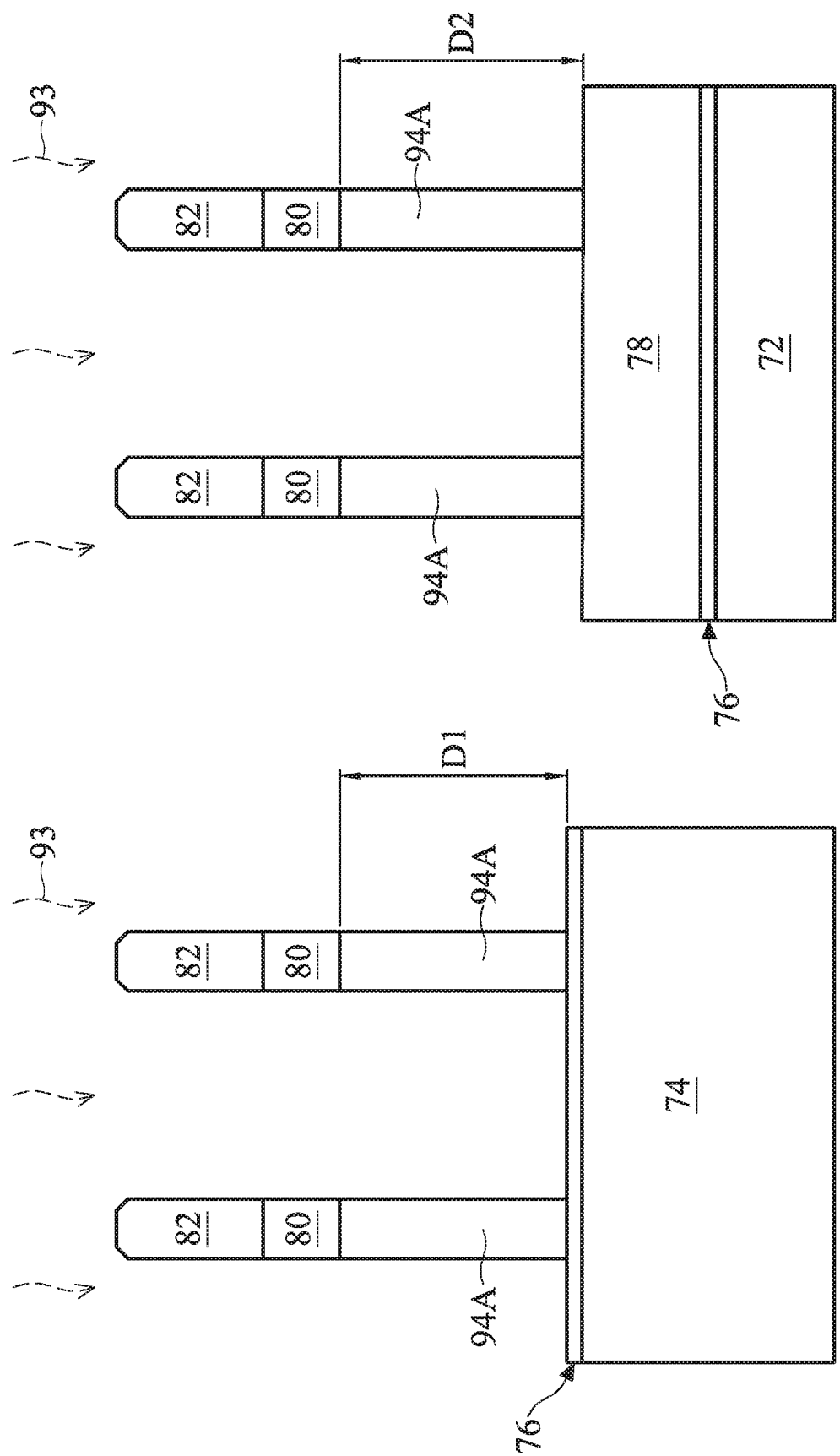

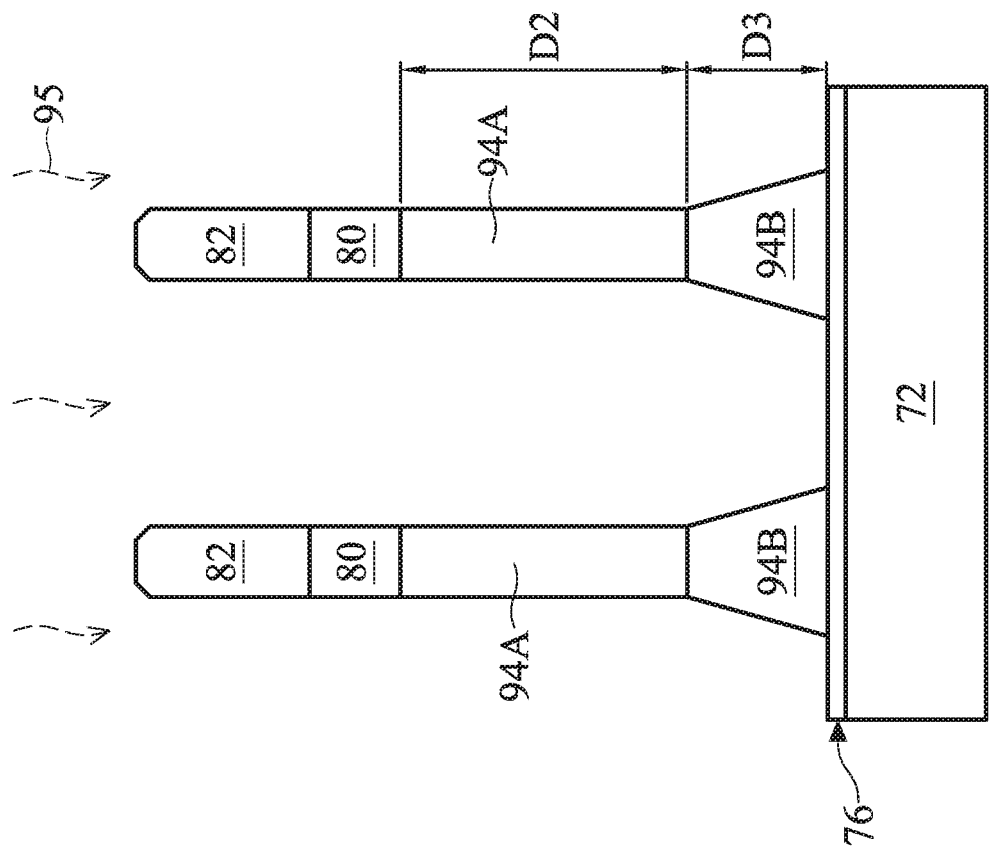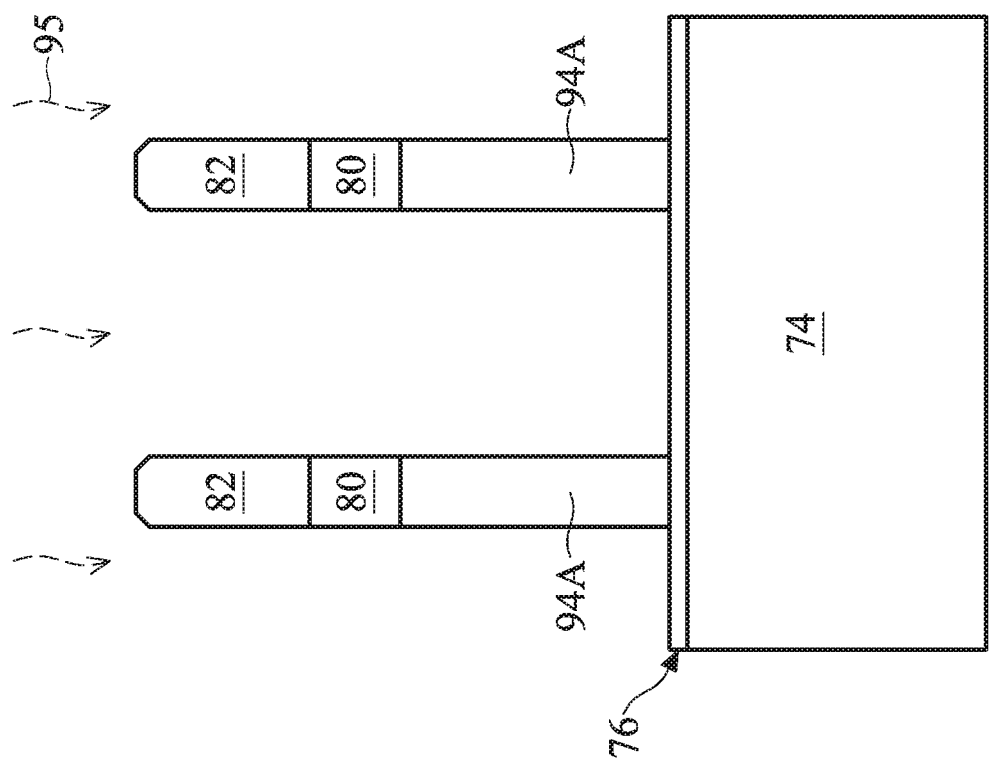

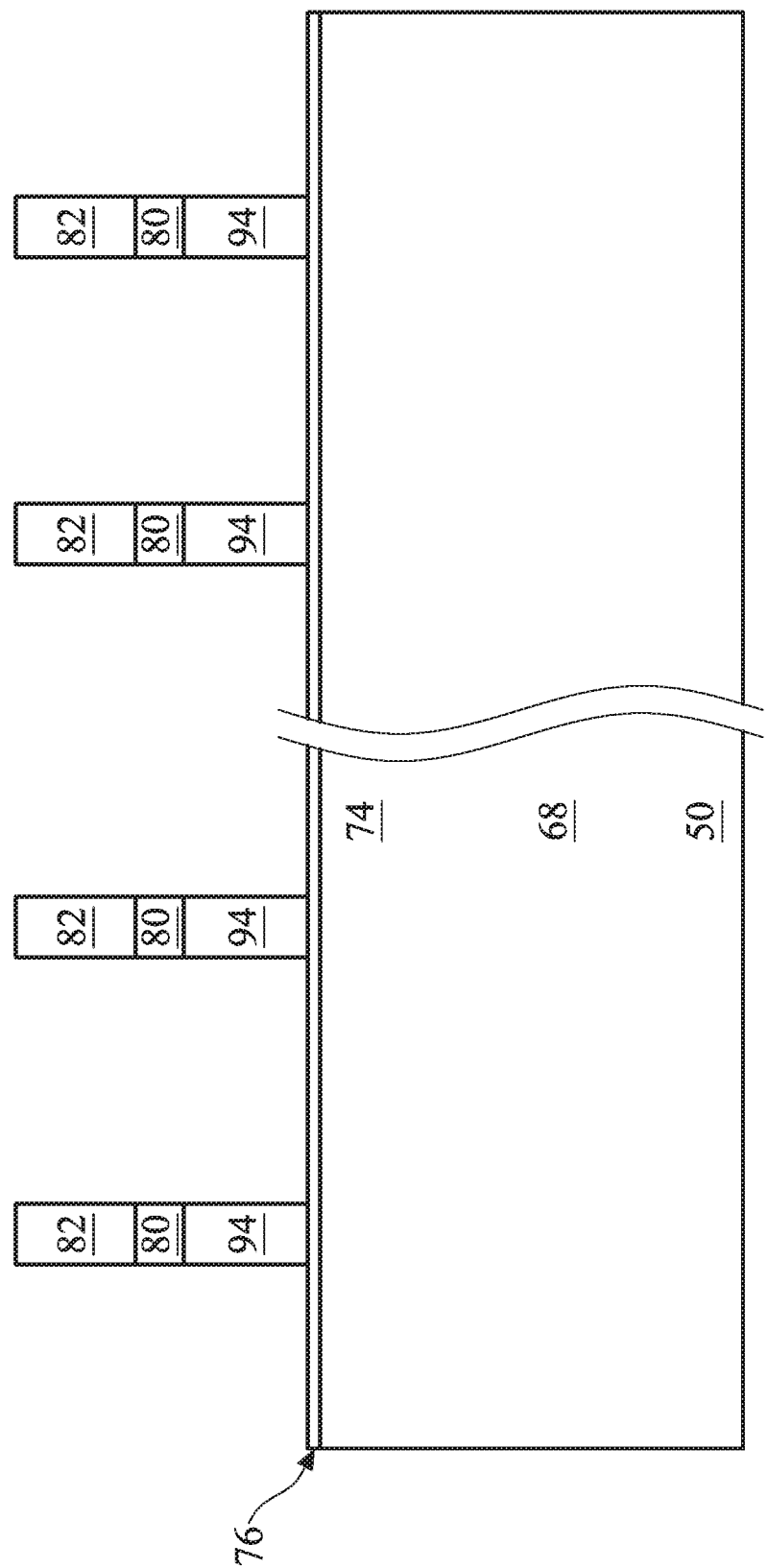

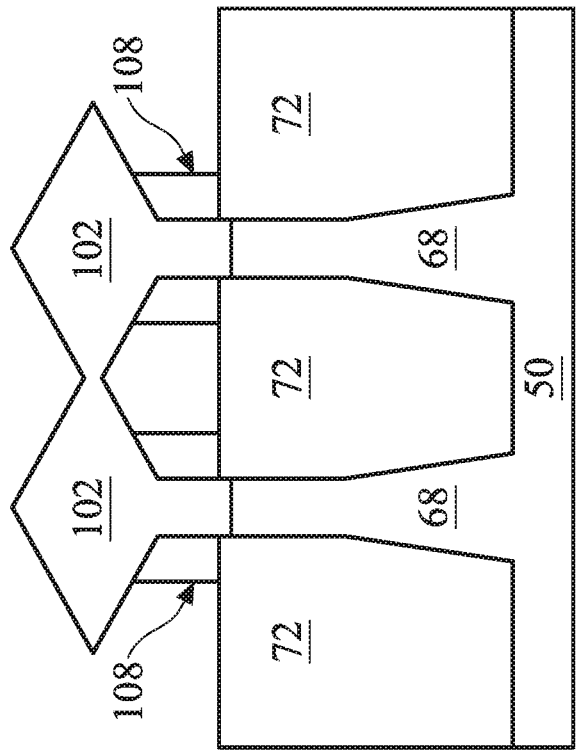
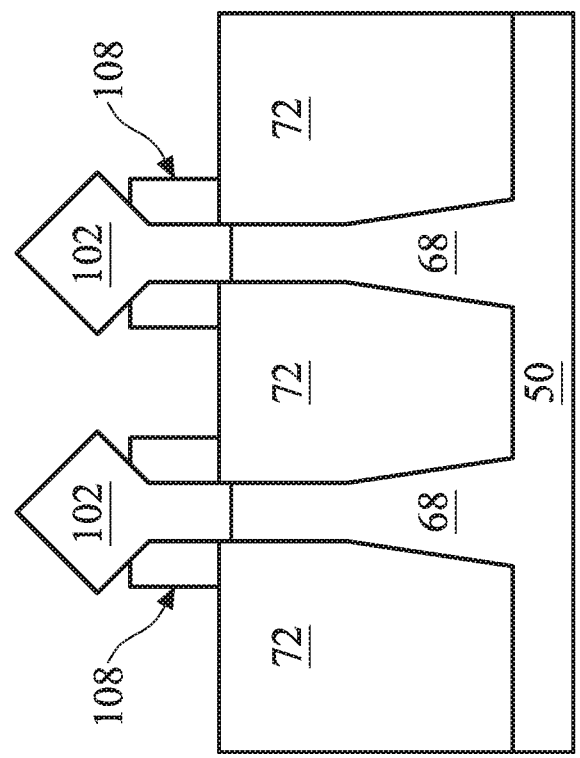
FIG. 29C
FIG. 29D

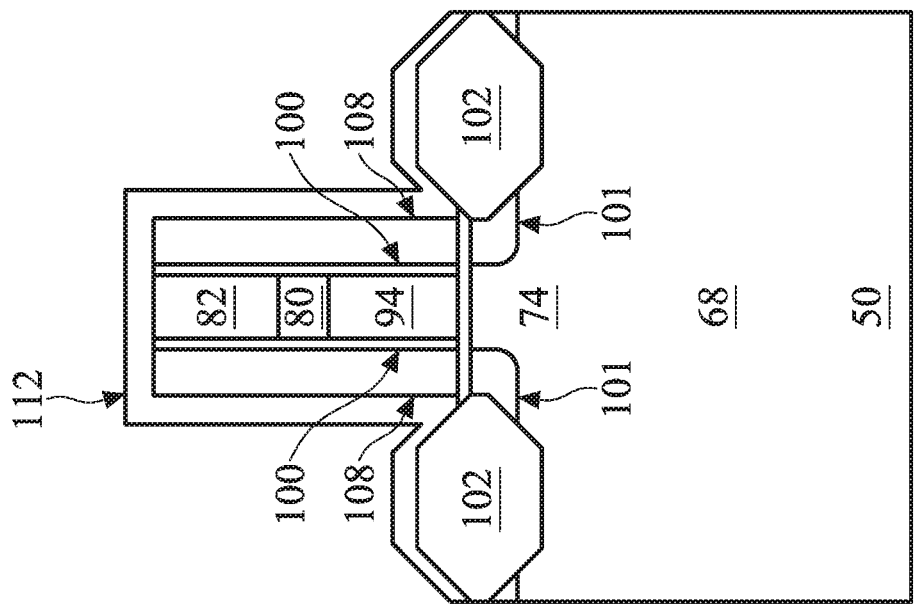
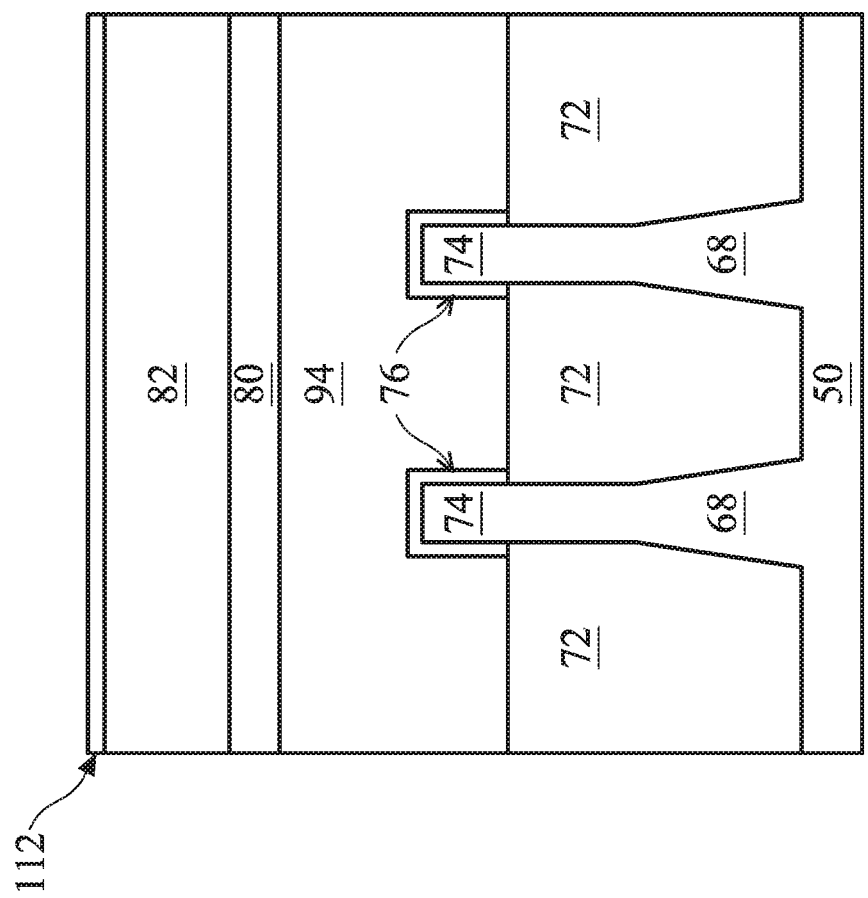
FIG. 30A
FIG. 30B

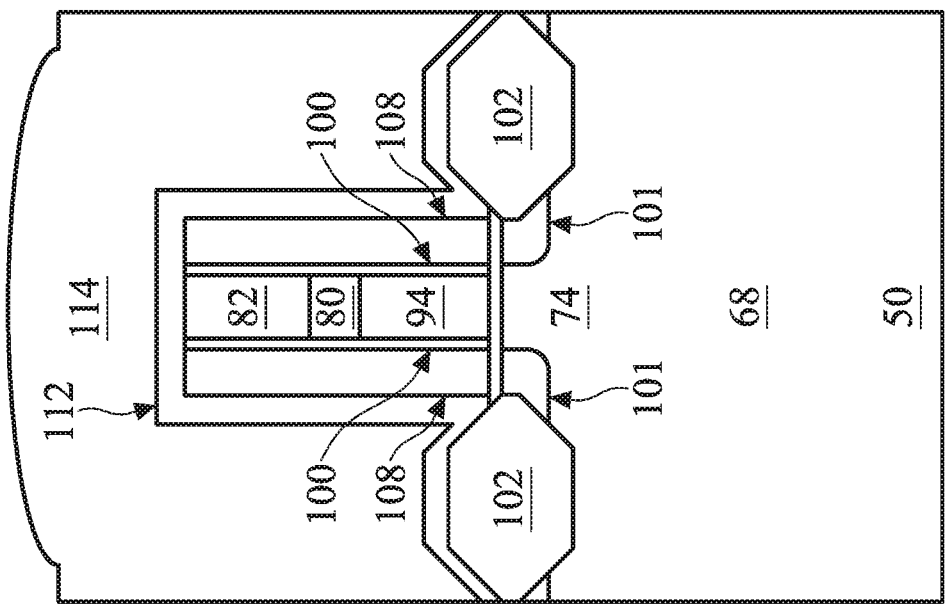
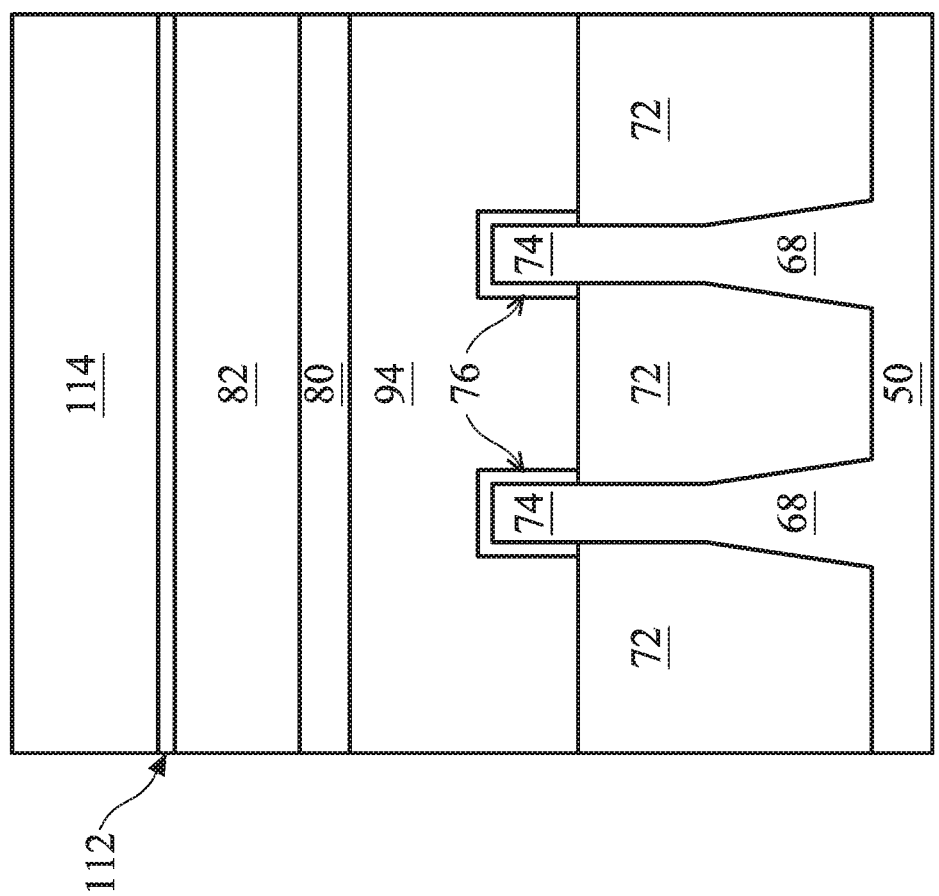
FIG. 31A
FIG. 31B

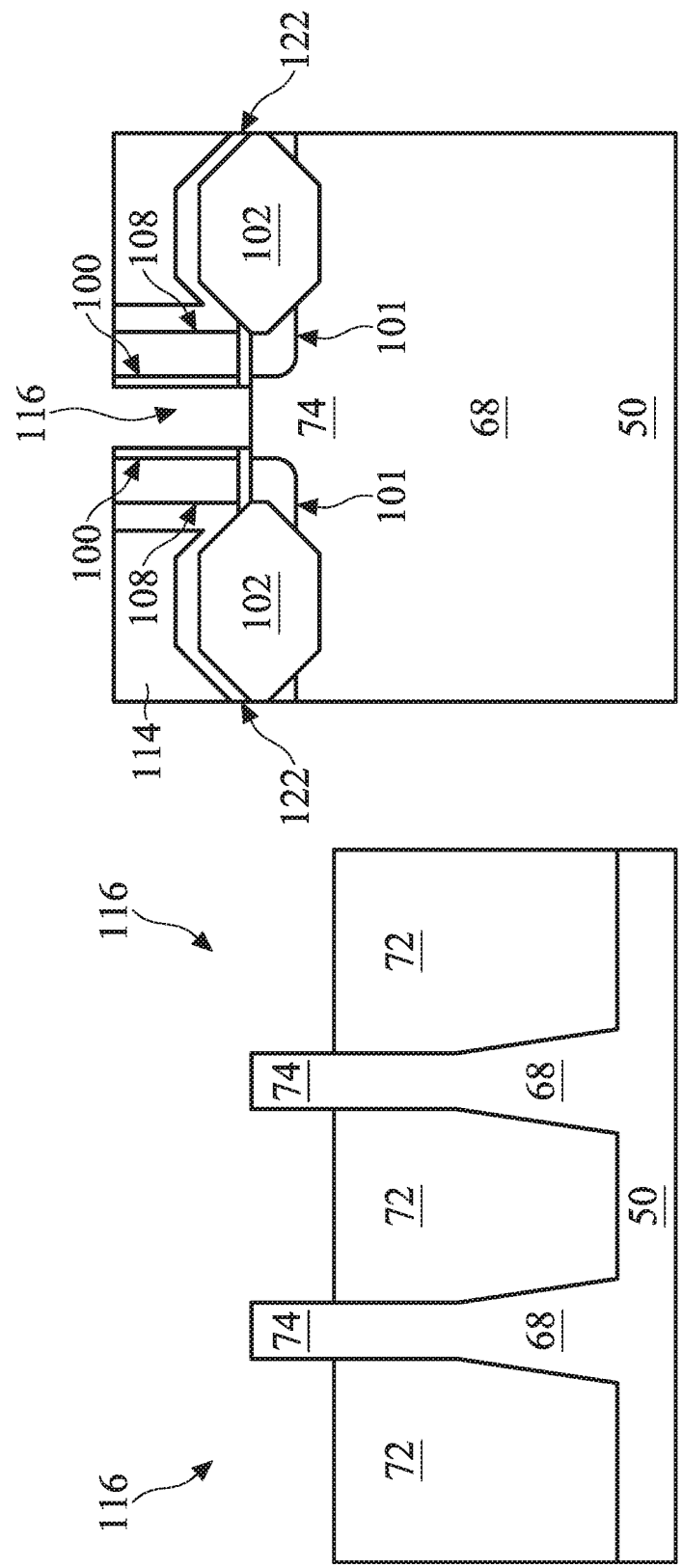

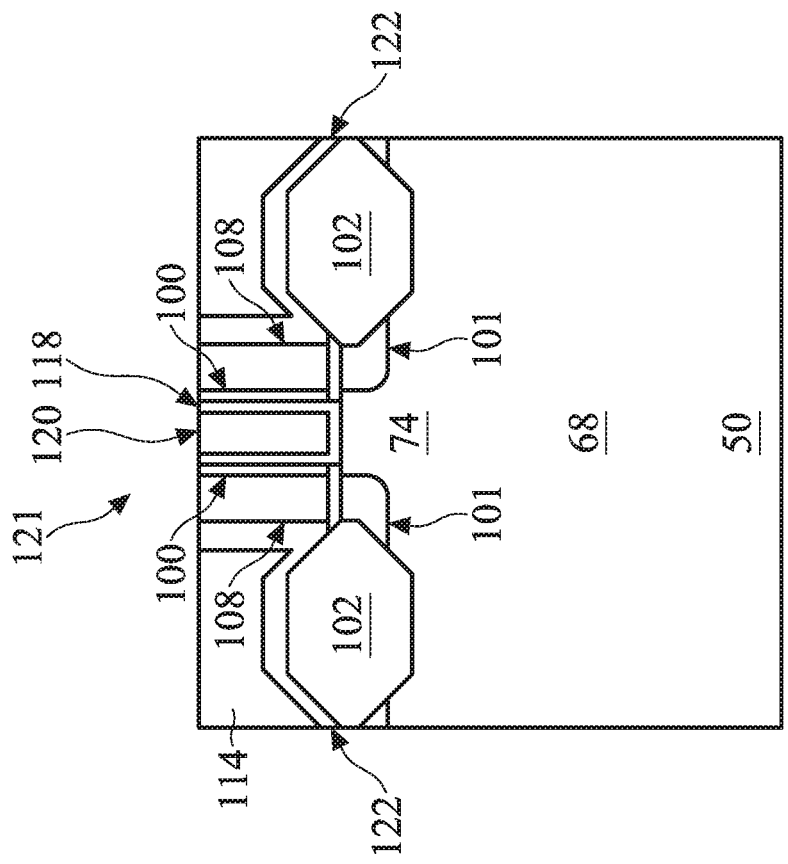
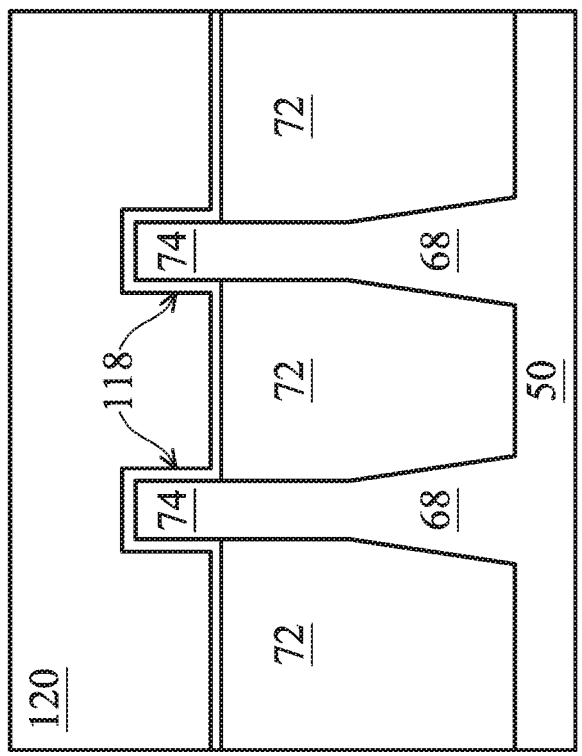
FIG. 34A
FIG. 34B

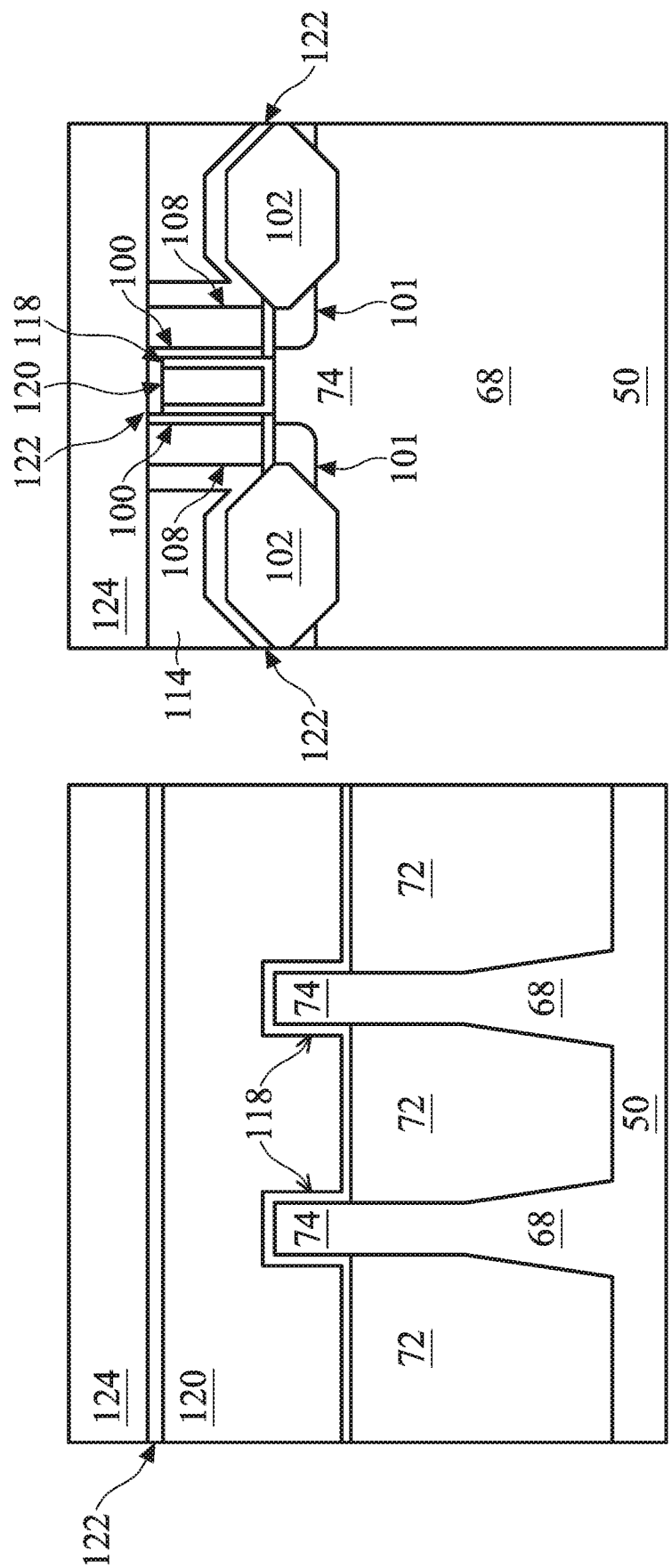

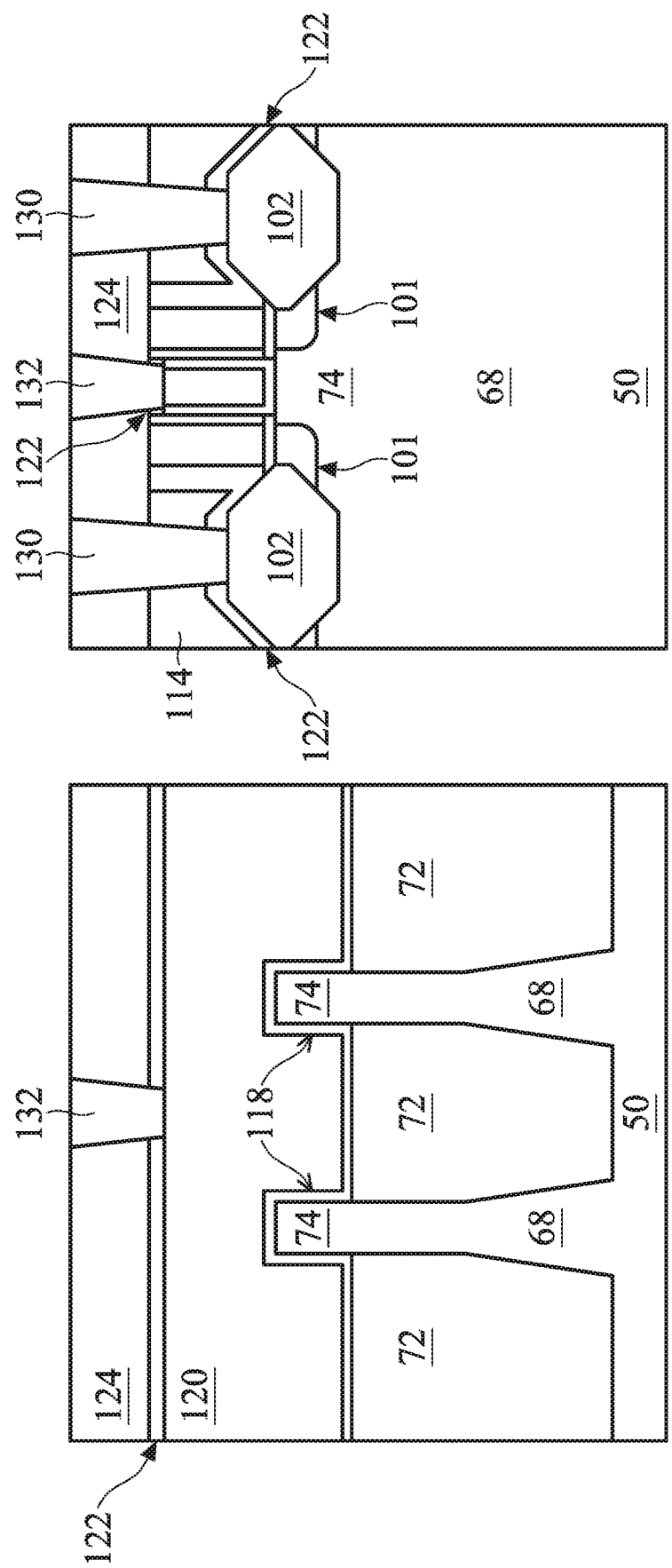

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 illustrates the formation of a film stack in accordance with some embodiments.

FIG. 14 illustrates the formation of mandrels in accordance with some embodiments.

FIG. 19 illustrates the further patterning of the film stack in accordance with some embodiments.

FIGS. 21A-B illustrate a first etching process of dummy gate layers in accordance with some embodiments.

FIGS. 22A-B illustrate a second etching process of dummy gate layers in accordance with some embodiments.

FIG. 25 illustrates dummy gates in accordance with some embodiments.

FIGS. 29A-D illustrate the formation of epitaxial source/drain regions in accordance with some embodiments.

FIGS. 30A-B illustrate the formation of a contact etch stop layer in accordance with some embodiments.

FIGS. 31A-B illustrate the formation of an inter-layer dielectric in accordance with some embodiments.

FIGS. 33A-B illustrate the removal of the dummy gate in accordance with some embodiments.

FIGS. 34A-B illustrate the formation of a replacement gate stack in accordance with some embodiments.

FIGS. 36A-B illustrate the formation of an inter-layer dielectric in accordance with some embodiments.

FIGS. 38A-B illustrate the formation of contacts in accordance with some embodiments.

DETAILED DESCRIPTION

Figure 1:
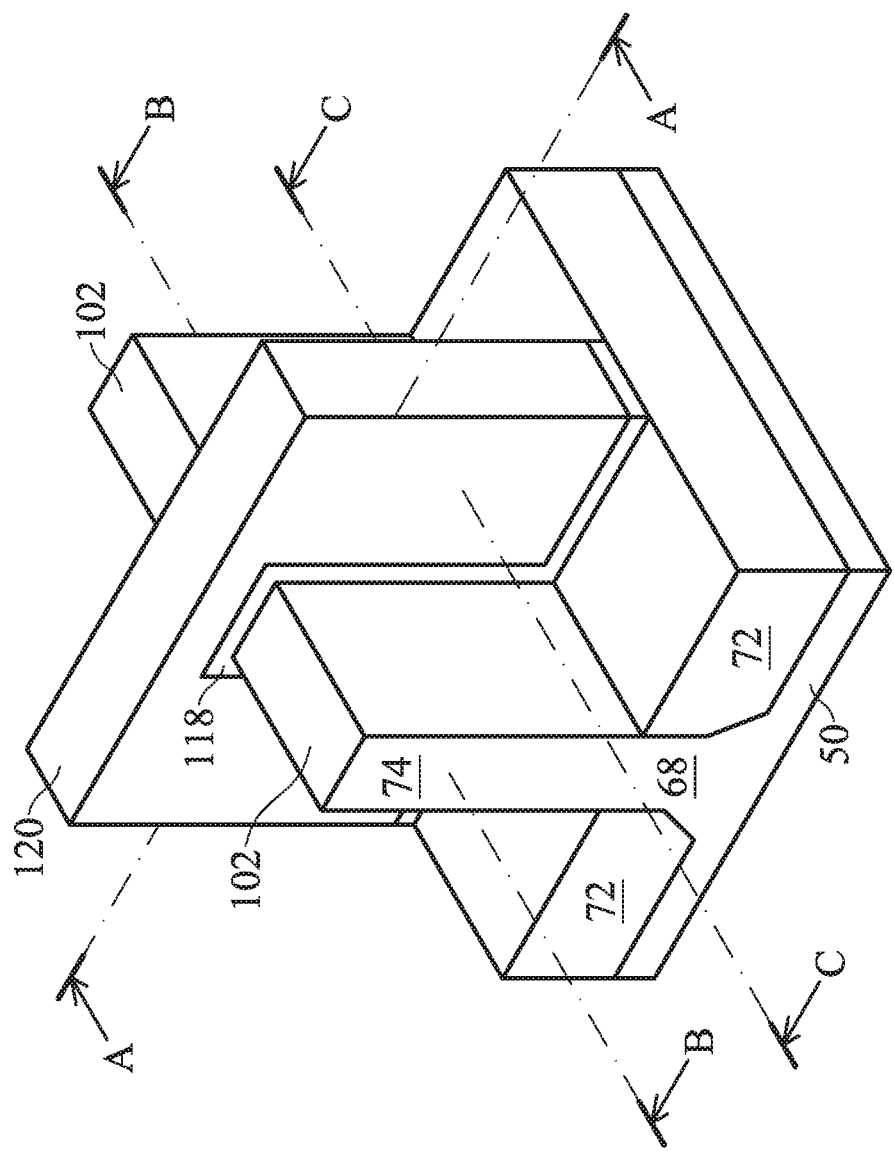
FIG. 1 illustrates an example of a FinFET in a three-dimensional view, according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of forming semiconductor devices are provided in accordance with some embodiments. In particular, dummy gates are formed using multiple etching steps, and the parameters or conditions of each etching step may be controlled to control the profile shape of the dummy gates. For example, the parameters of an etching step that forms a portion of the dummy gates may be controlled to control the width of that portion of the dummy gate. In this manner, the profile shape of a dummy gate may be "tuned" to improve process yield or device performance. Etching step parameters that may be controlled include passivation gas flow rate, pulsed voltage bias duty cycle, pulsed plasma generation power duty cycle, bias voltage, or other parameters. Some embodiments discussed herein are discussed in the context of FinFETs formed using a gate-last process. In other embodiments, a gate-first process may be used. Also, some embodiments contemplate aspects used in planar devices, such as planar FETs.

FIG. 1 illustrates an example of a FinFET in a three-dimensional view, according to some embodiments. The FinFET includes a fin 74 on a substrate 50. Isolation regions 72 are on the substrate 50, and the fin 74 protrudes above and from between neighboring isolation regions 72. A gate dielectric layer 118 is along sidewalls and over a top surface of the fin 74, and a gate fill 120 is over the gate dielectric layer 118. Source/drain regions 102 are disposed in opposite sides of the fin 74 with respect to the gate dielectric layer 118 and gate fill 120. FIG. 1 further illustrates reference cross-sections that are used in later figures. Cross-section A-A is along a latitudinal axis of the fin 74, which extends in a direction of, for example, the gate fill 120. Cross-section B-B is perpendicular to cross-section A-A and is along a longitudinal axis of the fin 74, which extends in a direction of, for example, a current flow between the source/drain regions 102. Cross-section C-C is a cross-section parallel to cross-section B-B but is offset from the fin 74 of the FinFET. Subsequent figures refer to these reference cross-sections for clarity.

FIGS. 2 through 38B are cross-sectional views of intermediate stages in the manufacturing of FinFETs, according to some embodiments. FIGS. 2 through 11 illustrate reference cross-section A-A in FIG. 1. FIG. 12A illustrates reference cross-section A-A in FIG. 1, and FIG. 12B illustrates reference cross-section B-B in FIG. 1. FIGS. 13 through 19 illustrate reference cross-section B-B in FIG. 1. In FIGS. 20A, 21A, 22A, and 23A are illustrated along reference cross-section B-B in FIG. 1, and FIGS. 20B, 21B, 22B, and 23B are illustrated along reference cross-section C-C in FIG. 1. FIGS. 24A-C are illustrated along reference cross-section C-C in FIG. 1. FIG. 25 illustrates reference cross-section B-B in FIG. 1. In FIGS. 26A through 38B, figures ending with an "A" designation are illustrated along reference cross-section A-A in FIG. 1, and figures ending with a "B" designation are illustrated along a similar cross-section B-B.

Figure 2:
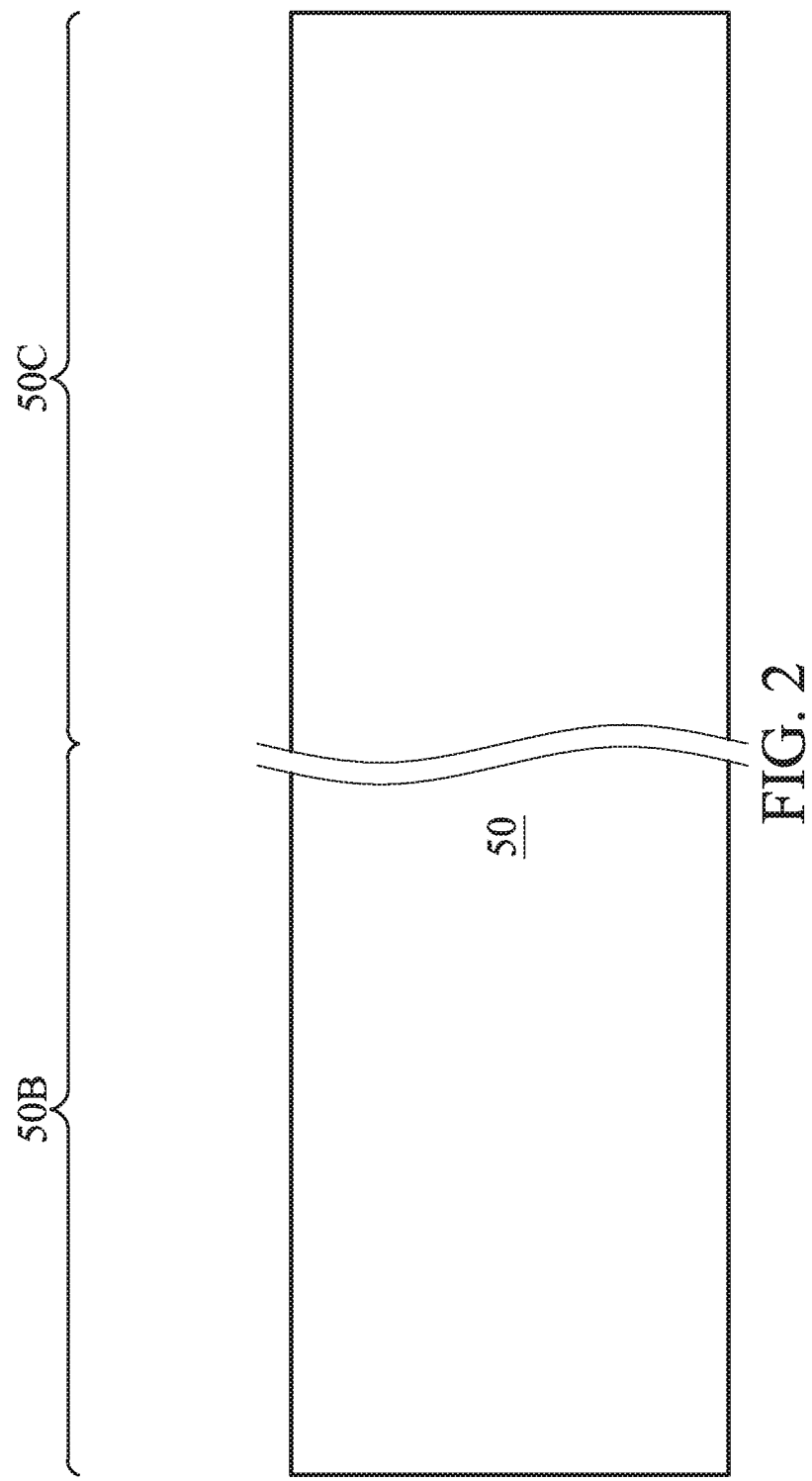
FIG. 2 illustrates a substrate in accordance with some embodiments.

FIG. 2 illustrates a substrate 50 according so some embodiments. The substrate 50 may be a semiconductor substrate, such as a bulk semiconductor, a semiconductor-on-insulator (SOI) substrate, or the like, and may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may, for example, be a buried oxide (BOX) layer, a silicon oxide layer, or the like. The insulator layer may be disposed on a substrate, such as a silicon substrate or a glass substrate. Other substrates, such as a multi-layered or gradient substrate may also be used. In some embodiments, the semiconductor material of the substrate 50 may include silicon, germanium, a compound semiconductor including silicon carbide, gallium arsenic, gallium phosphide, indium phosphide, indium arsenide, and/or indium antimonide, an alloy semiconductor including SiGe, GaAsP, AlInAs, AlGaAs, GaInAs, GaInP, and/or GaInAsP, the like, or combinations thereof.

The substrate 50 shown in FIG. 2 includes a first region 50B and a second region 50C. The first region 50B may be used for forming n-type devices, such as NMOS transistors, e.g., n-type FinFETs. The second region 50C may be used for forming p-type devices, such as PMOS transistors, e.g., p-type FinFETs. In some embodiments, both the first region 50B and the second region 50C are used to form the same type of devices, such as both regions being for n-type devices or p-type devices. The first region 50B and the second region 50C may be physically separated from each other, and any number of structures (e.g., isolation regions, active devices, etc.) may be disposed between the first region 50B and the second region 50C.

Figure 3:
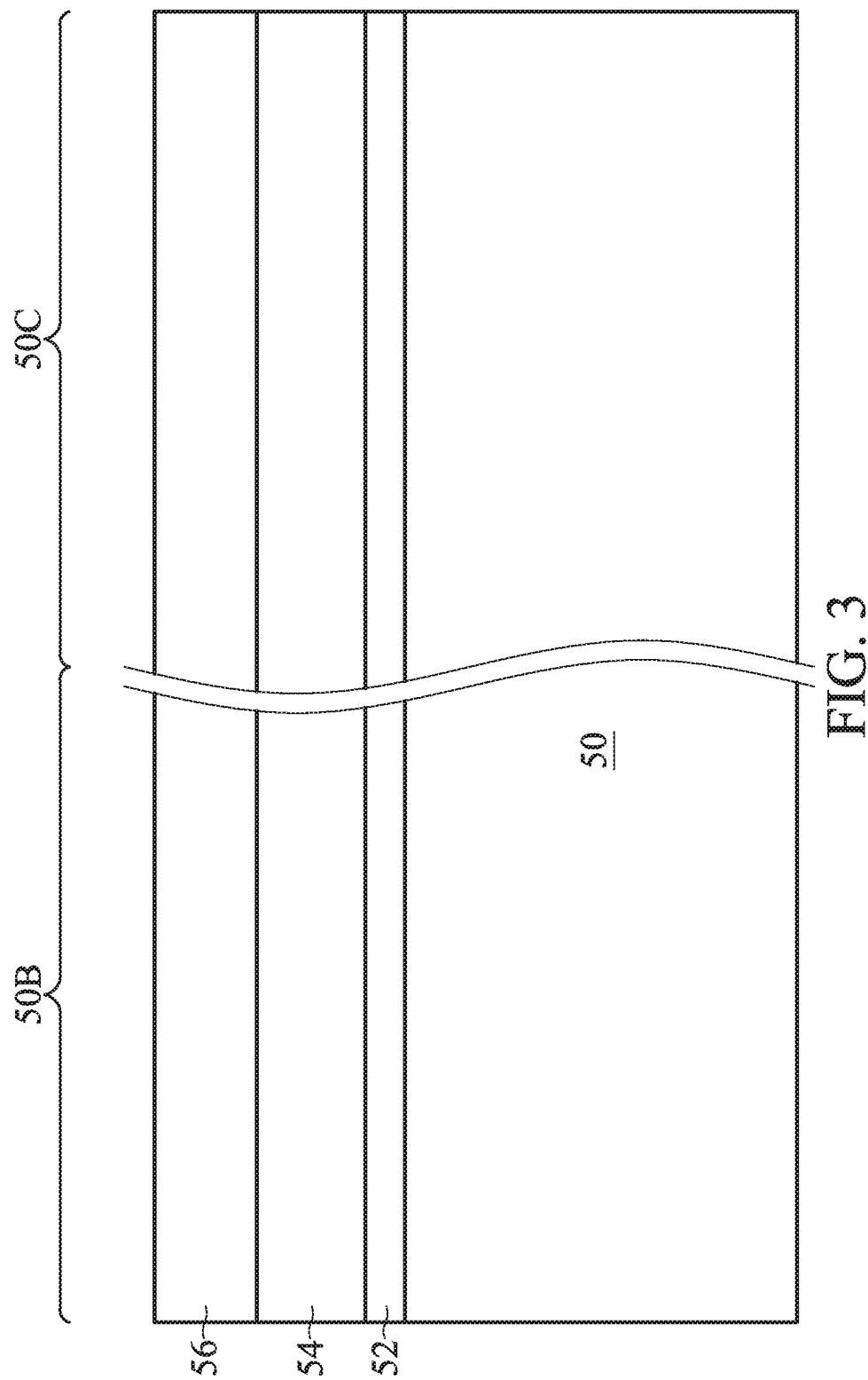
FIG. 3 illustrates the formation of a film stack in accordance with some embodiments.

In FIG. 3, a film stack is formed over the substrate 50. The film stack is used during processing to form features in the substrate 50 that are a fraction of the minimum photolithographic pitch. In some embodiments, the process is a self-aligned double patterning (SADP) process, where the features formed are one half the minimum photolithographic pitch. In other embodiments, the process may be a self-aligned quadruple patterning (SAQP) process, where the features formed are one quarter of the minimum photolithographic pitch. The film stack includes an anti-reflective coating (ARC) 52, a mask layer 54, and a mandrel layer 56. In other embodiments, the film stack may include more or fewer layers.

The ARC 52 is formed over the substrate 50, and aids in the exposure and focus of overlying photoresist layers (discussed below) during patterning of the photoresist layers. In some embodiments, the ARC 52 may be formed from SiON, SiC, materials doped with oxygen (O) and nitrogen (N), or the like. In some embodiments, the ARC 52 is substantially free from nitrogen, and may be formed from an oxide.

The mask layer 54 is formed over the ARC 52. The mask layer 54 may be formed of a hard masking material, and may include a metal and/or a dielectric material. In some embodiments, mask layer 54 includes a metal such as titanium nitride, titanium, tantalum nitride, tantalum, or the like. In some embodiments, the mask layer 54 includes a dielectric formed of an oxide, a nitride, or the like. The mask layer 54 may be formed by PVD, Radio Frequency PVD (RFPVD), Atomic Layer Deposition (ALD), or the like. In subsequent processing steps, a pattern is formed in the mask layer 54. The mask layer 54 is then used as an etching mask, in which the pattern of the mask layer 54 is transferred to the substrate 50.

The mandrel layer 56 is a sacrificial layer formed over the mask layer 54. The mandrel layer 56 may be formed of a material that has a high etching selectivity with the underlying layer, e.g., with the mask layer 54. The mandrel layer 56 may be formed of a material such as amorphous silicon, polysilicon, silicon nitride, silicon oxide, the like, or a combination thereof, and may be formed using a process such as a chemical vapor deposition (CVD), PECVD, or the like.

Figure 4:
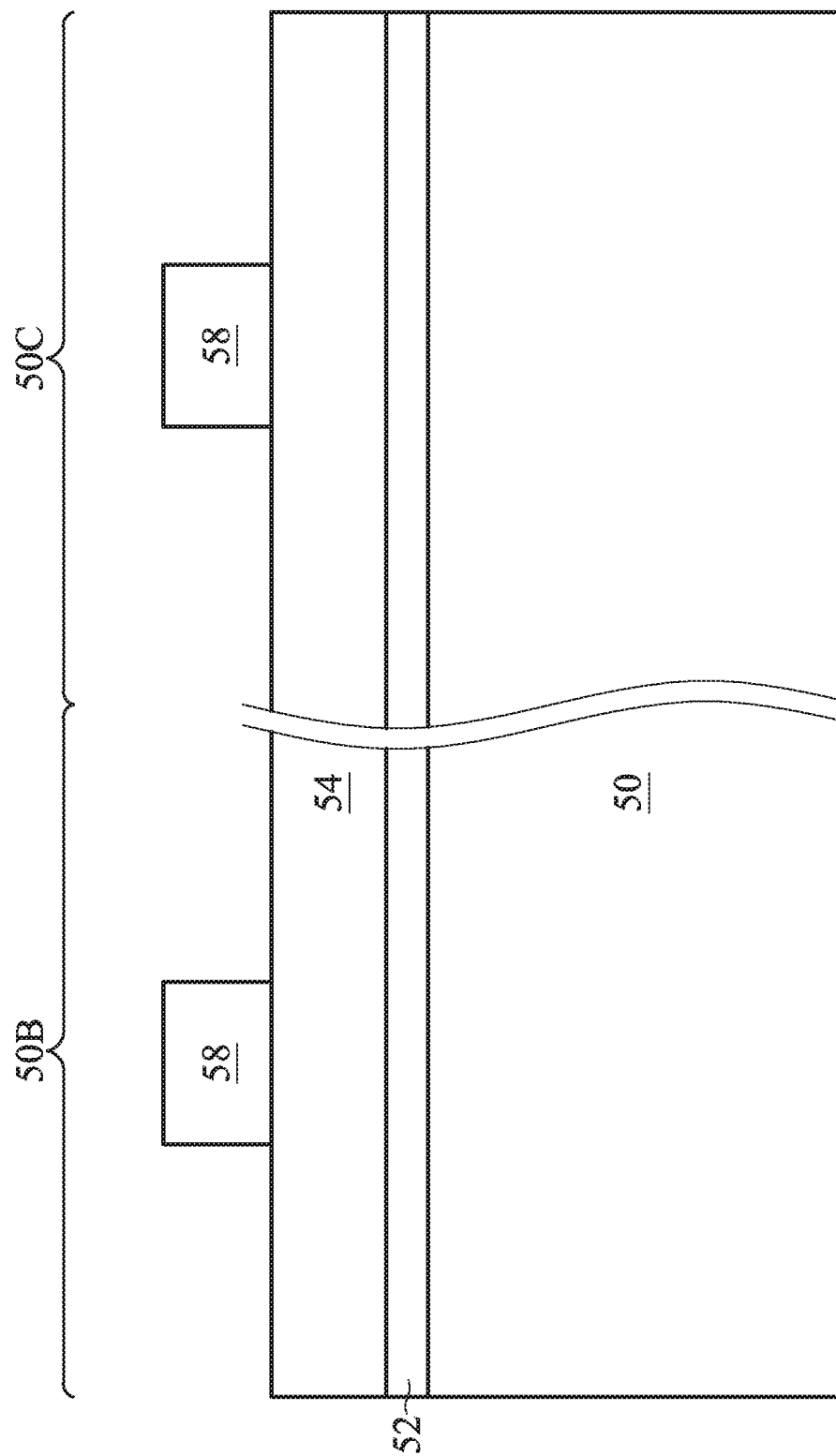
FIG. 4 illustrates the formation of mandrels in accordance with some embodiments.

In FIG. 4, the mandrel layer 56 is patterned to form mandrels 58. The mandrel layer 56 may be patterned using any suitable photolithography technique. As an example of patterning the mandrel layer 56, a tri-layer photoresist structure (not shown) may be formed over the film stack. The tri-layer photoresist structure may include a bottom layer, a middle layer, and an upper layer. The upper layer may be formed of a photosensitive material, such as a photoresist, which may include organic materials. The bottom layer may be a bottom anti-reflective coating (BARC). The middle layer may be formed of or include an inorganic material such as a nitride (such as silicon nitride), an oxynitride (such as silicon oxynitride), an oxide (such as silicon oxide), or the like. The middle layer may have a high etching selectivity relative to the upper layer and the bottom layer. In some embodiments, the upper layer is used as an etching mask for the patterning of the middle layer, and the middle layer is used as an etching mask for the patterning of the bottom layer.

The upper layer may be patterned using any suitable photolithography technique after formation to form openings therein. After the patterning of the upper layer, an etching process is performed to transfer the pattern of the openings in the upper layer to the middle layer. The etching process may be anisotropic. After the pattern of the openings is transferred to the middle layer, the middle layer may be trimmed to adjust the sizes of the openings. In some cases, the pitch of the openings in the middle layer may be about equal to the minimum photolithographic pitch after the trimming. After the trimming of the middle layer, an etching process is performed to transfer the pattern of the middle layer to the bottom layer. In some embodiments, the upper layer may be removed during the etching process of transferring the pattern of the middle layer to the bottom layer.

After the pattern is transferred to the bottom layer, an etching process is performed to transfer the pattern of the bottom layer to the mandrel layer 56. The etching process may remove the portions of the mandrel layer 56 exposed by the middle and bottom layers. In an embodiment, the etching process may be a dry etch. For example, the etching process may expose mandrel layer 56 to a plasma source and one or more etchant gases. The etching process may include an inductively coupled plasma (ICR) etch, a transformer coupled plasma (TCP) etch, an electron cyclotron resonance (ECR) etch, a reactive ion etch (RIE), or the like. As shown in FIG. 4, remaining portions of the mandrel layer 56 form the mandrels 58. In some embodiments, the etching process used to transfer the pattern to the mandrel layer 56 may remove the middle layer and partially remove portions of the bottom layer. An ashing process may be performed to remove remaining residue of the middle and/or bottom layers.

Figure 5:
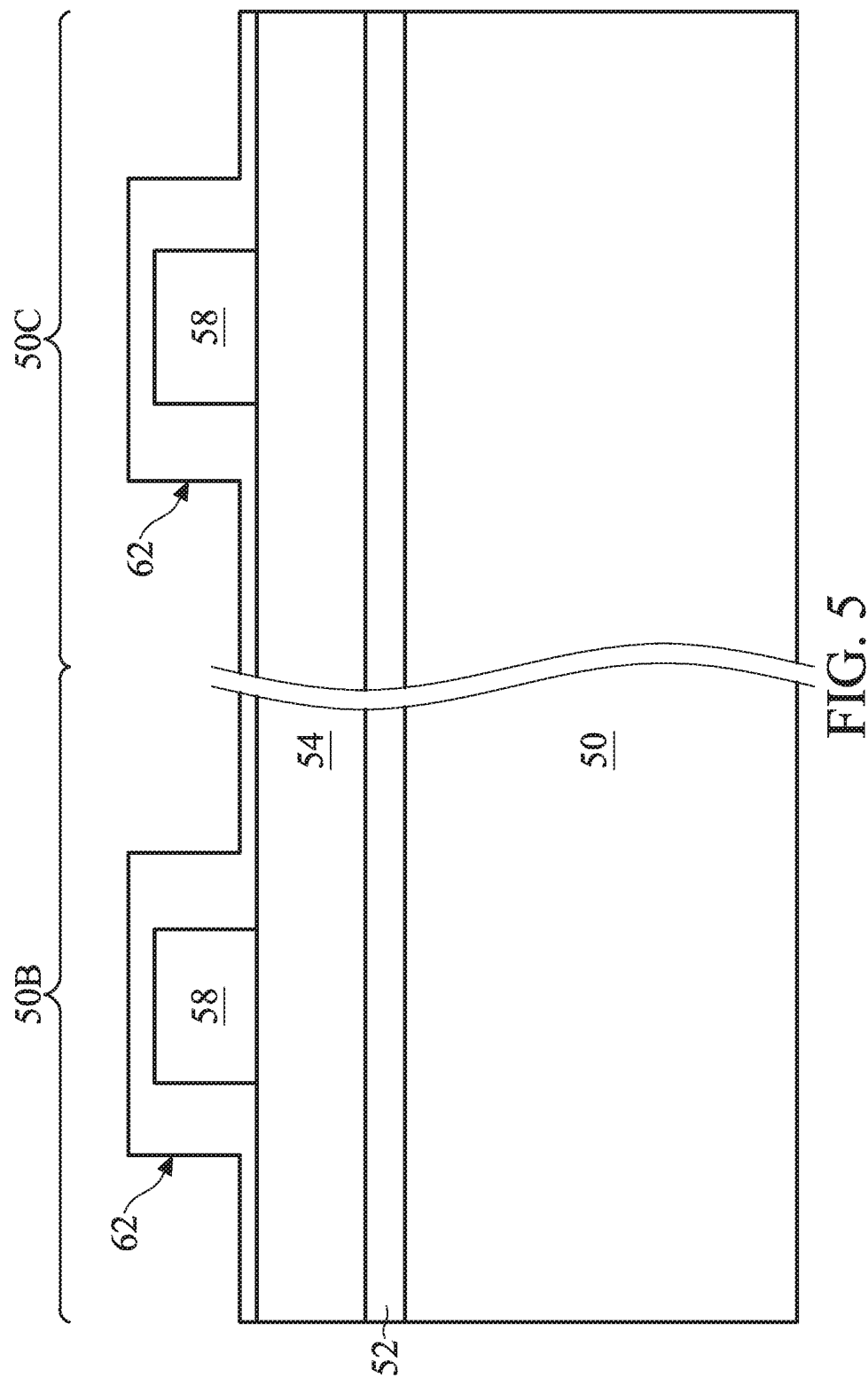
FIG. 5 illustrates the formation of a spacer layer in accordance with some embodiments.

In FIG. 5, a spacer layer 62 is formed over the mask layer 54 and mandrels 58. After formation, the spacer layer 62 extends along top surfaces of the mask layer 54 and mandrels 58, and sidewalls of the mandrels 58. The material of the spacer layer 62 may be selected to have a high etching selectivity with the mask layer 54. The spacer layer 62 may be formed from AlO, AlN, AlON, TaN, TiN, TiO, Si, SiO, SiN, metals, metal alloys, and the like, and may be deposited using any suitable process such as ALD, CVD, or the like.

Figure 6:
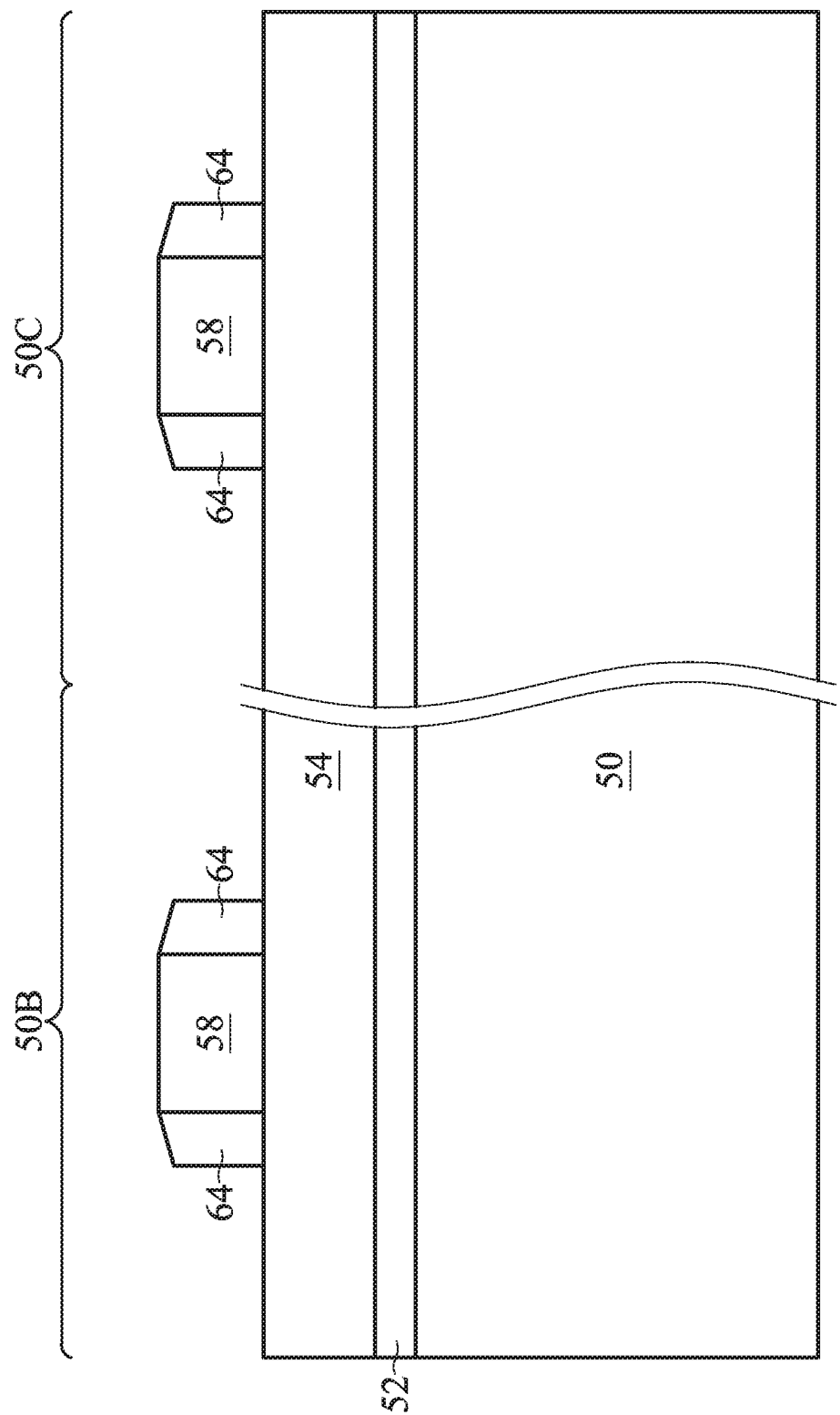
FIG. 6 illustrates the formation of spacers in accordance with some embodiments.

In FIG. 6, a suitable etching process is performed to remove the horizontal portions of the spacer layer 62. In some embodiments, the etchant used to etch the horizontal portions of the spacer layer 62 is $Cl_2$, $CH_4$, $N_2$, Ar, the like, or a combination thereof. After the etching process, the vertical portions of the spacer layer 62 remain along the sides of the mandrels 58, and are referred to as spacers 64 hereinafter. The etching process may be anisotropic, so that the thickness of the spacers 64 does not significantly decrease.

Figure 7:
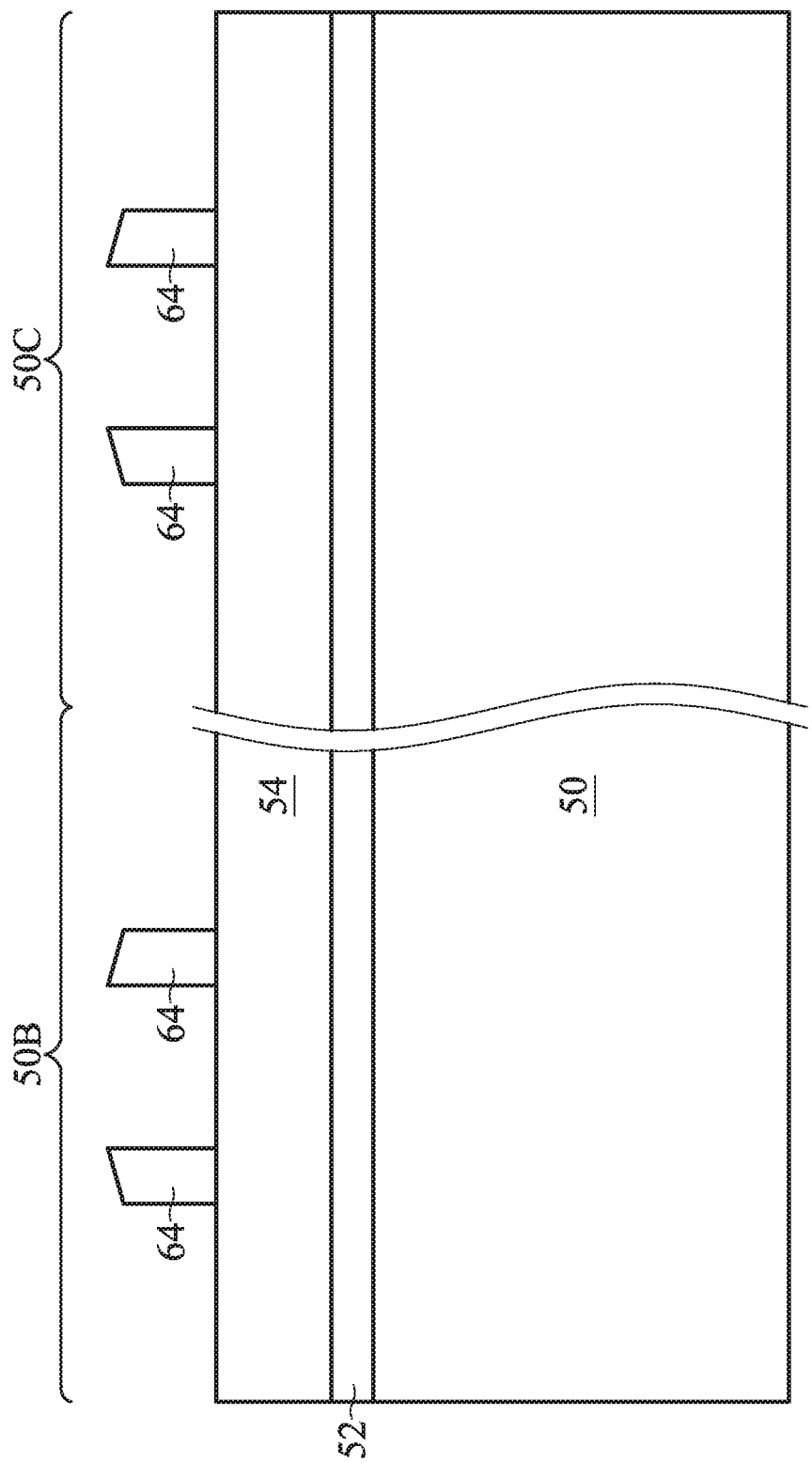
FIG. 7 illustrates the removal of the mandrels in accordance with some embodiments.

In FIG. 7, the mandrels 58 are removed. The mandrels 58 may be removed by a suitable etching processes, such as by a dry etching process including etchants such as $CF_4$, $CH_3F$, $H_2$, $N_2$, Ar, the like, or a combination thereof. The etching process may include any other suitable etchant that can remove the mandrels 58 without substantially damaging the spacers 64. Additionally, a wet clean process may also be performed to remove residual spacer and mandrel material. In some embodiments, the spacer etching process and the mandrel removal process are performed in the same process chamber.

Figure 8:
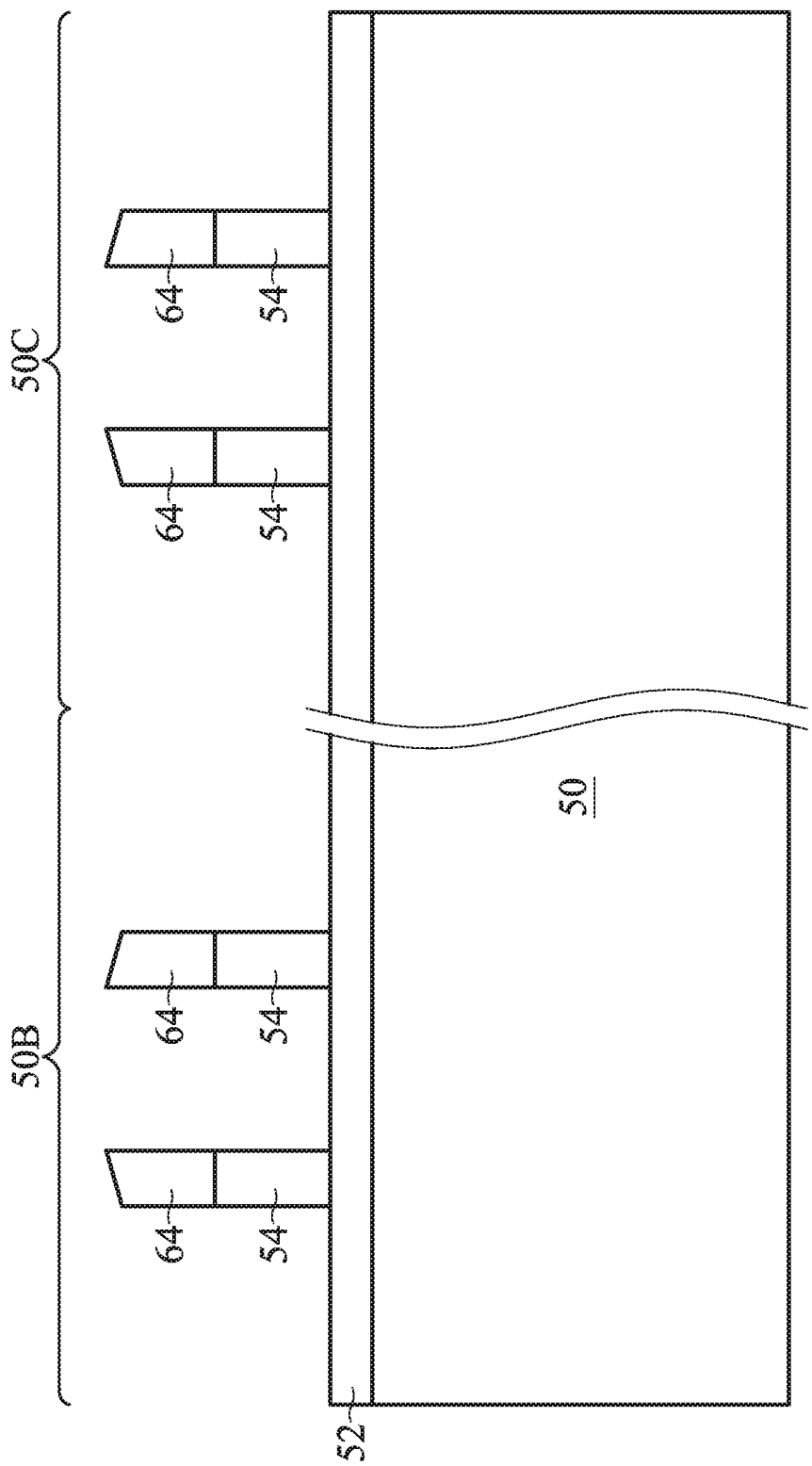
FIG. 8 illustrates the patterning of the film stack in accordance with some embodiments.
Figure 9:
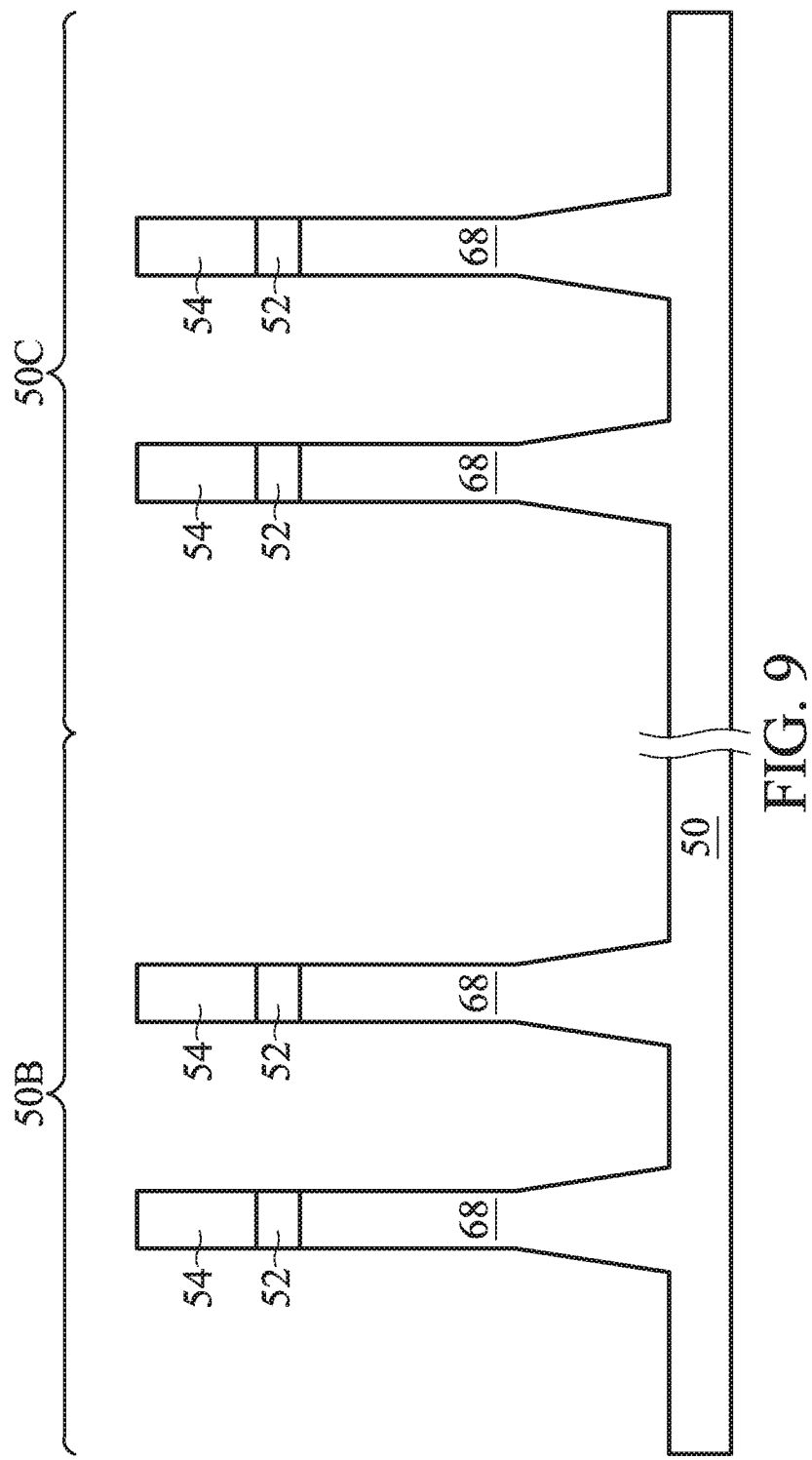
FIG. 9 illustrates the formation of fins in accordance with some embodiments.

In FIG. 8, the spacers 64 are used as an etching mask to pattern the mask layer 54. A suitable etching process, such as an anisotropic etch, may be performed using any suitable chemical, such as $CF_4$, HBr, $Cl_2$, $O_2$, Ar, the like, or a combination thereof. In FIG. 9, fins 68 are formed in the substrate 50. The fins 68 are formed by using the patterned mask layer 54 as an etching mask to etch the ARC 52 and the substrate 50, thereby forming trenches in the substrate 50. The resulting semiconductor strips between the trenches form the fins 68. The etch may be performed using any acceptable etching process, and may use etchants such as $Cl_2$, $N_2$, $CH_4$, the like, or a combination thereof. The etching process may be anisotropic. In some cases, the spacers 64, patterned mask layer 54, or the patterned ARC 52 may be consumed in this process. In some embodiments, a cleaning process may be performed to remove any residual material of the spacers 64, the patterned mask layer 54, and the patterned ARC 52.

Figure 10:
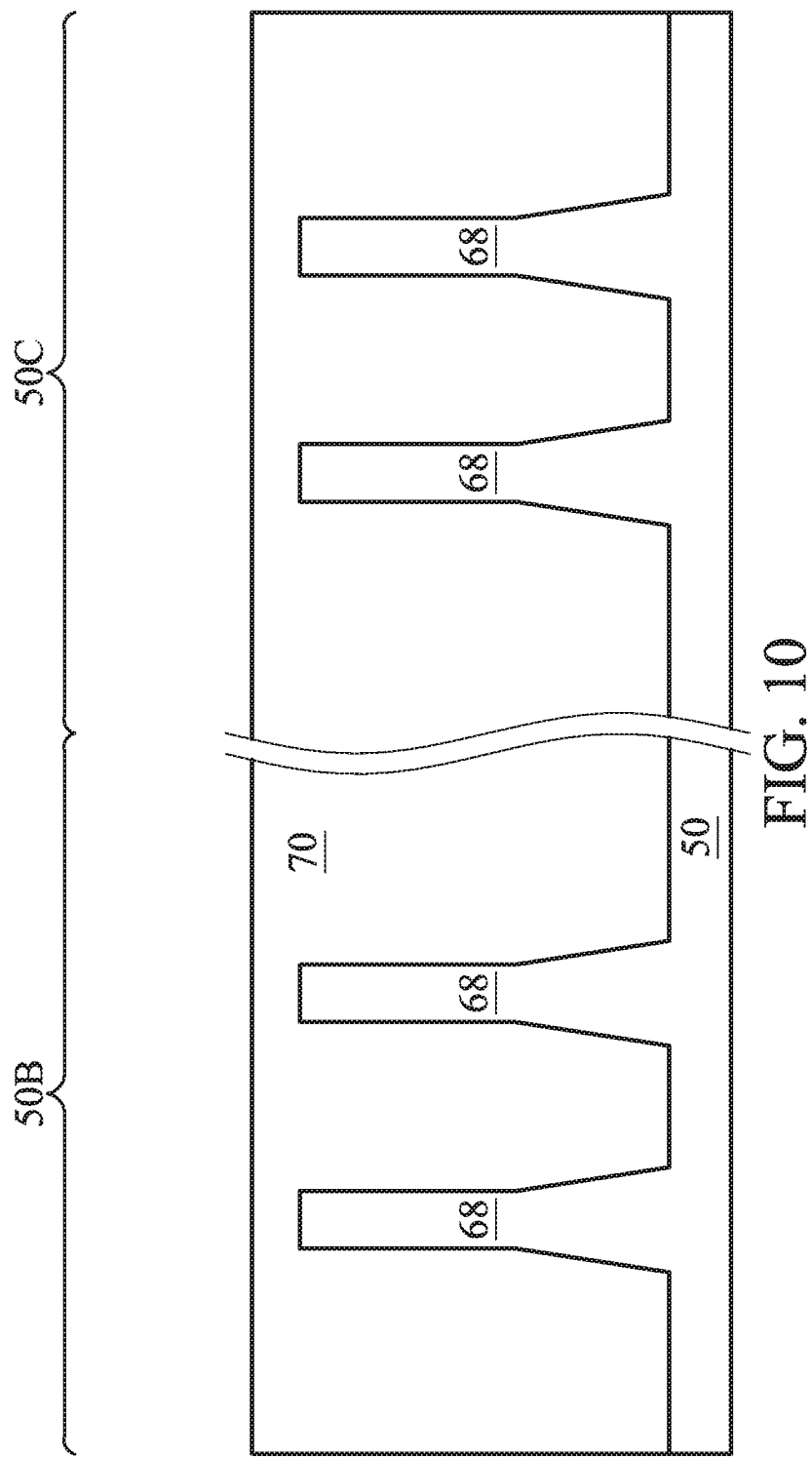
FIG. 10 illustrates the formation of insulation material in accordance with some embodiments.

In FIG. 10, an insulation material 70 is formed over the substrate 50 and between neighboring fins 68. The insulation material 70 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some cases, an anneal process may be performed once the insulation material is formed. In some embodiments, a planarization process such as a grind or a chemical-mechanical polish (CMP) may be performed to expose the top surfaces of the fins 68.

Figure 11:
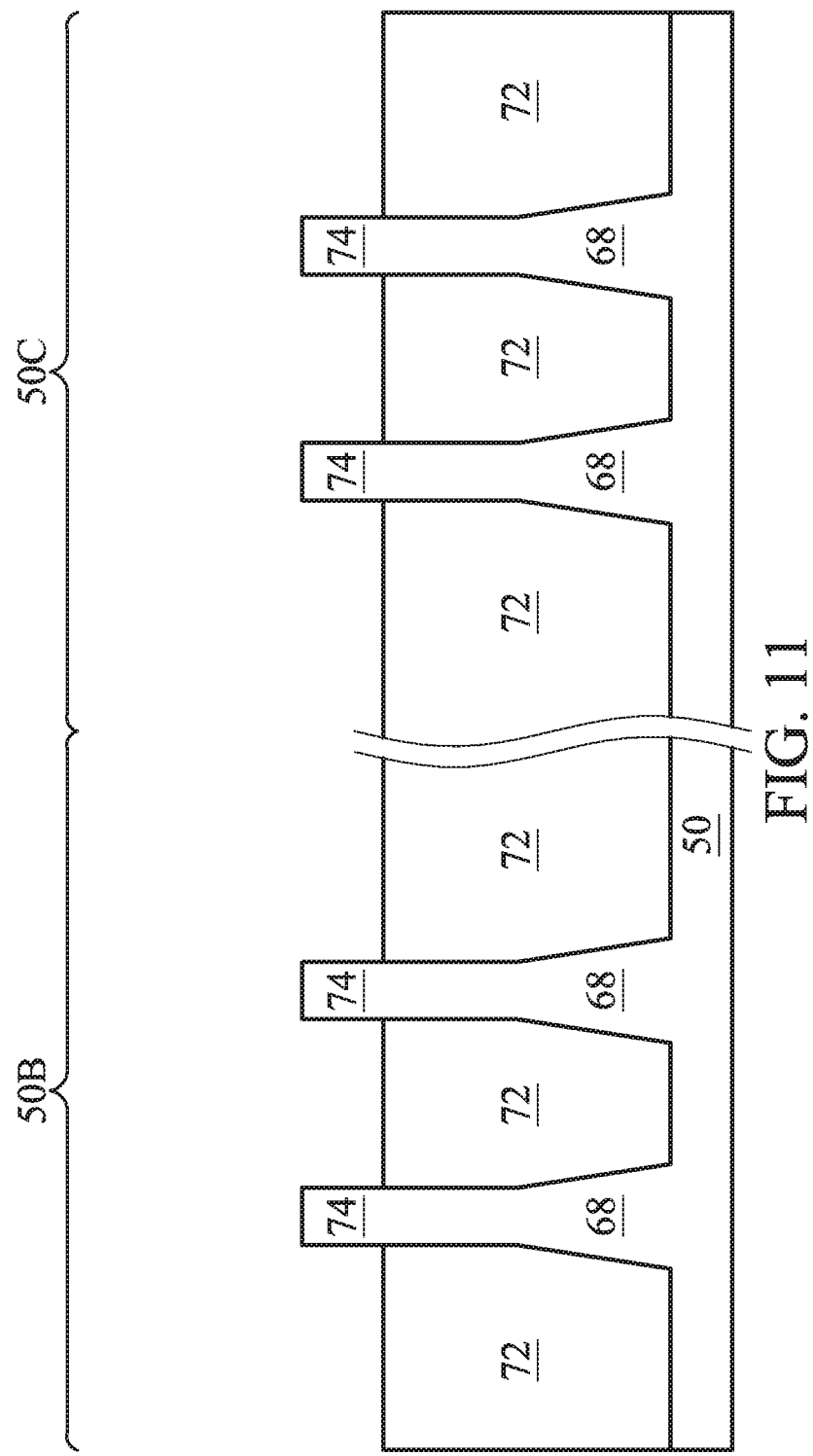
FIG. 11 illustrates the formation of shallow trench isolation regions in accordance with some embodiments.
Figure 12A:
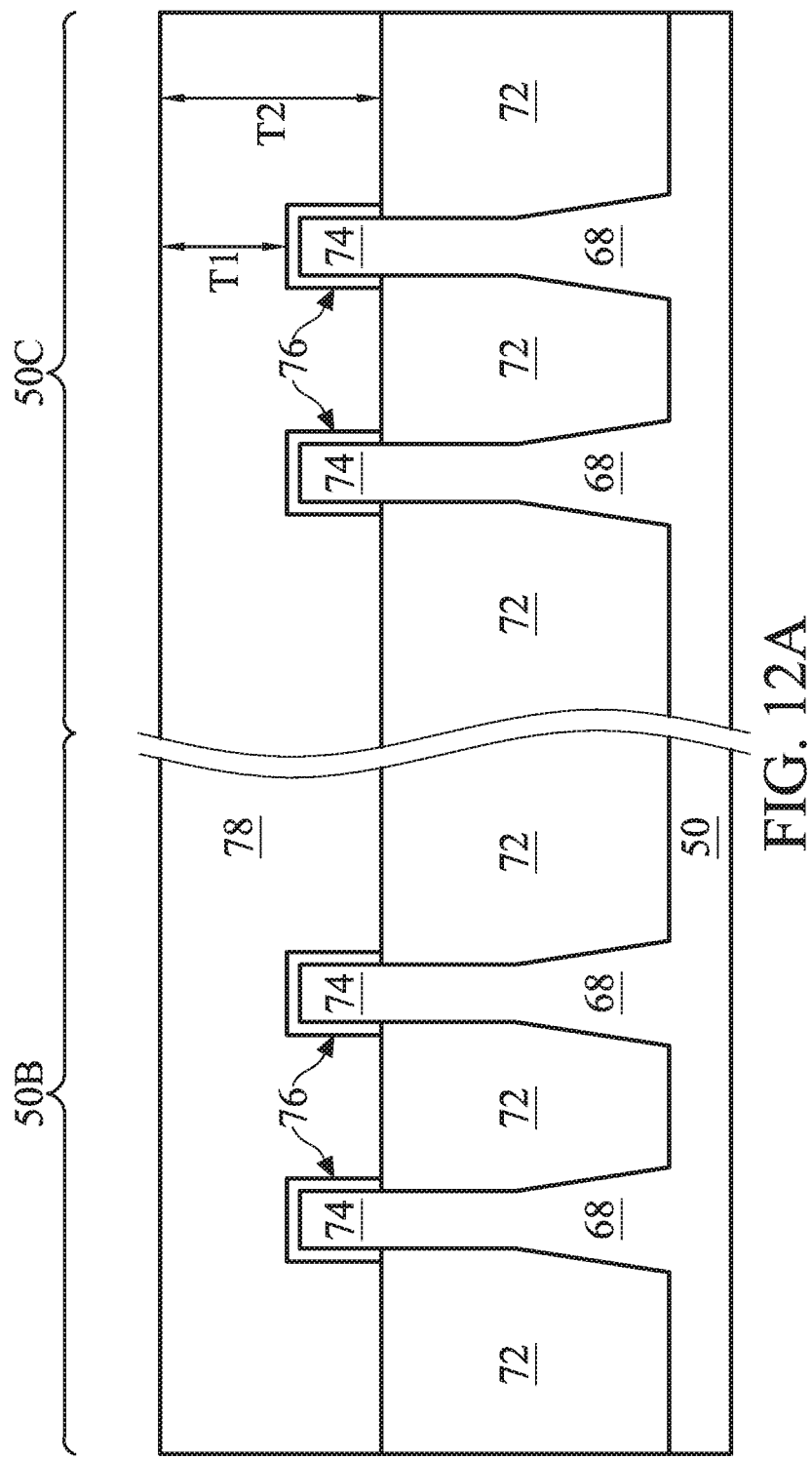
FIGS. 12A-B illustrate the formation of a dummy gate layers in accordance with some embodiments.
Figure 12B:
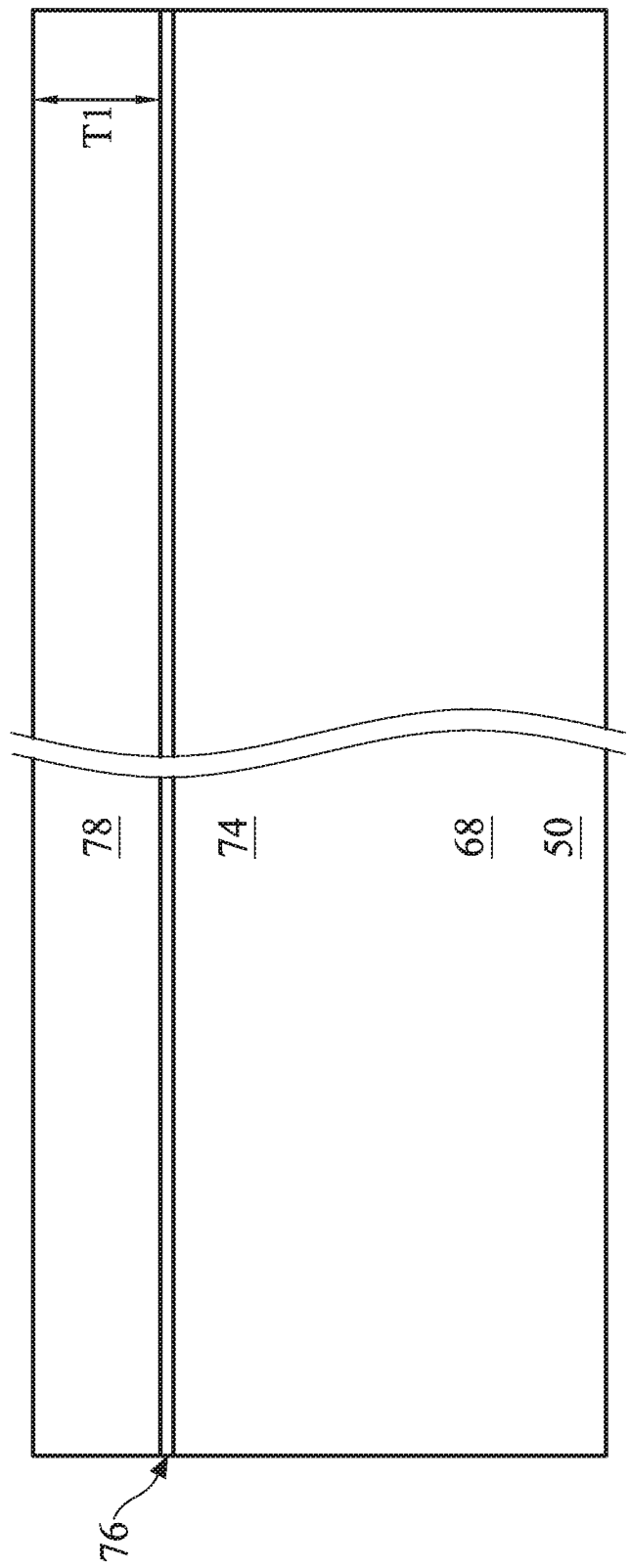

In FIG. 11, the insulation material 70 is recessed to form Shallow Trench Isolation (STI) regions 72. The insulation material 70 is recessed such that fins 68 in the first region 50B and in the second region 50C protrude from between neighboring STI regions 72. The top surfaces of the STI regions 72 may have a flat surface (as illustrated in FIG. 11), a convex surface, a concave surface (e.g., a dished surface), another shape, or a combination thereof. In some embodiments, the top surfaces of the STI regions 72 may be formed flat, convex, and/or concave by an appropriate etching process. The insulation material 70 may be recessed using an acceptable etching process, such as one that is selective to the material of the insulation material 70. For example, a chemical oxide removal using dilute hydrofluoric (dHF) acid or another technique may be used. In some embodiments, the fins 74, the fins 68, and/or the substrate 50 may be doped after the STI regions 72 are formed.

In FIGS. 12A-B, a dummy dielectric layer 76 is formed on the fins 74. FIG. 12A illustrates the structure along cross-section A-A similar to that shown in FIG. 1, and FIG. 12B illustrates the structure along cross-section B-B similar to that shown in FIG. 1. The dummy dielectric layer 76 may be, for example, silicon oxide, silicon nitride, a combination thereof, or the like, and may be deposited or thermally grown according to acceptable techniques (e.g., thermal oxidation). A dummy gate layer 78 is formed over the dummy dielectric layer 76 The dummy gate layer 78 may be deposited over the dummy dielectric layer 76 and then planarized, such as by a CMP. The dummy gate layer 78 may be a conductive material and may be selected from a group including polycrystalline-silicon (polysilicon), poly-crystal-line silicon-germanium (poly-SiGe), metallic nitrides, metallic silicides, metallic oxides, and metals. In some embodiments, amorphous silicon is deposited and recrystallized to create polysilicon. The dummy gate layer 78 may be deposited by physical vapor deposition (PVD), CVD, sputter deposition, or other techniques known and used in the art for depositing conductive materials. The dummy gate layer 78 may be made of other materials that have a high etching selectivity from the etching of isolation regions. In this example, a single dummy gate layer 78 is formed across the first region 50B and the second region 50C. In other embodiments, separate dummy gate layers may be formed in the first region 50B and the second region 50C. In some embodiments, the thickness T1 of portions of the dummy gate layer 78 on the fins 74 may be between about 85 nm and about 95 nm, and the thickness T2 of portions of the dummy gate layer 78 on the STI regions 72 may be between about 140 nm and about 150 nm.

In FIG. 13, a film stack is formed over the dummy gate layer 78. The film stack is used during processing to form features in the dummy gate layer 78. The film stack includes an ARC 80, a mask layer 82, and a mandrel layer 84. The ARC 80 is formed over the dummy gate layer 78. The ARC 80 may be formed of a material selected from the same candidate materials of the ARC 52, and may be formed using a method that is selected from the same group of candidate methods for forming the ARC 52. The ARCs 52 and 80 may be formed of the same material, or may include different materials. In some embodiments, the ARC 80 may be formed having a thickness between about 15 nm and about 25 nm.

The mask layer 82 is formed over the ARC 80. The mask layer 82 may be formed of a material selected from the same candidate materials of the mask layer 54, and may be formed using a method that is selected from the same group of candidate methods for forming the mask layer 54. The mask layers 54 and 82 may be formed of the same material, or may include different materials. In some embodiments, the mask layer 82 may be formed having a thickness between about 90 nm and about 110 nm.

The mandrel layer 84 is formed over the mask layer 82. The mandrel layer 84 may be formed of a material selected from the same candidate materials of the mandrel layer 56, and may be formed using a method that is selected from the same group of candidate methods for forming the mandrel layer 56. The mandrel layers 56 and 84 may be formed of the same material, or may include different materials. In some embodiments, the mandrel layer 84 may be formed having a thickness between about 90 nm and about 110 nm.

In FIG. 14, the mandrel layer 84 is patterned to form mandrels 86. The mandrel layer 84 may be patterned using any suitable photolithography technique. As an example of patterning the mandrel layer 84, a tri-layer photoresist structure (not shown) may be formed over the film stack. The tri-layer photoresist structure may include a bottom layer, a middle layer, and an upper layer. The photoresist may be patterned with the pattern of the mandrels 86, and an etching process may remove the portions of the mandrel layer 84 exposed by the photoresist. Remaining portions of the mandrel layer 84 form the mandrels 86, as shown in FIG. 14.

Figure 15:
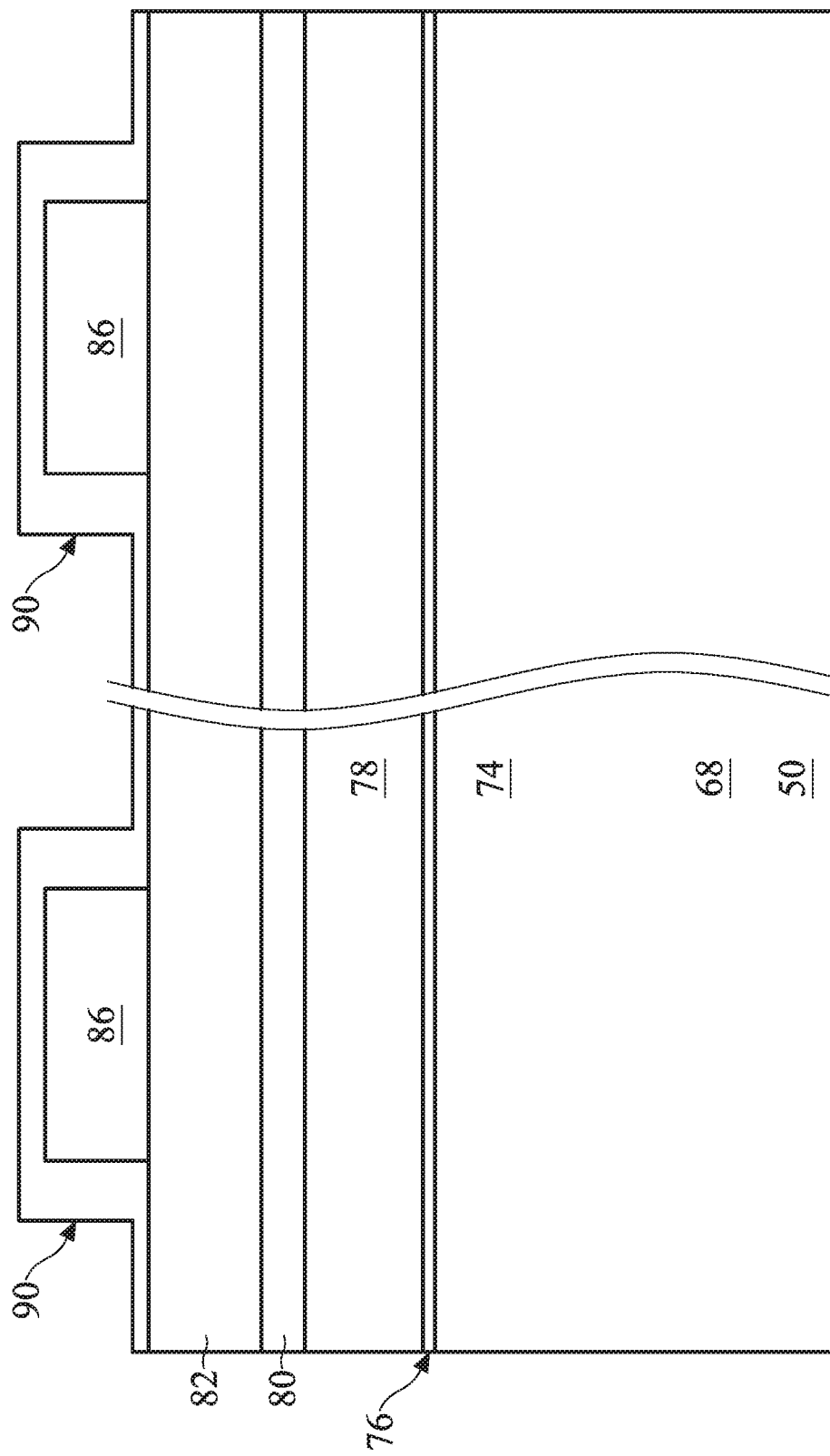
FIG. 15 illustrates the formation of a spacer layer in accordance with some embodiments.

In FIG. 15, a spacer layer 90 is formed over the mask layer 82 and mandrels 86. The spacer layer 90 may be formed of a material selected from the same candidate materials of the spacer layer 62, and may be formed using a method that is selected from the same group of candidate methods for forming the spacer layer 62. The spacer layers 62 and 90 may be formed of the same material, or may include different materials. For example, the spacer layer 90 may be formed of SiN using an ALD process.

Figure 16:
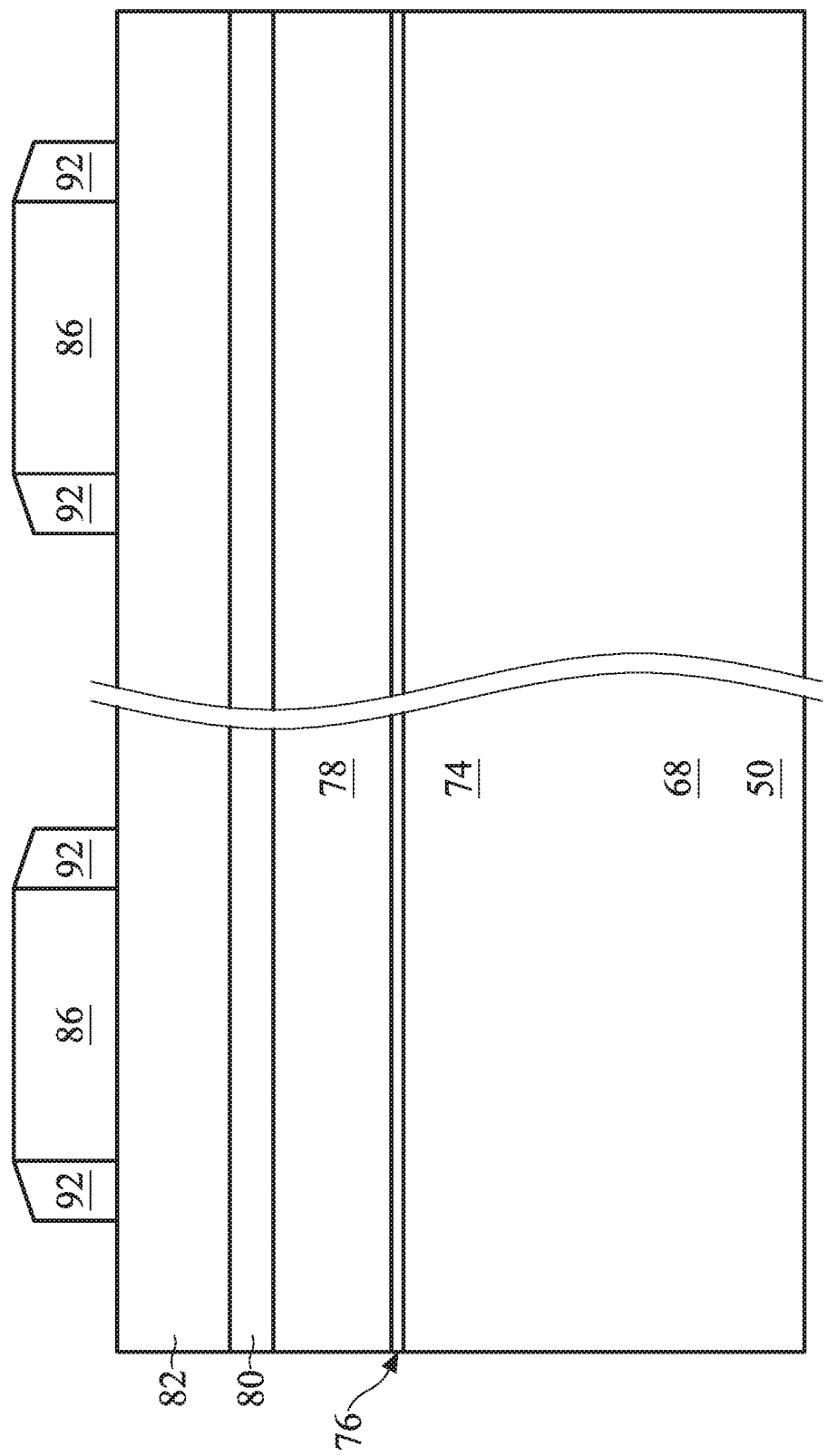
FIG. 16 illustrates the formation of spacers in accordance with some embodiments.
Figure 17:
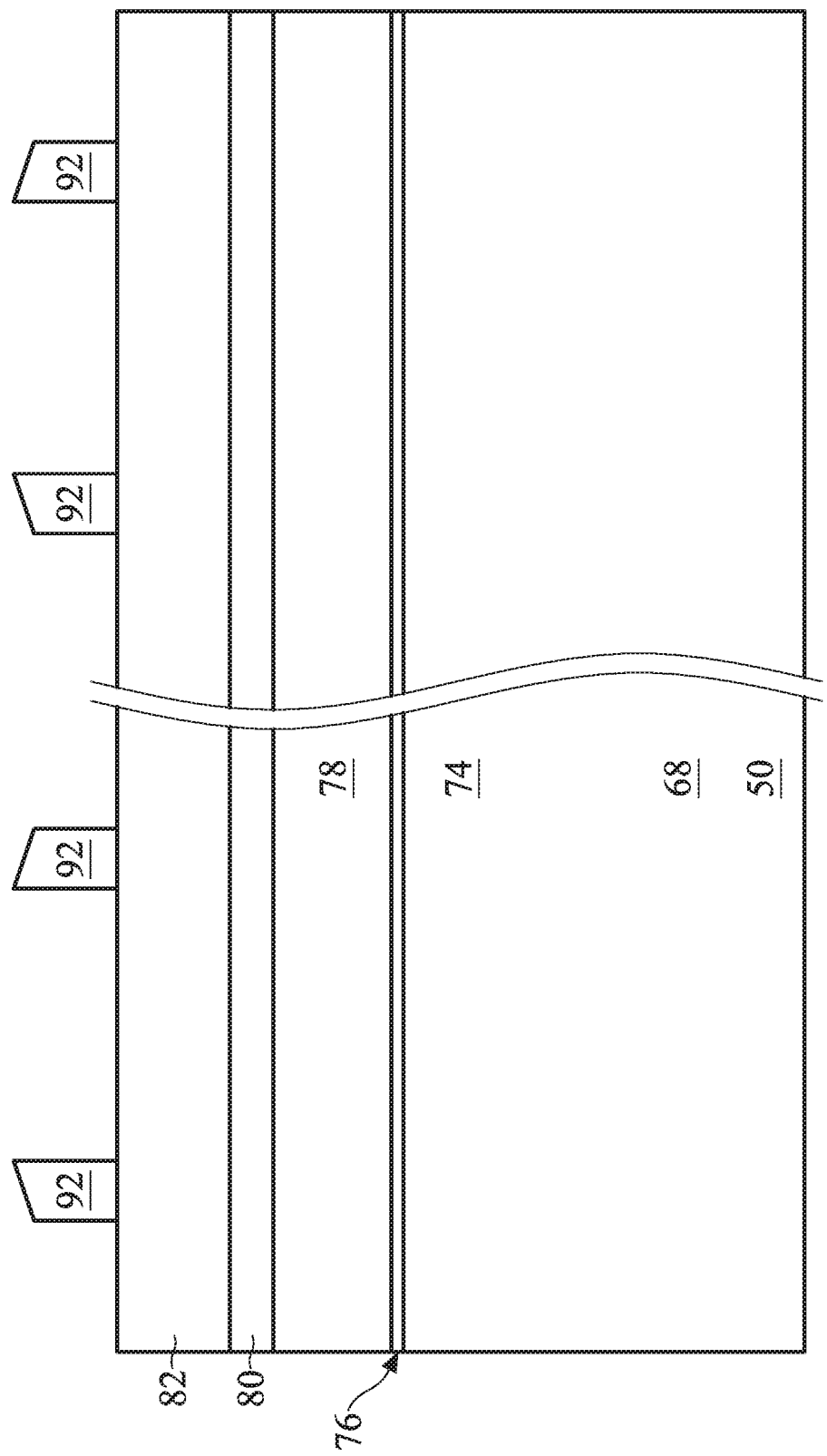
FIG. 17 illustrates the removal of the mandrels in accordance with some embodiments.

In FIG. 16, a suitable etching process is performed to remove the horizontal portions of the spacer layer 90 to form spacers 92. The horizontal portions of the spacer layer 90 may be removed in a manner similar to the method for removing the horizontal portions of the spacer layer 62. After the etching process, the vertical portions of the spacer layer 90 remain along the sides of the mandrels 86, and are referred to as spacers 92 hereinafter. In FIG. 17, the mandrels 86 are removed. The mandrels 86 may be removed by a suitable etching processes, such as by a dry etching process including etchants such as $CF_4$, $CH_3F$, $H_2$, $N_2$, Ar, the like, other etchants, or a combination thereof. A wet clean process may also be performed to remove residual spacer and mandrel material. In some embodiments, the spacer etch and the mandrel removal processes are performed in the same process chamber.

Figure 18:
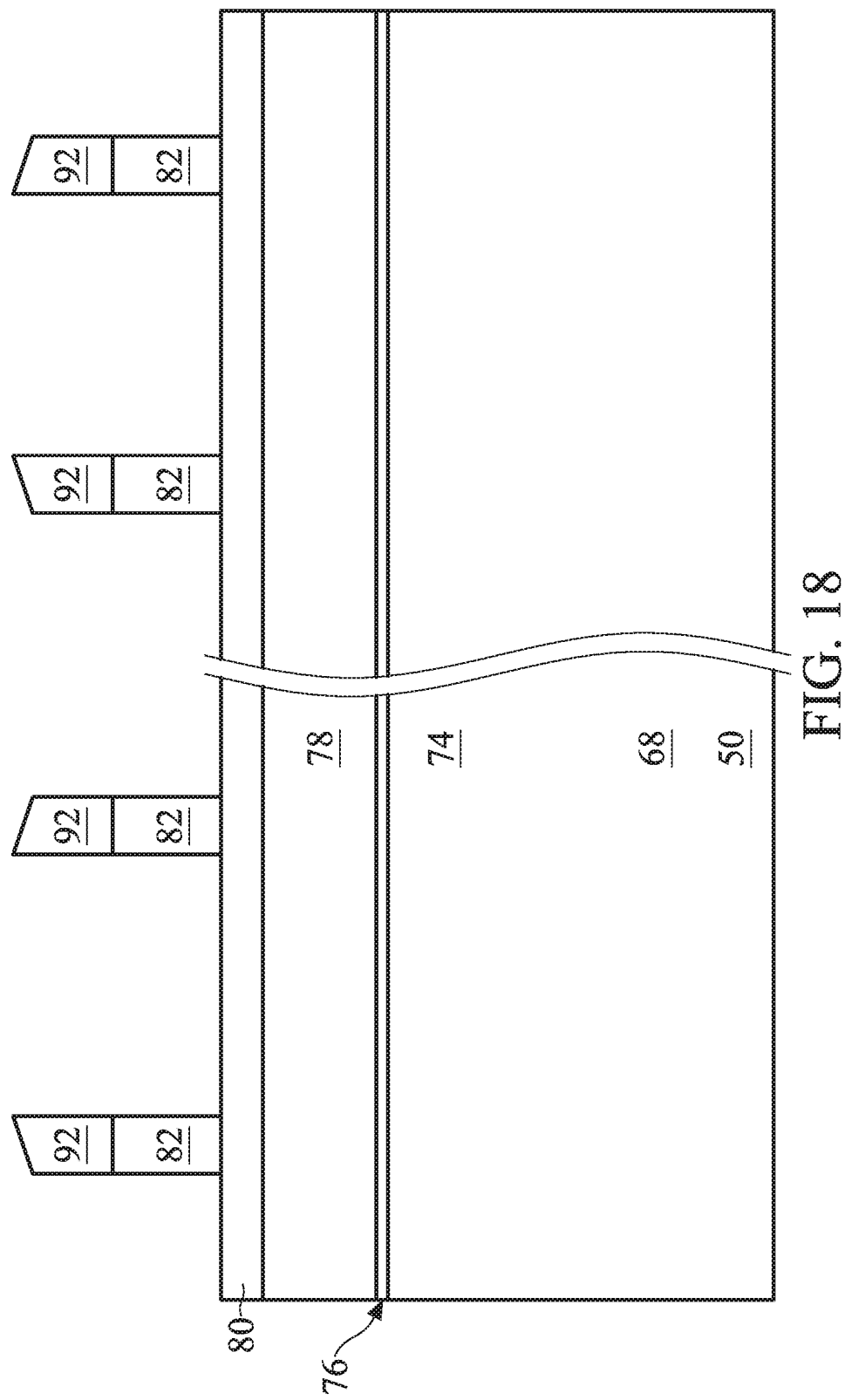
FIG. 18 illustrates the patterning of the film stack in accordance with some embodiments.

In FIG. 18, a suitable etching process is performed to pattern the mask layer 82. The spacers 92 are used as an etching mask, and as such, the pattern of the spacers 92 is transferred to the mask layer 82 to form openings in the mask layer 82. The etching process may be similar to the etching process described above with respect to patterning the mask layer 54, or may be a different process. In FIG. 19, a suitable etching process is performed to etch the ARC 80 using the patterned mask layer 82 as an etching mask. The etching process may be any acceptable etch process and may be an anisotropic etching process. In some cases, the ARC 80 and the dummy gate layer 78 may be etched in the same etching process.

FIGS. 19-24C illustrate the patterning of the dummy gate layer 78 to form dummy gates 94, according to an embodiment. In FIGS. 21A-24C, portions of dummy gates 94 are labeled as first dummy gate portions 94A and second dummy gate portions 94B. For clarity, only the patterning of two dummy gates 94 is shown in FIGS. 20A-23B. FIGS. 20A, 21A, 22A, and 23A show a cross-section along B-B as shown in FIG. 1, which is a cross-section along a fin 74. FIGS. 20B, 21B, 22B, and 23B show a cross-section along C-C as shown in FIG. 1, which is a cross-section parallel to B-B and offset from B-B such that no portion of the fin 74 is included. Accordingly, FIGS. 20A, 21A, 22A, and 23A show portions of the dummy gate layer 78 on the fins 74, and FIGS. 20B, 21B, 22B, and 23B show portions of the dummy gate layer 78 on the STI regions 72.

Figure 20B:
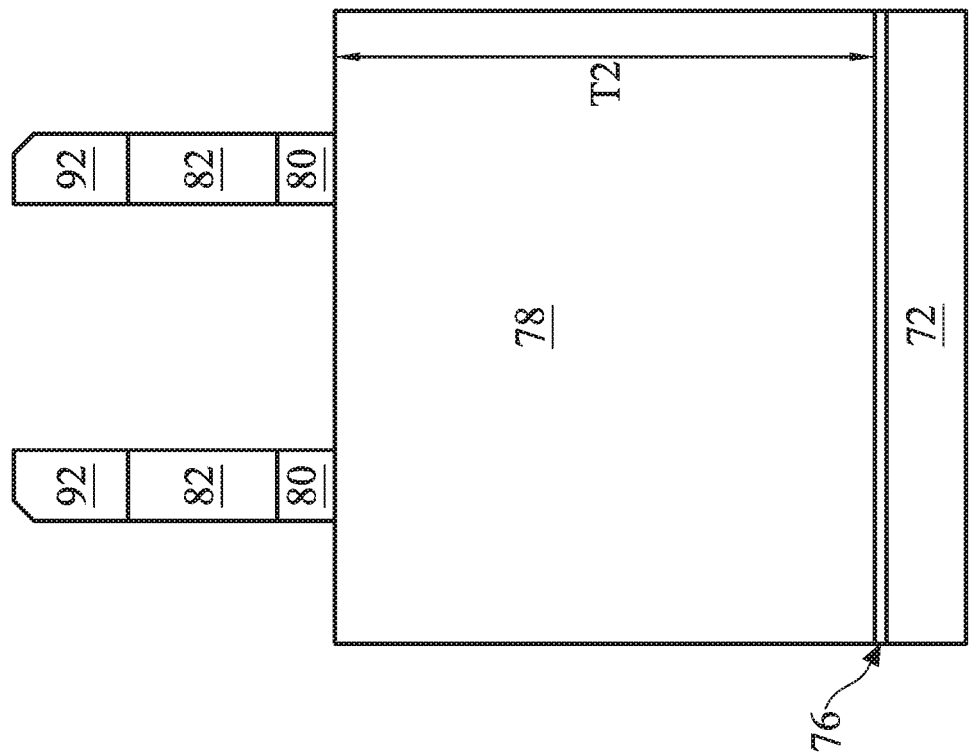
FIGS. 20A-B illustrate the dummy gate layers in accordance with some embodiments.
Figure 20A:
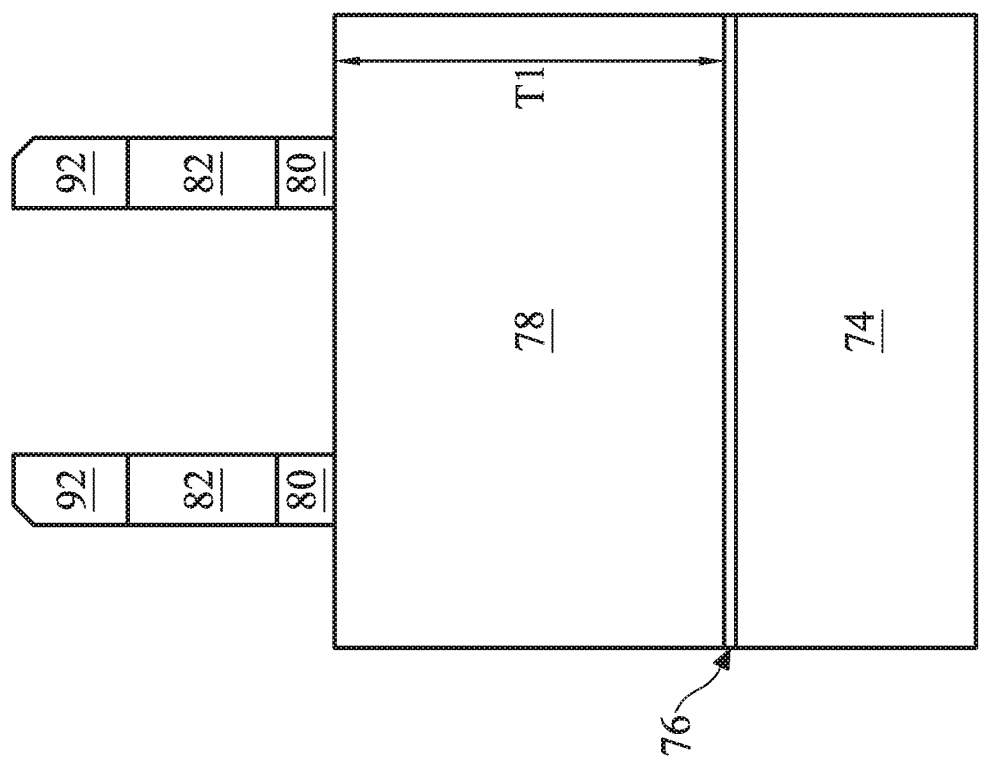

FIGS. 20A-B illustrate the dummy gate layer 78 prior to patterning, as shown in FIG. 19. In FIGS. 21A-B, a first etching process 93 is performed to etch portions of dummy gate layer 78. The first etching process 93 patterns the dummy gate layer 78 and forms first dummy gate portions 94A. In some embodiments, the first etching process 93 etches a depth D1 into the dummy gate layer 78 about equal to the thickness T1 of the portions of the dummy gate layer 78 on the fins 74 (shown in FIG. 21A). In other embodiments, the first etching process 93 etches a greater or smaller depth into the dummy gate layer 78. In some embodiments, the dummy dielectric layer 76 on the fins 74 (shown in FIG. 21A) acts as an etch stop for the first etching process 93, and thus depth D1 may be about equal to thickness T1. In this manner, portions of the dummy gate layer 78 on the STI regions 72 (shown in FIG. 21B) may be etched a depth D2 that is greater than the depth D1. In some embodiments, the first etching process 93 may etch the dummy gate layer 78 to a depth D2 of between about 85 nm and about 95 nm. In some embodiments, parameters of the first etching process 93 may be controlled to form first dummy gate portions 94A having a desired profile or shape, described in greater detail below. The first etching process 93 may remove some or all of the spacers 92. In some embodiments, the first etching process 93 includes an anisotropic etch performed by a plasma process, described in greater detail below.

In FIGS. 22A-B, a second etching process 95 is performed to further etch portions of dummy gate layer 78. The second etching process 95 etches the dummy gate layer 78 and forms second dummy gate portions 94B. In some embodiments, the second etching process 95 etches a depth D3 into the dummy gate layer 78. In some embodiments, the dummy dielectric layer 76 acts as an etch stop for the second etching process 95. In some embodiments, the second etching process 95 may etch the dummy gate layer 78 to a depth D3 of between about 49 nm and about 59 nm. In some embodiments, parameters of the second etching process 95 may be controlled to form second dummy gate portions 94B having a desired profile or shape, described in greater detail below. In some embodiments, the second etching process 95 includes an anisotropic etch performed by a plasma process, described in greater detail below.

Figure 23B:
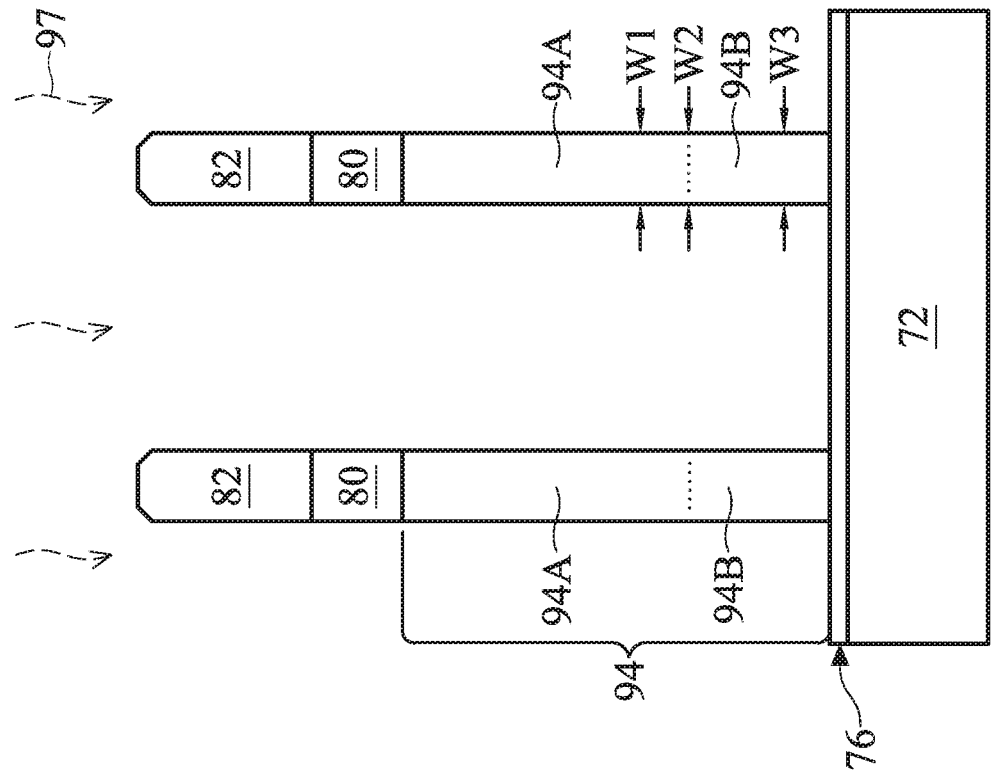
FIGS. 23A-B illustrate a third etching process of dummy gate layers in accordance with some embodiments.
Figure 23A:
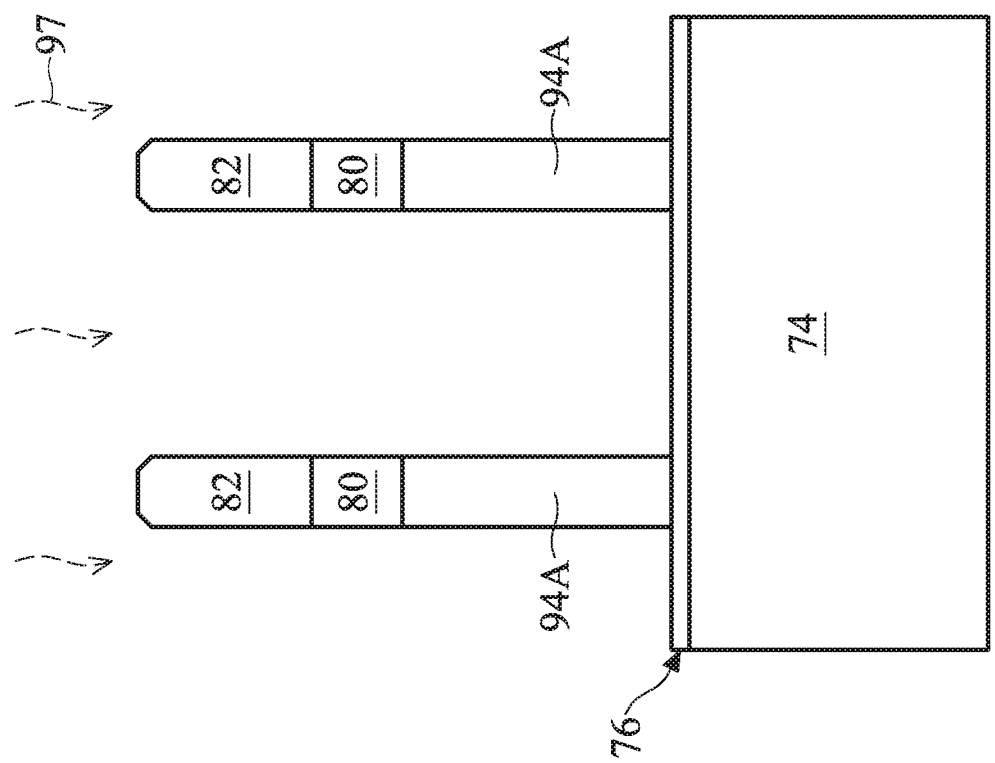
Figure 24C:
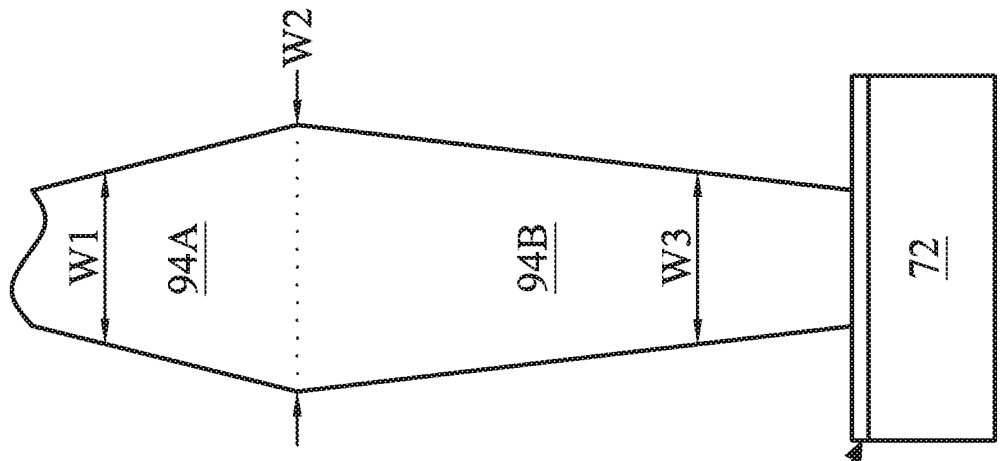
FIGS. 24A-C illustrate example dummy gate profile shapes in accordance with some embodiments.
Figure 24B:
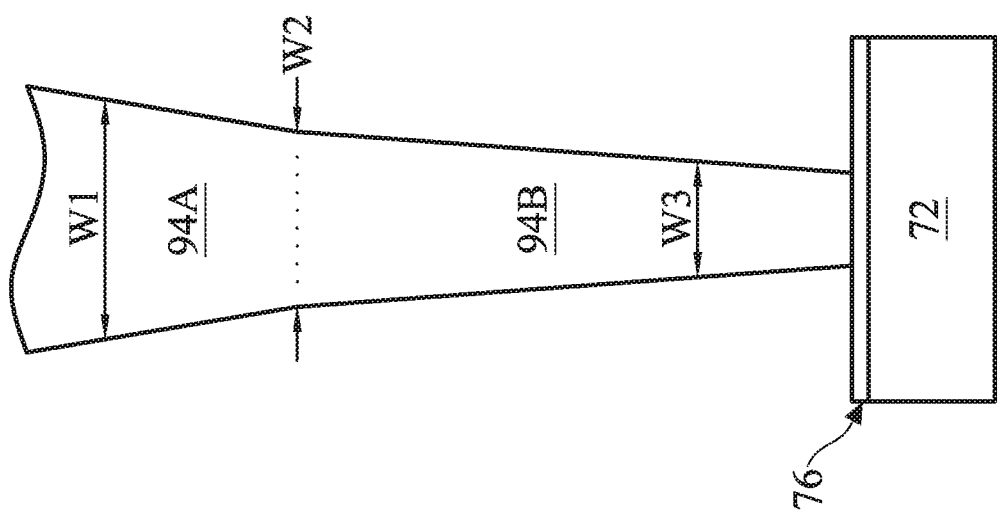
Figure 24A:
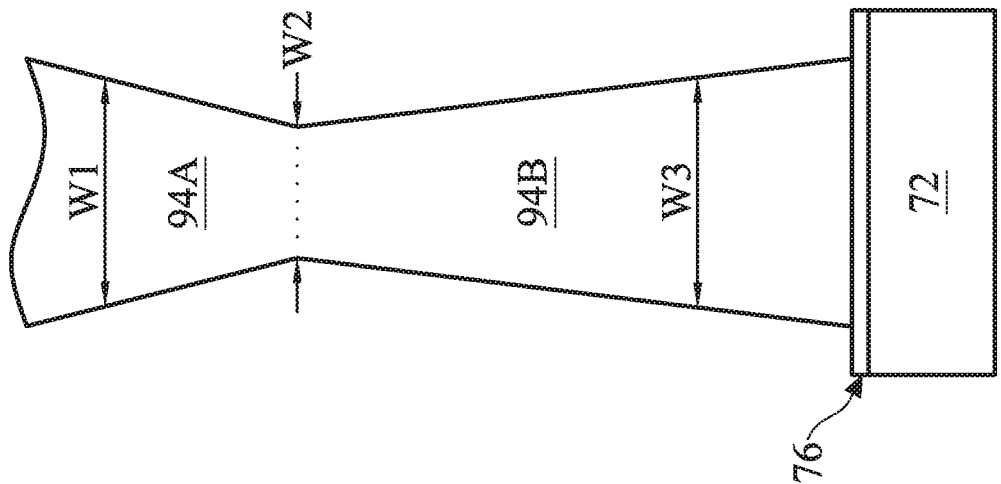

In FIGS. 23A-B, a third etching process 97 is performed to further etch portions of dummy gate layer 78. In some embodiments, the third etching process 97 is an "overetch" process that removes residue (e.g., "stringers") and provides some additional etching of the second dummy gate portions 94B. In some embodiments, parameters of the third etching process 97 may be controlled to reshape the second dummy gate portions 94B to have a desired profile or shape, described in greater detail below. In some embodiments, the third etching process 97 includes an anisotropic etch performed by a plasma process, also described in greater detail below. In this manner, dummy gates 94 are formed from the dummy gate layer 78 using the first etching process 93, the second etching process 95, and the third etching process 97. In some embodiments, additional etching processes may be used.

In some embodiments, the profile shape of the dummy gates 94 may be controlled by controlling parameters of the first etching process 93, the second etching process 95, and/or the third etching process 97. For example, different widths of the dummy gates 94 at different locations along the dummy gates 94 may be controlled. As an illustrative example, the widths W1, W2, and W3 shown in FIG. 23B indicate three locations along the dummy gates 94 that may be controlled by the first etching process 93, the second etching process 95, and/or the third etching process 97. Other locations, more locations, or fewer locations along the dummy gates 94 may be used to characterize the profile shape of dummy gates 94. The width W1 is located on the dummy gates 94 at about 5 nm above a position level with the top of the fins 74. The width W2 is located on the dummy gates 94 at a position about level with the top of the adjacent fins 74. In some cases, the width W2 is located at about the top of the second dummy gate portions 94B. The width W3 is located on the dummy gates 94 at about 10 nm above the bottom of the dummy gates 94.

In some embodiments, the profile shape of the first dummy gate portions 94A may be controlled by controlling parameters of the first etching process 93. For example, the width W1 of the dummy gates 94 may be controlled in this manner. In some embodiments, the first etching process 93 includes a plasma etching process performed in a processing chamber with process gases being supplied into the processing chamber. In some embodiments, the plasma generation power may be pulsed between a low power and a high power during the first etching process 93. An applied bias voltage may be pulsed between a low voltage and a high voltage during the first etching process 93. The low power may include a power of zero, and the low voltage may include a voltage of zero. The plasma generation power or the bias voltage may be pulsed as a rectangular wave or a square wave, though other pulse shapes may be used. In some embodiments, the plasma generation power and the bias voltage may have synchronized pulses, such that the plasma generation power and the bias voltage are simultaneously in their respective low state or high state. In some embodiments, the plasma is a direct plasma. In other embodiments, the plasma is a remote plasma that is generated in a separate plasma generation chamber connected to the processing chamber. Process gases may be activated into plasma by any suitable method of generating the plasma, such as transformer coupled plasma (TCP) systems, inductively coupled plasma (ICP) systems, magnetically enhanced reactive ion techniques, electron cyclotron resonance techniques, or the like.

The process gases used in the first etching process 93 may include etchant gases such as $CF_4$, $CHF_3$, $Cl_2$, $H_2$, $N_2$, Ar, other gases, or a combination of gases. In some embodiments, process gases also include passivation gases such as HBr, $O_2$, other gases, or a combination of gases. Carrier gases, such as $N_2$, Ar, He, or the like, may be used to carry process gases into the processing chamber. The process gases may be flowed into the processing chamber at a rate between about 300 sccm and about 400 sccm. For example, the etchant gases may be flowed into the processing chamber at a rate between about 30 sccm and about 50 sccm, and the passivation gases may be flowed into the processing chamber at a rate between about 200 sccm and about 300 sccm. In some embodiments, the passivation gases may be a mixture of HBr and $O_2$, in which the ratio of HBr:$O_2$ is between about 3:1 and about 5:1.

The first etching process 93 may be performed using a bias voltage having a high voltage between about 600 volts and about 700 volts. The first etching process 93 may be performed using a plasma generation power having a high power between about 1000 Watts and about 1500 Watts. In some embodiments, the plasma generation power or the bias voltage may be pulsed having a duty cycle between about 2% and about 8%, and may have a pulse frequency between about 100 Hz and about 200 Hz. The first etching process 93 may be performed at a temperature between about 38° C. and about 43° C. A pressure in the processing chamber may be between about 20 mTorr and about 30 mTorr.

In some embodiments, the profile shape of the first dummy gate portions 94A may be controlled by controlling the flow rate of passivation gases into the processing chamber during the first etching process 93. For example, increasing the flow rate of the passivation gases between about 1% and about 5% can cause an increase in the width W1 of between about 2 Å and about 12 Å. In some embodiments, the profile shape of the first dummy gate portions 94A may be controlled by controlling the duty cycle of synchronized plasma generation power and bias voltage pulses. For example, increasing the duty cycle of the synchronized pulses an amount between about 1% and about 3% can cause a increase in the width W1 of between about 0.38 nm and about 1.16 Å. By controlling the flow rate of the passivation gases and the duty cycle of the synchronized pulses, the profile and width of the first dummy gate portions 94A may be controlled. For example, a width of the first dummy gate portions 94A after the first etching process 93 may be increased or decreased by controlling these etching parameters. In particular, a width W1 near the bottom of the first dummy gate portions 94A may be controlled. In some cases, changing the parameters may result in first dummy gate portions 94A that are wider near the bottom, have a substantially constant width, or are wider near the top.

In some embodiments, the profile shape of the dummy gates 94 may be controlled by controlling parameters of the second etching process 95. For example, the width W2 of the dummy gates 94 may be controlled in this manner. In some embodiments, the second etching process 95 includes a plasma etching process performed in a processing chamber with process gases being supplied into the processing chamber, which may be the same processing chamber used for the first etching process 93. In some embodiments, the plasma generation power may be held at a substantially constant power during the second etching process 95. An applied bias voltage may be pulsed between a low voltage and a high voltage during the second etching process 95. The low voltage may include a voltage of zero. The bias voltage may be pulsed as a rectangular wave or a square wave, though other pulse shapes may be used. In some embodiments, the plasma is a direct plasma. In other embodiments, the plasma is a remote plasma that is generated in a separate plasma generation chamber connected to the processing chamber. Process gases may be activated into plasma by any suitable method of generating the plasma, such as TCP systems, ICP systems, magnetically enhanced reactive ion techniques, electron cyclotron resonance techniques, or the like.

The process gases used in the second etching process 95 may include etchant gases such as $CF_4$, $Cl_2$, $H_2$, $N_2$, Ar, other gases, or a combination of gases. In some embodiments, process gases also include passivation gases such as HBr, $O_2$, other gases, or a combination of gases. Carrier gases, such as $N_2$, Ar, He, or the like, may be used to carry process gases into the processing chamber. The etchant gases may be flowed into the processing chamber at a rate between about 120 sccm and about 250 sccm.

The second etching process 95 may be performed using a bias voltage having a low voltage between about 600 volts and about 700 volts and having a high voltage between about 800 volts and about 900 volts. The second etching process 95 may be performed using a substantially constant plasma generation power between about 500 Watts and about 700 Watts. In some embodiments, the bias voltage may be pulsed having a duty cycle between about 5% and about 8%, and may have a pulse frequency between about 100 Hz and about 300 Hz. The second etching process 95 may be performed at a temperature between about 34° C. and about 50° C. A pressure in the processing chamber may be between about 70 mTorr and about 90 mTorr.

In some embodiments, the profile shape of the dummy gates 94 may be controlled by controlling the low voltage and/or the high voltage of the pulsed bias voltage during the second etching process 95. For example, increasing the high voltage between about 1% and about 3.5% can cause a reduction in the width W2 of between about 4 Å and about 8 Å. In some embodiments, the profile shape of the dummy gates 94 may be controlled by controlling the duty cycle of the bias voltage pulses. For example, increasing the duty cycle of the bias voltage pulses an amount between about 1% and about 3% can cause a reduction in the width W2 of between about 1.12 nm and about 1.96 nm. By controlling the voltage and the duty cycle of the pulsed bias voltage, the profile and width of the dummy gates 94 may be controlled. For example, a width of the dummy gates 94 after the second etching process 95 may be increased or decreased by controlling these etching parameters. In particular, a width W2 of the dummy gates 94 near the top of the fins 74 may be controlled. In some cases, changing the parameters may result in first dummy gate portions 94A or second dummy gate portions 94B that are wider near the bottom, have a substantially constant width, or are wider near the top.

In some embodiments, the profile shape of the dummy gates 94 may be controlled by controlling parameters of the third etching process 97. For example, the width $W_3$ of the dummy gates 94 may be controlled in this manner. In some embodiments, the third etching process 97 includes a plasma etching process performed in a processing chamber with process gases being supplied into the processing chamber, which may be the same processing chamber as used for first etching process 93 or second etching process 95. In some embodiments, the plasma generation power may be held at a substantially constant power during the third etching process 97. An applied bias voltage may be pulsed between a low voltage and a high voltage during the third etching process 97. The low voltage may include a voltage of zero. The bias voltage may be pulsed as a rectangular wave or a square wave, though other pulse shapes may be used. In some embodiments, the plasma is a direct plasma. In other embodiments, the plasma is a remote plasma that is generated in a separate plasma generation chamber connected to the processing chamber. Process gases may be activated into plasma by any suitable method of generating the plasma, such as TCP systems, ICP systems, magnetically enhanced reactive ion techniques, electron cyclotron resonance techniques, or the like.

The process gases used in the third etching process 97 may include etchant gases such as $CF_4$, $Cl_2$, $H_2$, $N_2$, Ar, other gases, or a combination of gases. In some embodiments, process gases also include passivation gases such as HBr, $O_2$, other gases, or a combination of gases. Carrier gases, such as $N_2$, Ar, He, or the like, may be used to carry process gases into the processing chamber. The process gases may be flowed into the processing chamber at a rate between about 400 sccm and about 550 sccm. For example, the etchant gases may be flowed into the processing chamber at a rate between about 130 sccm and about 210 sccm, and the passivation gases may be flowed into the processing chamber at a rate between about 200 sccm and about 250 sccm. In some embodiments, the passivation gases may be a mixture of HBr and $O_2$, in which the ratio of HBr:$O_2$ is between about 3:1 and about 4:1.

The third etching process 97 may be performed using a bias voltage having a low voltage between about 850 volts and about 900 volts and having a high voltage between about 900 volts and about 950 volts. The third etching process 97 may be performed using a substantially constant plasma generation power between about 250 Watts and about 350 Watts. In some embodiments, the bias voltage may be pulsed having a duty cycle between about 10% and about 20%, and may have a pulse frequency between about 100 Hz and about 200 Hz. The third etching process 97 may be performed at a temperature between about 40° C. and about 50° C. A pressure in the processing chamber may be between about 70 mTorr and about 90 mTorr.

In some embodiments, the profile shape of the dummy gates 94 may be controlled by controlling the flow rate of passivation gases into the processing chamber during the third etching process 97. For example, reducing the flow rate of the passivation gases between about 0.5% and about 2% can cause a reduction in the width $W_3$ of between about 3 Å and about 14 Å. In some embodiments, the profile shape of the dummy gates 94 may be controlled by controlling the duty cycle of bias voltage pulses. For example, increasing the duty cycle of the bias voltage pulses an amount between about 1% and about 3% can cause an increase in the width $W_3$ of between about 0.24 nm and about 0.8 Å. By controlling the flow rate of the passivation gases and the duty cycle of the bias voltage pulses, the profile and width of the dummy gates 94 may be controlled. For example, a width of the dummy gates 94 after the third etching process 97 may be increased or decreased by controlling these etching parameters. In particular, a width $W_3$ near the bottom of the dummy gates 94 may be controlled. In some cases, changing the parameters may result in second dummy gate portions 94B that are wider near the bottom, have a substantially constant width, or are wider near the top. In this manner, the profile shape of the dummy gates 94 may be controlled for a particular application, for example, in order to produce a metal gate having a particular profile. In some cases, the profile shape of the dummy gates 94 may be controlled to reduce the chance of certain processing defects occurring.

As described above, by using separate etching processes to etch the dummy gates 94, and by controlling parameters of the etching processes, the profile shape of the dummy gates 94 may be controlled. Parameters of the etching processes may include passivation gas flow rate, bias voltage, pulse duty cycle, or other parameters. In this manner, different portions of the dummy gates 94 may be etched to have a desired profile, shape, or sidewall slope. The desired profile may include, for example, a convex shape, a concave shape, a sloped shape, or other shapes. In some embodiments, a desired profile may include portions of the dummy gates 94 having different slopes, different widths, or other different features. In some embodiments, the portion of a dummy gate 94 disposed over a fin 74 (e.g., first dummy gate portions 94A) may be formed having a different profile, shape, or sidewall slope than the portion of the dummy gate 94 disposed adjacent the fin 74 (e.g., second dummy gate portions 94B). FIGS. 24A-C show illustrative examples of some of the profile shapes of dummy gates 94 that may be formed using the techniques described herein. These are example profile shapes, and other profile shapes are within the scope of this disclosure.

FIG. 24A shows an example dummy gate 94 for which a top width near the top of the dummy gate 94 and a bottom width near the bottom of the dummy gate 94 are both greater than a middle width that is between the top width and the bottom width. As shown in the example of FIG. 24A, width W2 is smaller than width W1 or width W3. For this example profile shape, width W1 may be larger, smaller, or about the same as width W3. In some embodiments, a profile shape similar to that shown in FIG. 24A may be formed such that width W1 is between about 0% and about 10% larger than width W2 and that width W3 is between about 0% and about 10% larger than width W2.

FIG. 24B shows an example dummy gate 94 for which a top width near the top of the dummy gate 94 is greater than a middle width, and a bottom width near the bottom of the dummy gate 94 that is smaller than the middle width. As shown in the example of FIG. 24B, width W1 is larger than width W2, and width W2 is larger than width W3. In other cases, width W1 may be about the same as width W2, or width W2 may be about the same as width W3. In some embodiments, a profile shape similar to that shown in FIG. 24B may be formed such that width W1 is between about 0% and about 10% larger than width W2 and that width W2 is between about 0% and about 10% larger than width W3. In some embodiments, a tapering profile shape similar to that shown in FIG. 24B may be formed using the techniques described herein in order to allow for improved metal gate fill (described below).

FIG. 24C shows an example dummy gate 94 for which a top width near the top of the dummy gate 94 and a bottom width near the bottom of the dummy gate 94 are both smaller than a middle width. As shown in the example of FIG. 24C, width W2 is greater than width W1 or width W3. For this example profile shape, width W1 may be larger, smaller, or about the same as width W3. In some embodiments, a profile shape similar to that shown in FIG. 24C may be formed such that width W2 is between about 0% and about 10% larger than width W1 and that width W2 is between about 0% and about 10% larger than width W3. As shown in FIGS. 24A-C, in some embodiments the profile or shape of a dummy gate 94 over a fin 74 may be formed to be different from the profile or shape of the dummy gate 94 adjacent the fin 74.

Figure 26B:
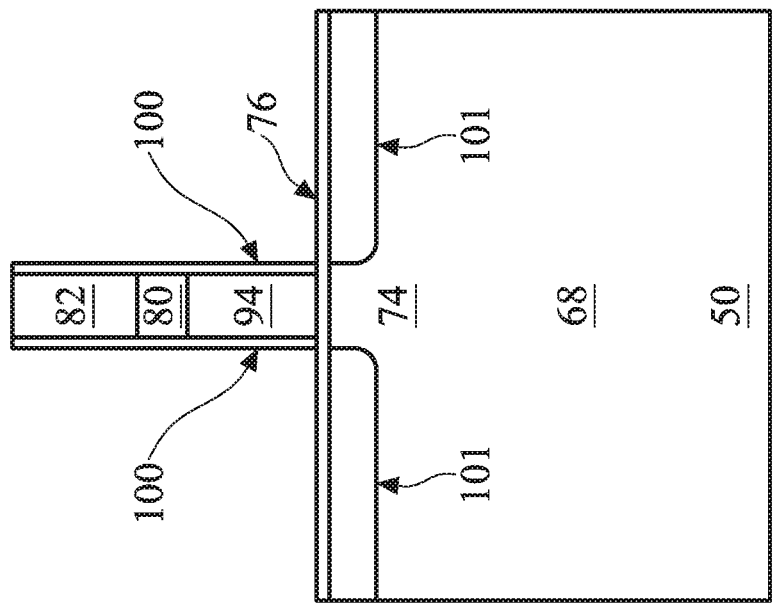
FIGS. 26A-B illustrate the formation of spacers in accordance with some embodiments.
Figure 26A:
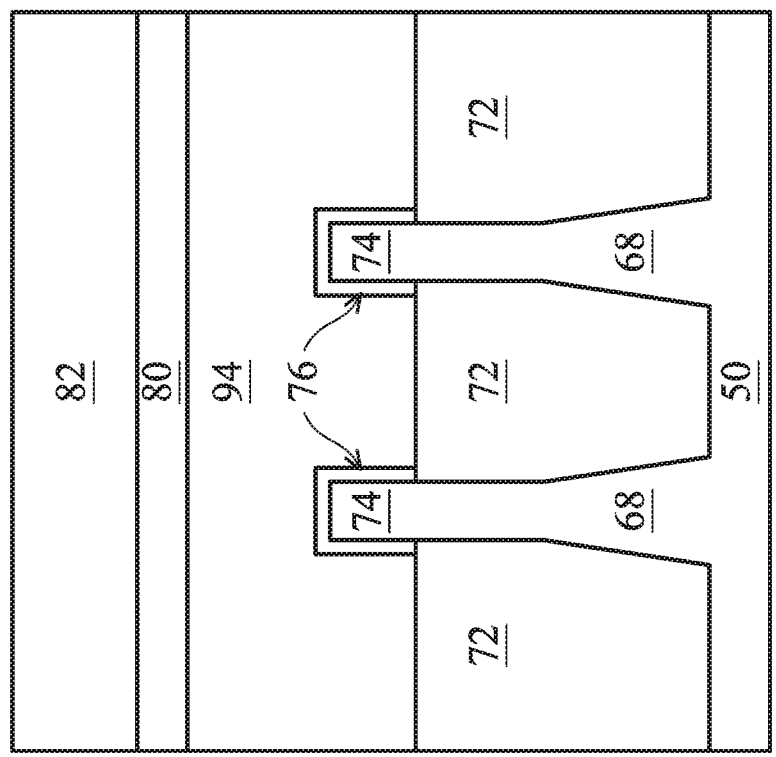

FIG. 25 illustrates the structures shown in FIG. 19 after the first etching process 93, the second etching process 95, and the third etching process 97 have been performed, as described above with respect to FIGS. 20A-24C. Turning to FIGS. 26A-B, spacers 100 may be formed on exposed surfaces of the dummy gates 94, the patterned mask layer 82, the ARC 80, and/or the fins 74. In some embodiments, the spacers 100 may be formed by a thermal oxidation process or a deposition process, followed by an anisotropic etching process.

After the formation of the spacers 100, an implantation process for lightly doped source/drain (LDD) regions 101 may be performed. In some embodiments that include the formation of different types of devices, a mask may be formed over the first region 50B and leaving the second region 50C exposed. An appropriate type of impurities (e.g., n-type or p-type) may be implanted into exposed regions of the fins 74 in the second region 50C. The mask may then be removed. Subsequently, another mask may be formed over the second region 50C while exposing the first region 50B, and appropriate type impurities may be implanted into the exposed regions of fins 74 in the first region 50B. The mask may then be removed. The n-type impurities may be the any of the n-type impurities previously discussed, and the p-type impurities may be the any of the p-type impurities previously discussed. The LDD regions 101 may have a concentration of impurities of from about $10^{15}$ cm$^{-3}$ to about $10^{16}$ cm$^{-3}$. In some cases an anneal may be used to activate the implanted impurities.

Figure 27A:
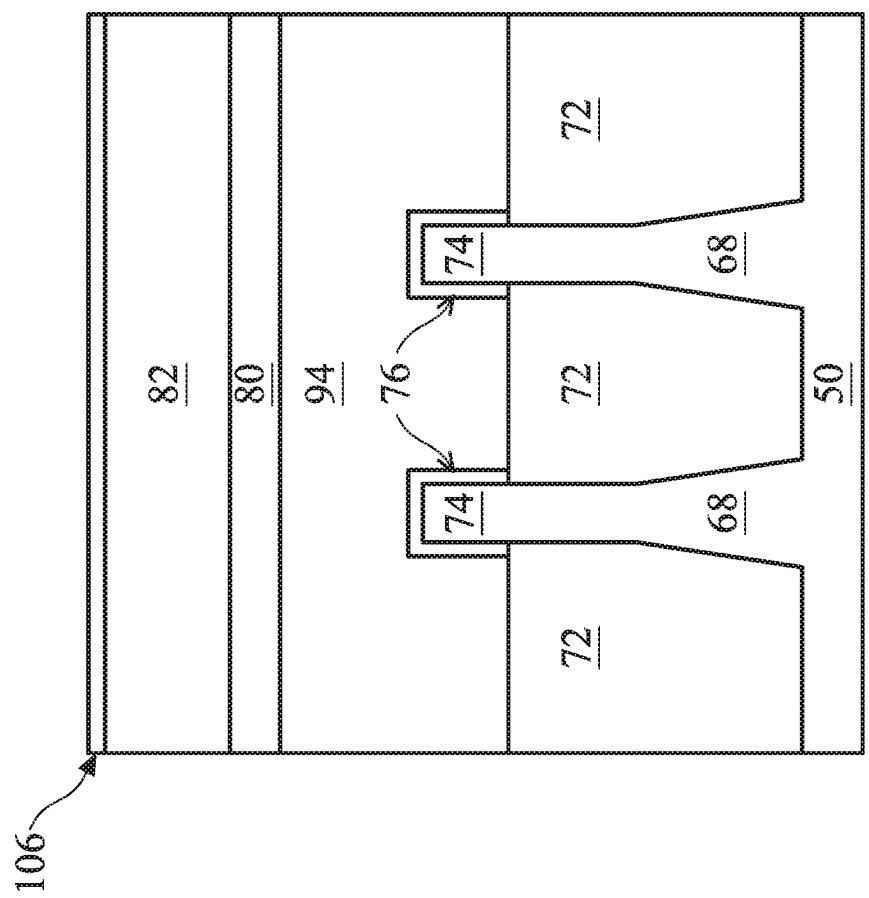
FIGS. 27A-B illustrate the formation of a gate spacer layer in accordance with some embodiments.
Figure 27B:
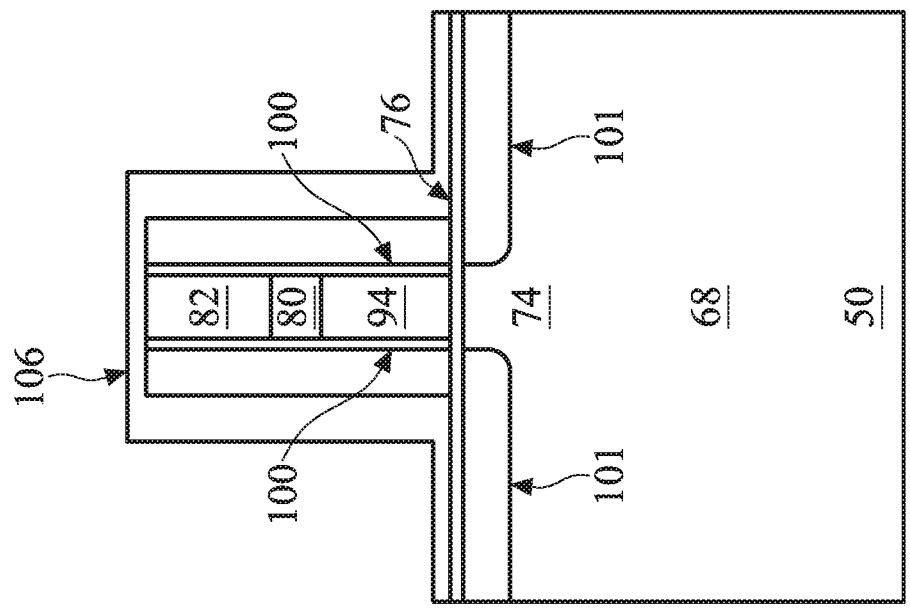
Figure 28B:
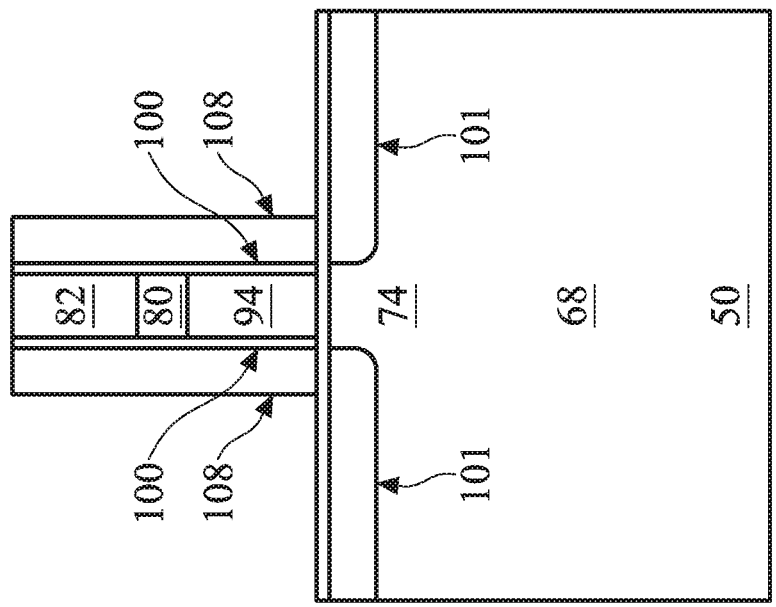
FIGS. 28A-B illustrate the formation of gate spacers in accordance with some embodiments.
Figure 28A:
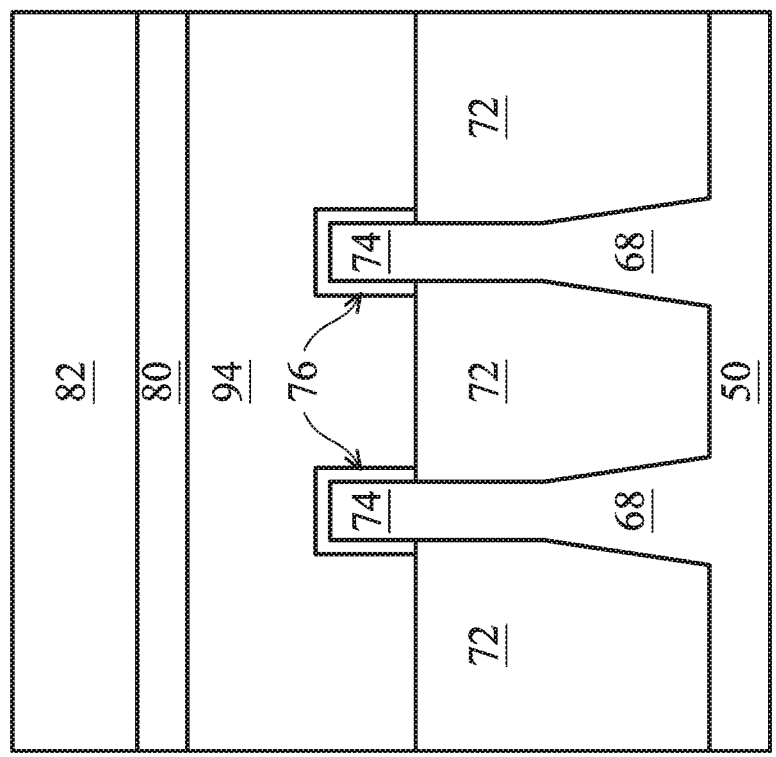
Figure 29B:
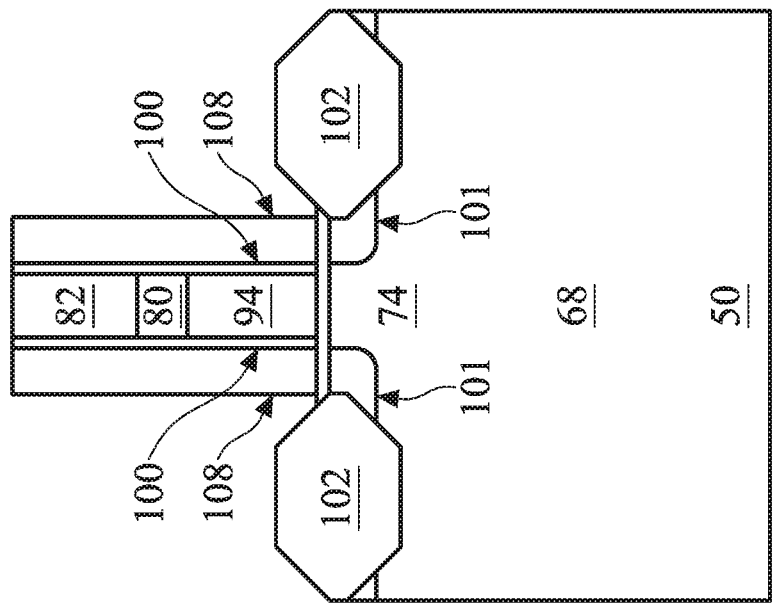
Figure 29A:
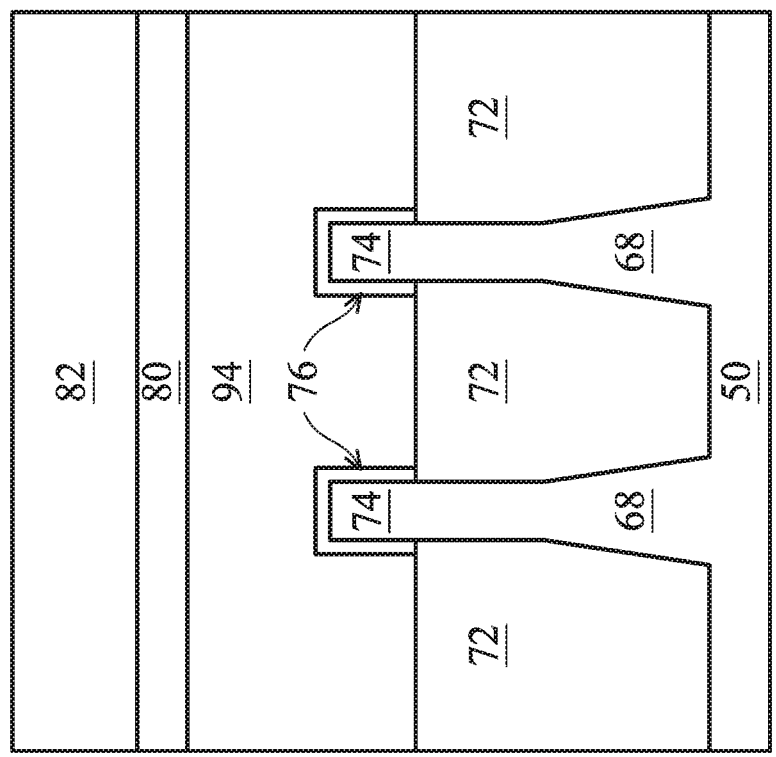

In FIGS. 27A-B, a gate spacer layer 106 is formed over the top surfaces of the patterned mask layer 82, spacers 100, and fins 74, and also along sidewalls of the dummy gates 94 and the patterned mask layer 82. The gate spacer layer 106 may be formed in a manner similar to the spacer layer 62, described previously. In an embodiment, the gate spacer layer 106 is formed of SiN using an ALD process. In FIGS. 28A-B, a suitable etching process is performed to remove horizontal portions of the gate spacer layer 106. The horizontal portions of the gate spacer layer 106 may be removed in a manner similar to the method for removing horizontal portions of the spacer layer 62. After the etching process, vertical portions of the gate spacer layer 106 remain along the sides of the dummy gates 94 and the patterned mask layer 82, and are referred to as gate spacers 108 hereinafter.

In FIGS. 29A-D, epitaxial source/drain regions 102 are formed in the fins 74 adjacent the gate spacers 108. The epitaxial source/drain regions 102 are formed in the fins 74 such that each dummy gate 94 is disposed between respective neighboring pairs of the epitaxial source/drain regions 102. The epitaxial source/drain regions 102 may extend through the LDD regions 101. The gate spacers 108 separate the epitaxial source/drain regions 102 from channel regions of the fins 74 (e.g., portions covered by the dummy gates 94), so that the epitaxial source/drain regions 102 are not shorted to the channel regions of the fins 74. In some embodiments, the epitaxial source/drain regions 102 may extend into the fins 68.

The epitaxial source/drain regions 102 in the first region 50B may be formed by masking the second region 50C. Then, source/drain regions of the fins 74 in the first region 50B are etched to form recesses. The epitaxial source/drain regions 102 in the first region 50B are epitaxially grown in the recesses. The epitaxial source/drain regions 102 may include any acceptable material, such as materials appropriate for n-type FinFETs. For example, if the fins 74 are silicon, the epitaxial source/drain regions 102 may include silicon, SiC, SiCP, SiP, or the like. Subsequently, the mask on the second region 50C is removed.

The epitaxial source/drain regions 102 in the second region 50C may be formed by masking the first region 50B. Then, source/drain regions of the fins 74 in the second region 50C are etched to form recesses. The epitaxial source/drain regions 102 in the second region 50C are epitaxially grown in the recesses. The epitaxial source/drain regions 102 may include any acceptable material, such as materials appropriate for p-type FinFETs. For example, if the fins 74 are silicon, the epitaxial source/drain regions 102 may include SiGe, SiGeB, Ge, GeSn, or the like. Subsequently, the mask on the first region 50B is removed. In some embodiments, the epitaxial source/drain regions 102 may be formed using a different process.

FIGS. 29C-D show alternative configurations of the epitaxial source/drain regions 102. As shown, the epitaxial source/drain regions 102 may have surfaces raised from respective surfaces of the fins 74 and may have facets. In the embodiment shown in FIG. 29C, the epitaxial source/drain regions 102 are separated. In the embodiment shown in FIG. 29D, the epitaxial source/drain regions 102 are merged. In some cases, epitaxial source/drain regions 102 may be separated at initial stages of epitaxial growth, and may or may not merge during epitaxial growth to form merged epitaxial source/drain regions 102. In some cases, epitaxial source/drain regions 102 may grow along portions of the gate spacers 108 adjacent the dummy gates 94.

The epitaxial source/drain regions 102 and/or the fins 74 may be implanted with dopants to form source/drain regions, similar to the process previously discussed for forming lightly doped source/drain regions, with regard to FIGS. 26A-B. In some cases, the implantation is followed by an anneal. The source/drain regions may have an impurity concentration of between about $10^{19}$ cm$^{-3}$ and about $10^{21}$ cm$^{-3}$. The n-type and/or p-type impurities for source/drain regions may include suitable impurities previously discussed. In some embodiments, the epitaxial source/drain regions 102 are implanted after forming the gate spacers 108, using the gate spacers 108 as a mask for the implanting. In some embodiments, the epitaxial source/drain regions 102 are in situ doped during growth.

In FIGS. 30A-B, a contact etch stop layer (CESL) 112 is formed over the top surfaces of the patterned mask layer 82, spacers 100, epitaxial source/drain regions 102, and gate spacers 108, and also along sidewalls of the dummy gates 94 and the patterned mask layer 82. The CESL 112 may be formed in a manner similar to the method for forming the spacer layer 62.

In FIGS. 31A-B, an inter-layer dielectric (ILD) 114 is formed over the structure illustrated in FIGS. 30A-B. The ILD 114 may be formed of a dielectric material or a semiconductor material, and may be deposited by any suitable method, such as CVD, PECVD, or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x is between 0 and 1), pure germanium, or the like. Other insulation or semiconductor materials formed by any acceptable process may be used.

Figure 32B:
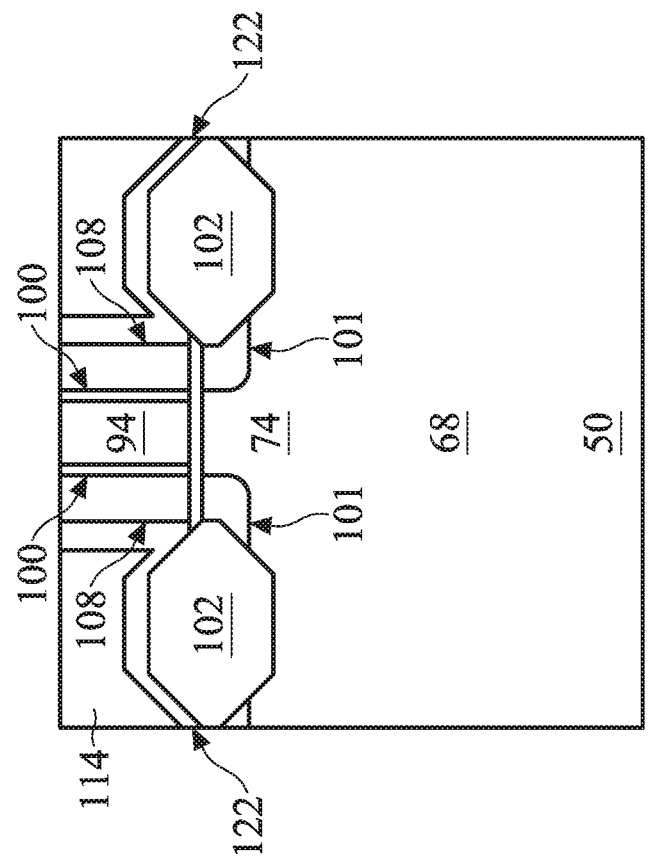
FIGS. 32A-B illustrate a planarization process in accordance with some embodiments.
Figure 32A:
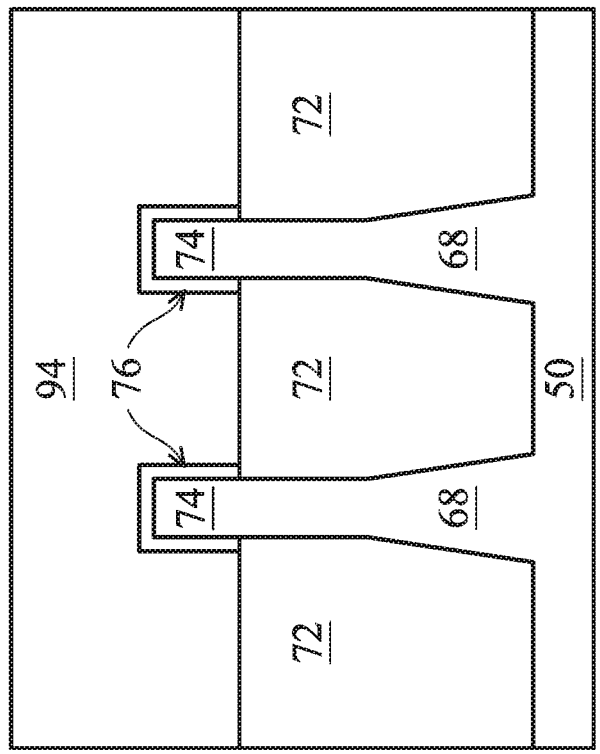

In FIGS. 32A-B, a planarization process, such as a CMP, may be performed to level the top surface of the ILD 114 with the top surfaces of the dummy gates 94. The planarization process may also remove the patterned mask layer 82 on the dummy gates 94, portions of the spacers 100, gate spacers 108, or CESL 112 along sidewalls of the patterned mask layer 82. After the planarization process, top surfaces of the dummy gates 94, spacers 100, gate spacers 108, CESL 112, or ILD 114 may be substantially level. The top surfaces of the dummy gates 94 may be exposed through the ILD 114 by the planarization process.

In FIGS. 33A-B, the exposed portions of the dummy gates 94 and portions of the dummy dielectric layer 76 directly underlying the exposed dummy gates 94 are removed in one or more etching steps, such that recesses 116 are formed. In some embodiments, the dummy gates 94 are removed by an anisotropic dry etch process. For example, the etching process may include a dry etch process that selectively etches the dummy gates 94 without etching the ILD 114 or the gate spacers 108. For example, in an embodiment having polysilicon dummy gates 94, the etching process may selectively remove polysilicon to form the recess 116. Each recess 116 exposes a channel region of a respective fin 74. Each channel region is disposed between neighboring pairs of the epitaxial source/drain regions 102. During the removal, the dummy dielectric layer 76 may be used as an etch stop layer when the dummy gates 94 are etched. The dummy dielectric layer 76 may then be removed after the removal of the dummy gates 94.

In some embodiments, forming a dummy gate 94 having a profile shape using techniques described previously can produce a recess 116 having a similar profile shape. For example, the dummy gate 94 shown in FIG. 24A having a smaller middle width may produce a recess 116 having a smaller middle width, the dummy gate 94 shown in FIG. 24B having a smaller bottom width may produce a recess 116 having a smaller bottom width, and the dummy gate 94 shown in FIG. 24C having a larger middle width may produce a recess 116 having a larger middle width. These are examples, and the recesses 116 may have different profile shapes. The recesses 116 may have a first width, a second width, and a third width at the locations of width W1, width W2, and width W3 of dummy gates 94, respectively. In some embodiments, the differences between the first width, the second width, and/or the third width may be between about 0% and about 20%.

In FIGS. 34A-B, gate dielectric layers 118 and gate fill 120 are formed for replacement gates. Gate dielectric layers 118 are deposited conformally in the recesses 116, such as on the top surfaces and the sidewalls of the fins 74, on sidewalls of the gate spacers 108, and on a top surface of the ILD 114. In some embodiments, the gate dielectric layers 118 are silicon oxide, silicon nitride, other materials, or multi-layers thereof. In some embodiments, the gate dielectric layers 118 are a high-k dielectric material, and in these embodiments, the gate dielectric layers 118 may have a k value greater than about 7.0, and may include a metal oxide or a silicate of Hf, Al, Zr, La, Mg, Ba, Ti, Pb, and combinations thereof. The formation methods of the gate dielectric layers 118 may include Molecular-Beam Deposition (MBD), ALD, PECVD, and the like.

The gate fill 120 is deposited over the gate dielectric layers 118, and fills the remaining portions of the recesses 116. The gate fill 120 may be a metal-containing material such as TiN, TaN, TaC, Co, Ru, Al, combinations thereof, or multi-layers thereof. After the formation of the gate fill 120, a planarization process, such as a CMP, may be performed to remove the excess portions of the gate dielectric layers 118 and the material of the gate fill 120, which excess portions are over the top surface of the ILD 114. The resulting remaining portions of material of the gate fill 120 and the gate dielectric layers 118 thus form replacement gates of the resulting FinFETs. The gate dielectric layers 118 and gate fill 120 may be collectively referred to as gate 121 or gate stack 121.

The formation of the gate dielectric layers 118 in the first region 50B and the second region 50C may occur simultaneously such that the gate dielectric layers 118 in each region are formed from the same materials, and the formation of each gate fill 120 may occur simultaneously such that the gate fill 120 in each region are formed from the same materials. In some embodiments, the gate dielectric layers 118 in each region may be formed by distinct processes, such that the gate dielectric layers 118 may be different materials, and the gate fill 120 in each region may be formed by distinct processes, such that the gate fill 120 may be different materials. Various masking steps may be used to mask and expose appropriate regions when using distinct processes.

In some embodiments, forming a dummy gate 94 having a profile shape using techniques described previously can produce a gate stack 121 having a similar profile shape. For example, the dummy gate 94 shown in FIG. 24A having a smaller middle width may produce a gate stack 121 having a smaller middle width, the dummy gate 94 shown in FIG. 24B having a smaller bottom width may produce a gate stack 121 having a smaller bottom width, and the dummy gate 94 shown in FIG. 24C having a larger middle width may produce a gate stack 121 having a larger middle width. These are examples, and the gate stacks 121 may have different profile shapes. The gate stacks 121 may have a first width, a second width, and a third width at the locations of width W1, width W2, and width W3 of dummy gates 94, respectively. In some embodiments, the differences between the first width, the second width, and/or the third width may be between about 0% and about 10%. In some cases, the differences between the width W1, width W2, and width W3 of a dummy gate 94 may be different than the differences between first width, the second width, and/or the third width of the subsequently formed gate stack 121. For example, the ratio between the third width and the second width of a gate stack 121 may be larger than the ratio between width W3 and width W2 of the previously formed dummy gate 94, though other differences between other widths of a dummy gate 94 and a gate stack 121 are possible. For example, width W3 may be between about 1% and about 15% less than width W2 of a dummy gate 94, but the subsequent gate stack 121 may have a third width that is between about 1% and about 15% larger than the second width. This is an example, and other differences between widths are possible. In some cases, the profile or shape of a gate stack 121 over a fin 74 may be formed to be different from the profile or shape of the gate stack 121 adjacent the fin 74. In some cases, the use of the etching techniques to control the profile shape of the dummy gates 94 can result in improved formation of gate dielectric layers 118 or gate fill 120. For example, a recess 116 having a shape similar to FIG. 24B may allow for more complete filling of the recess 116 by gate fill 120, or more gap fill efficiency of the recess 116 by gate fill 120. In this manner, the chance of process defects related to gate fill 120 may be reduced, and thus yield may be improved.

Figures 35A, 35B:
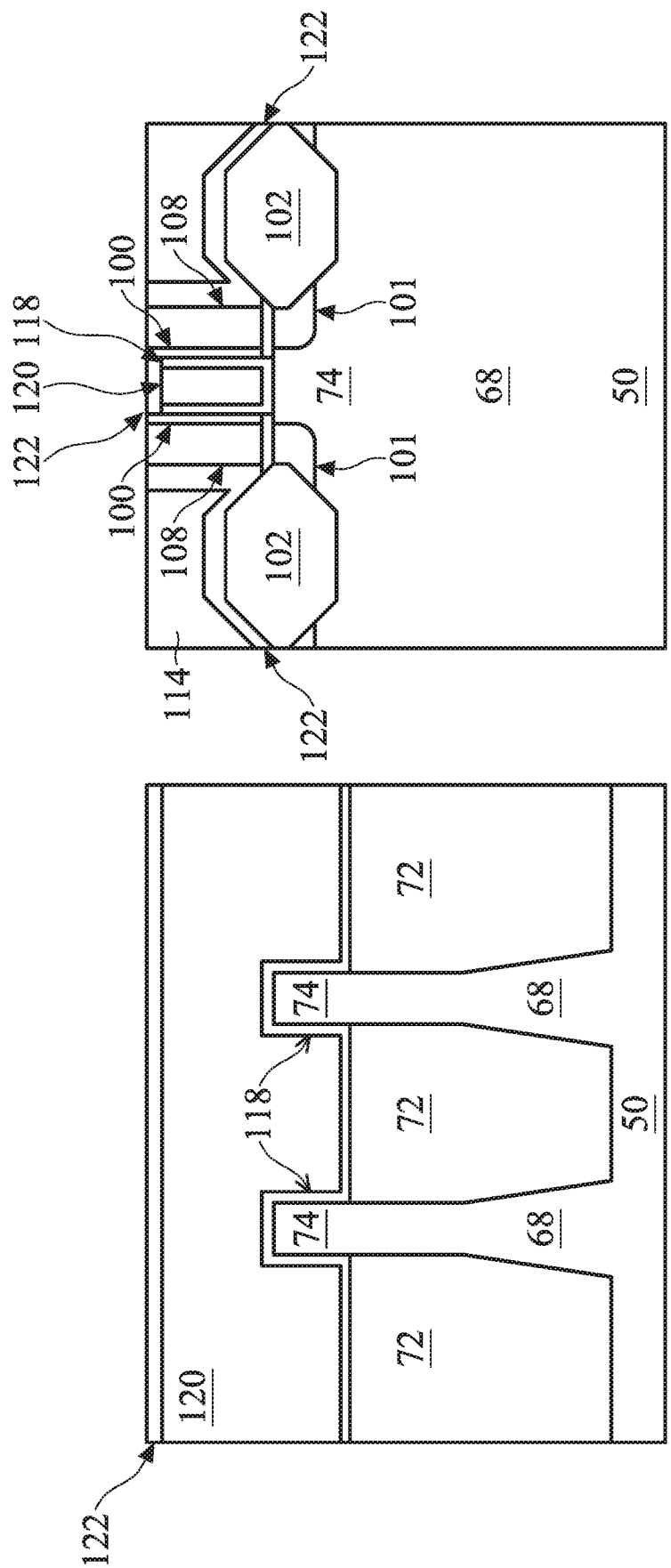
FIGS. 35A-B illustrate the formation of a hardmask in accordance with some embodiments.

In FIGS. 35A-B, a hardmask 122 is formed over the gate dielectric layers 118 and the gate fill 120. The hardmask 122 may provide protection for the gate spacers 108 during subsequent self-aligned contact etching steps to ensure that the self-aligned contacts do not short the gate fill 120 to the corresponding epitaxial source/drain regions 102. The hardmask 122 may be formed by recessing the gate dielectric layers 118 and gate fill 120 in one or more etching steps. The etching steps may include an anisotropic dry etch. For example, the etching steps may include a dry etch process using reaction gases that selectively etch the gate dielectric layers 118 and the gate fill 120 without etching the gate spacers 108, CESL 112, or ILD 114. The hardmask 122 may be formed in the recesses and on top surfaces of the gate spacers 108, CESL 112, and ILD 114. A planarization process, such as a CMP, may then be performed to level the top surface of the hardmask 122 with the top surfaces of the ILD 114, CESL 112, or gate spacers 108. The hardmask 122 may include one or more oxide (e.g., silicon oxide) and/or nitride (e.g., silicon nitride) layers, and may be formed by CVD, PVD, ALD, plasma-enhanced atomic layer deposition (PEALD), a spin-on-dielectric process, the like, or a combination thereof. In an embodiment, the hardmask 122 is SiN, and is deposited with an ALD process.

In FIGS. 36A-B, an ILD 124 is deposited over the ILD 114 and hardmask 122. In an embodiment, the ILD 124 is a flowable film formed by a flowable CVD method. In some embodiments, the ILD 124 is formed of a dielectric material such as PSG, BSG, BPSG, USG, or the like, and may be deposited by any suitable method, such as CVD and PECVD.

Figure 37B:
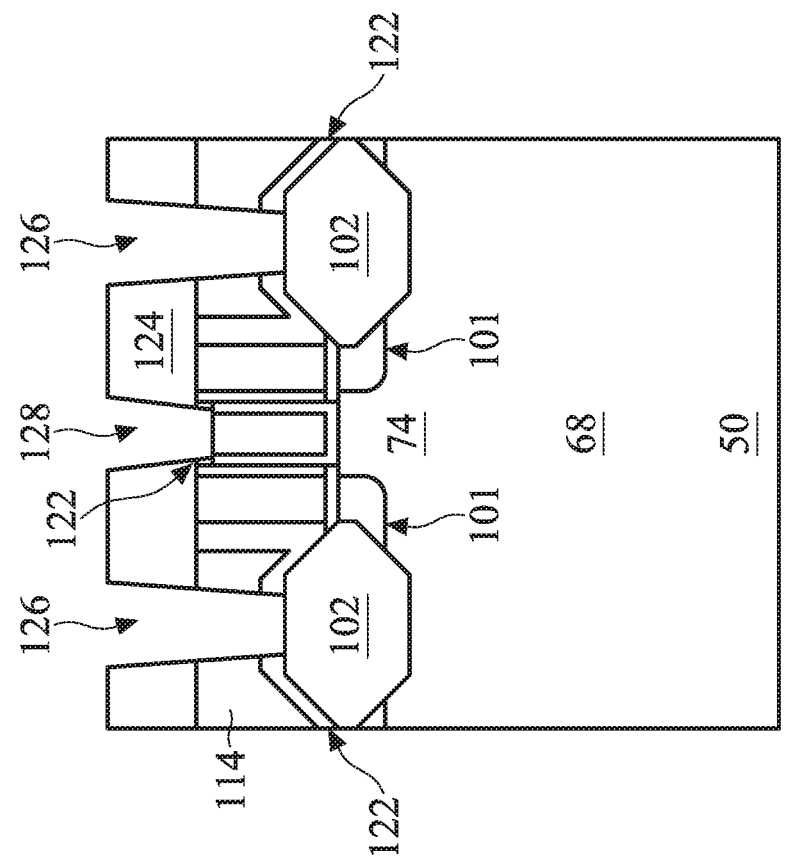
FIGS. 37A-B illustrate the formation contact openings in accordance with some embodiments.
Figure 37A:
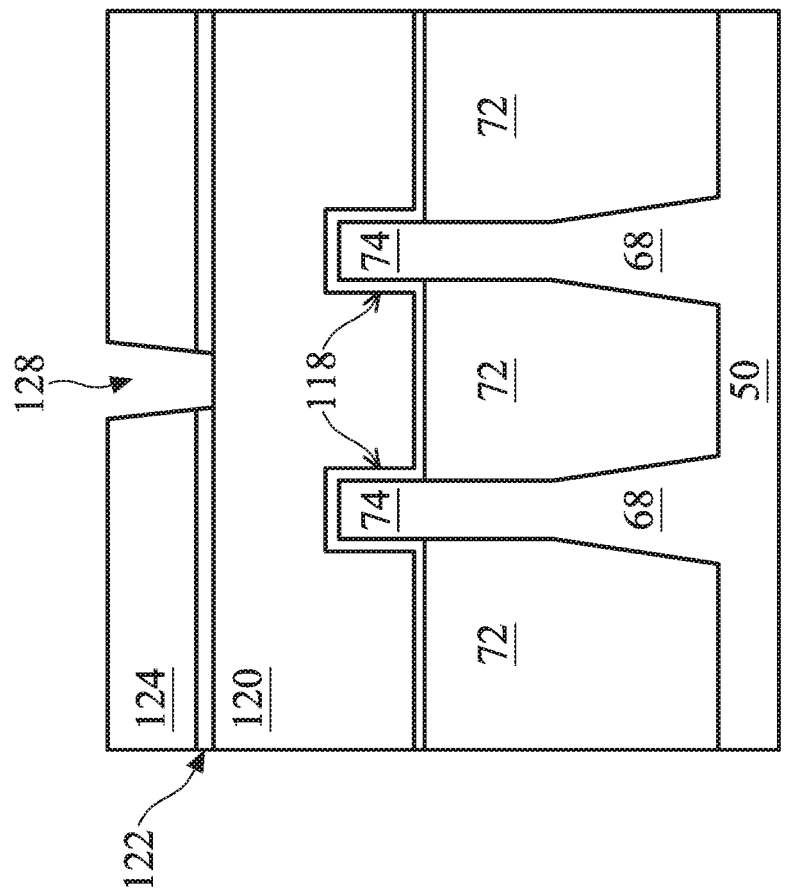

In FIGS. 37A-B, openings 126 and 128 for contacts are formed through the ILD 114, the ILD 124, the CESL 112, and the hardmask 122. The openings 126 and 128 may be formed simultaneously or in separate processes. The openings 126 and the openings 128 may be formed using acceptable photolithography and etching techniques. In an embodiment, the openings 126 are formed before the openings 128.

In FIGS. 38A-B, contacts 130 and 132 are formed in the openings 126 and 128. A liner, such as a diffusion barrier layer, an adhesion layer, or the like, is formed in the openings 126 and 128. The liner may include titanium, titanium nitride, tantalum, tantalum nitride, or the like. A conductive material is formed in the openings 126 and 128 over the liner. The conductive material may be copper, a copper alloy, silver, gold, tungsten, aluminum, nickel, cobalt, or the like. A planarization process, such as a CMP, may be performed to remove excess material from a surface of the ILD 124. The remaining liner and conductive material form the contacts 130 and 132 in the openings. An anneal process may be performed to form a silicide at the interface between the epitaxial source/drain regions 102 and the contacts 130. The contacts 130 are physically and electrically connected to the epitaxial source/drain regions 102, and the contacts 132 are physically and electrically connected to the gate stacks 121. Although the contacts 132 (e.g., gate contacts) are shown as being in the same cross-section as the contacts 130 (e.g., source/drain contacts), it should be appreciated they may be disposed in different cross-sections. In some cases, forming the contacts in different cross-sections may help avoid shorting of the contacts 130 and the contacts 132.

Embodiments may achieve advantages. By using multiple etching steps to form dummy gates, and by controlling the parameters of each etching step, the profile shape of the dummy gates can be controlled. By controlling the dummy gate profile shape, the profile shape of the replacement gate stack may also be controlled. In this manner, the techniques described herein may allow for controlling the profile shape of a gate stack to have a particular profile shape according to a particular application or structure. In some cases, the profile shape of the dummy gate may be controlled to allow for improved formation of the replacement gate stack. In some cases, by using the etching techniques described herein, a desired dummy gate size or profile may be formed without using a separate trimming process prior to dummy gate etch. In some cases, the parameters of one or more etching step may be controlled to reduce processing defects such as pitting of the fins or gate fill shorts. In some embodiments, the techniques described herein may be used to control the profile shape of other etched features during the formation of a device. For example, the techniques may be used to control the profile shape of a mandrel (e.g., mandrel 58 or mandrel 86) during etching of a mandrel layer (e.g., mandrel layer 56 or mandrel layer 84). The techniques may also be used to control the profile shape of openings, such as contact openings (e.g., openings 126 or openings 128).

In an embodiment, a method includes forming a semiconductor fin extending a first height above a substrate, forming a dummy dielectric material over the semiconductor fin and over the substrate, forming a dummy gate material over the dummy dielectric material, the dummy gate material extending a second height above the substrate, etching the dummy gate material using multiple etching processes to form a dummy gate stack, wherein each etching process of the multiple etching processes is a different etching process, wherein the dummy gate stack has a first width at the first height, and wherein the dummy gate stack has a second width at the second height that is different from the first width. In an embodiment, the second width is between about 2% and about 10% greater than the first width. In an embodiment, one etching process of the multiple etching processes includes a pulsed plasma power and another etching process of the multiple etching processes includes a constant plasma power. In an embodiment, a passivation gas is used during one etching process of the multiple etching processes and not used during another etching process of the multiple etching processes. In an embodiment, the passivation gas is a mixture of HBr and $O_2$. In an embodiment, the dummy gate stack has a third width at a third height that is below the first height, and wherein the third width is different from the first width. In an embodiment, the method also includes removing the dummy gate stack to form an opening, and filling the opening with a replacement gate stack, wherein the replacement gate stack has a fourth width at the first height, and wherein the replacement gate stack has a fifth width at the second height that is different from the fourth width. In an embodiment, one etching process of the multiple etching processes forms a first sidewall slope in a first portion of the dummy gate stack and another etching process of the multiple etching processes forms a second sidewall slope in a second portion of the dummy gate stack, wherein the second sidewall slope is different from the first sidewall slope. In an embodiment, the dummy gate material includes silicon.

In an embodiment, a method includes forming a dummy gate layer over a substrate and forming first openings in the dummy gate layer. Forming the first openings includes performing a first plasma etching process including a first pulsed bias voltage having a first duty cycle, the first duty cycle associated with a first desired metal gate width at a first height above the substrate, performing a second plasma etching process including a second pulsed bias voltage having a second duty cycle, the second duty cycle associated with a second desired metal gate width at a second height above the substrate, and performing a third plasma etching process including a third pulsed bias voltage having a third duty cycle, the third duty cycle associated with a third desired metal gate width at a third height above the substrate. The method also includes forming a dielectric material in the first openings, removing remaining portions of the dummy gate layer to form second openings, and forming a metal gate in the second openings, the metal gate having the first desired metal gate width at the first height above the substrate, the second desired metal gate width at the second height above the substrate, and the third desired metal gate width at the third height above the substrate. In an embodiment, the dummy layer includes polysilicon. In an embodiment, the first plasma etching process includes a first pulsed bias voltage that is synchronized with a pulsed plasma generation power. In an embodiment, the first plasma etching process includes flowing a passivation gas. In an embodiment, the second plasma etching process includes a substantially constant plasma generation power. In an embodiment, the first plasma etching process etches a first vertical distance and the second plasma etching process etches a second vertical distance that is less than the first vertical distance.

In an embodiment, a device includes a semiconductor fin protruding a first height above a substrate, a gate stack across the semiconductor fin, a first portion of the gate stack having a first width at the first height, a second portion of the gate stack having a second width proximate a top surface of the gate stack that is different from the first width, and a third portion of the gate stack having a third width proximate a bottom surface of the gate stack that is different from the first width, wherein a portion of the gate stack extending from the first height to the top surface of the gate stack has a different sidewall slope than a portion of the gate stack extending from the first height to the bottom surface of the gate stack. In an embodiment, the second width is between about 2% and about 10% greater than the first width. In an embodiment, the first width is between about 2% and about 10% greater than the third width. In an embodiment, the third portion of the gate stack is disposed about 10 nm above the bottom surface of the gate stack. In an embodiment, the first portion, second portion, and third portion of the gate stack are disposed adjacent the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a semiconductor fin extending a first height above a substrate;
    forming isolation regions along opposing sides of the semiconductor fin;
    forming a dummy dielectric material over the semiconductor fin and over the isolation regions;
    forming a dummy gate material over the dummy dielectric material, the dummy gate material extending a second height above the substrate; and
    etching the dummy gate material using a plurality of plasma etching processes to form a first dummy gate stack and a second dummy gate stack, wherein each plasma etching process of the plurality of plasma etching processes uses different plasma etching process parameters, wherein the first dummy gate stack has a first width at the first height, and wherein the first dummy gate stack has a second width at the second height that is different from the first width, wherein a portion of the first dummy gate stack extending from the first height toward the second height has a width greater than the first width, wherein sidewalls of the dummy gate material after etching has tapered sidewalls from the first height to the second height, wherein the plurality of etching processes comprises:
        a first plasma etching process to expose the dummy dielectric material over the semiconductor fin, wherein after the first plasma etching process a portion of the dummy gate material remains over the isolation regions between the first dummy gate stack and the second dummy gate stack;
        a second plasma etching process performed after the first plasma etching process to remove portions of the dummy gate material over the isolation regions between the first dummy gate stack and the second dummy gate stack and to expose the dummy dielectric material over the isolation regions, wherein after the second plasma etching process lower portions of the first dummy gate stack has a tapered sidewall tapering outward as the first dummy gate stack nears the isolation regions; and
        a third plasma etching process performed after the second plasma etching process to thin sidewalls of the first dummy gate stack adjacent the dummy dielectric material over the isolation regions, wherein the third plasma etching process widens a distance between the first dummy gate stack and the second dummy gate stack.

2. The method of claim 1, wherein the second width is between about 2% and about 10% greater than the first width.

3. The method of claim 1, wherein one plasma etching process of the plurality of plasma etching processes comprises a pulsed plasma power and another plasma etching process of the plurality of plasma etching processes comprises a constant plasma power.

4. The method of claim 1, wherein a passivation gas is used during one plasma etching process of the plurality of plasma etching processes and not used during another plasma etching process of the plurality of etching processes.

5. The method of claim 4, wherein the passivation gas is a mixture of HBr and $O_2$.

6. The method of claim 1, wherein the first dummy gate stack has a third width at a third height that is below the first height, and wherein the third width is different from the first width.

7. The method of claim 1, further comprising:
    removing the first dummy gate stack to form an opening; and
    filling the opening with a replacement gate stack, wherein the replacement gate stack has a fourth width at the first height, and wherein the replacement gate stack has a fifth width at the second height that is different from the fourth width.

8. The method of claim 1, wherein one plasma etching process of the plurality of plasma etching processes forms a first sidewall slope in a first portion of the first dummy gate stack and another plasma etching process of the plurality of etching processes forms a second sidewall slope in a second portion of the first dummy gate stack, wherein the second sidewall slope is different from the first sidewall slope.

9. The method of claim 1, wherein the dummy gate material comprises silicon.

10. A method comprising:
    forming a dummy gate layer over a substrate;
    forming first openings in the dummy gate layer, comprising:
        performing a first plasma etching process comprising a first pulsed bias voltage having a first duty cycle, the first duty cycle associated with a first desired metal gate width at a first height above the substrate, wherein the first plasma etching process forms a first recess, wherein a bottom surface of the first recess comprises remaining portions of the dummy gate layer;
        after performing the first plasma etching process, performing a second plasma etching process comprising a second pulsed bias voltage having a second duty cycle, the second duty cycle associated with a second desired metal gate width at a second height above the substrate, wherein at least one of the first pulsed bias voltage and the first duty cycle is different than the second pulsed bias voltage and the second duty cycle, respectively, wherein the second plasma etching process recesses the remaining portions of the dummy gate layer to form a second recess, wherein the second recess comprises a first tapered sidewall of the dummy gate layer; and
        after performing the second plasma etching process, performing a third plasma etching process comprising a third pulsed bias voltage having a third duty cycle, the third duty cycle associated with a third desired metal gate width at a third height above the substrate, wherein at least one of the second pulsed bias voltage and the second duty cycle is different than the third pulsed bias voltage and the third duty cycle, respectively, wherein the third plasma etching process widens the second recess;

forming a dielectric material in the first openings;
removing remaining portions of the dummy gate layer to form second openings; and
forming a metal gate in the second openings, the metal gate having the first desired metal gate width at the first height above the substrate, the second desired metal gate width at the second height above the substrate, and the third desired metal gate width at the third height above the substrate.

11. The method of claim 10, wherein the dummy gate layer comprises polysilicon.

12. The method of claim 10, wherein the first plasma etching process comprises a first pulsed bias voltage that is synchronized with a pulsed plasma generation power.

13. The method of claim 10, wherein the first plasma etching process comprises flowing a passivation gas.

14. The method of claim 10, wherein the second plasma etching process comprises a substantially constant plasma generation power.

15. The method of claim 10, wherein the first plasma etching process etches a first vertical distance and the second plasma etching process etches a second vertical distance that is less than the first vertical distance.

16. A method comprising:
forming a semiconductor fin protruding a first height above a substrate;
forming an isolation region adjacent the semiconductor fin, the semiconductor fin protruding above the isolation region;
forming a dummy gate material over and adjacent the semiconductor fin, and over the isolation region;
performing a first plasma etching process using a first set of plasma etching parameters on the dummy gate material to form a first recess, wherein a sidewall of the first recess forms a first portion of a dummy gate stack having a first width at the first height, wherein the first portion of the dummy gate stack has a tapering profile, wherein the first plasma etching process only partially etches through the dummy gate material over the isolation region;
after forming the first portion of the dummy gate stack, performing a second plasma etching process using a second set of plasma etching parameters to remove the dummy gate material on a bottom of the first recess to form a second recess, a sidewall of the second recess forms a second portion of the dummy gate stack having a second width that is different from the first width, wherein the first set of plasma etching parameters is different than the second set of plasma etching parameters, wherein the first portion of the dummy gate stack has a first sidewall slope and the second portion of the dummy gate stack has a second sidewall slope that is different from the first sidewall slope, wherein a width of the dummy gate stack adjacent a top of the semiconductor fin is less than a width of the dummy gate stack adjacent a top of the isolation region; and
after forming the second portion, performing a third plasma etching process on the second portion to alter the second sidewall slope and widen the second recess.

17. The method of claim 16, further comprising replacing the dummy gate stack with a replacement gate stack.

18. The method of claim 16, wherein the first width is between 2% and 10% greater than the second width.

19. The method of claim 16, wherein second portion of the dummy gate stack has the second width at about 10 nm above the bottom of the second portion of the dummy gate stack.

20. The method of claim 16, wherein the first portion of the dummy gate stack and the second portion of the dummy gate stack are adjacent the semiconductor fin.

* * * * *